(12) United States Patent
Inoue et al.

(10) Patent No.: US 7,266,308 B2
(45) Date of Patent: Sep. 4, 2007

(54) LIGHT OUTPUT CONTROL CIRCUIT

(75) Inventors: Tadao Inoue, Kawasaki (JP); Tadashi Ikeuchi, Kawasaki (JP); Hiroyuki Rokugawa, Kawasaki (JP); Masaaki Kawai, Kawasaki (JP); Norio Ueno, Kawasaki (JP); Norio Murakami, Sapporo (JP); Toru Matsuyama, Sapporo (JP); Makoto Miki, Sapporo (JP); Toshiyuki Takauji, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/203,544

(22) Filed: Aug. 15, 2005

(65) Prior Publication Data

US 2006/0024068 A1 Feb. 2, 2006

Related U.S. Application Data

(62) Division of application No. 09/505,783, filed on Feb. 17, 2000, now Pat. No. 6,975,813.

(30) Foreign Application Priority Data

Feb. 19, 1999 (JP) ................. 11-042178

(51) Int. Cl.
*H04B 10/04* (2006.01)
*H04B 10/12* (2006.01)
*H01S 3/13* (2006.01)

(52) U.S. Cl. ................. 398/195; 398/192; 372/29.011; 372/29.02

(58) Field of Classification Search ................ 398/192, 398/194, 195, 197; 372/29.01, 29.011, 29.02
See application file for complete search history.

(56) References Cited

U.S. PATENT DOCUMENTS 4,621,376 A 11/1986 Nakamura et al.
4,709,369 A * 11/1987 Howard ................. 372/29.011

(Continued)

FOREIGN PATENT DOCUMENTS

EP 0 287 360 10/1988

(Continued)

OTHER PUBLICATIONS

Japanese language Office Action issued Oct. 26, 2004, in corresponding Japanese application.

(Continued)

*Primary Examiner*—M. R. Sedighian
(74) *Attorney, Agent, or Firm*—Staas & Halsey LLP

(57) ABSTRACT

Using a switching signal from a coarse/fine switching and operation mode switching circuit, the width of change of a counter control value during power up is increased, and the width of change is reduced once a steady state is reached. In the steady state, the frequency of updating is limited by a control signal from an update permit control circuit. In the steady state, the frequency band of a current source in an LD driving circuit is reduced in width.

9 Claims, 88 Drawing Sheets

U.S. PATENT DOCUMENTS

| | | | |
|---|---|---|---|
| 4,745,609 A | 5/1988 | Yoshikawa | 372/29 |
| 4,853,934 A | 8/1989 | Sakurai | 372/29 |
| 4,856,008 A | 8/1989 | Senma et al. | 372/29 |
| 4,856,011 A | 8/1989 | Shimada et al. | 372/29.01 |
| 4,879,459 A | 11/1989 | Negishi | 250/205 |
| 4,912,714 A | 3/1990 | Hatanaka et al. | 372/31 |
| 5,043,745 A | 8/1991 | Inoue et al. | 347/246 |
| 5,418,806 A | 5/1995 | Araki | |
| 5,677,779 A | 10/1997 | Oda et al. | |
| 6,188,498 B1 | 2/2001 | Link et al. | 359/187 |
| 6,292,284 B1 * | 9/2001 | Takauji et al. | 398/197 |

FOREIGN PATENT DOCUMENTS

| | | |
|---|---|---|
| JP | 63-86589 | 4/1988 |
| JP | 63-199477 | 8/1988 |
| JP | 63-229881 | 9/1988 |
| JP | 64-74782 | 3/1989 |
| JP | 1-179381 | 7/1989 |
| JP | 1-302788 | 12/1989 |
| JP | 2-281975 | 11/1990 |
| JP | 4-51580 | 2/1992 |
| JP | 04051580 * | 2/1992 |

OTHER PUBLICATIONS

European Search Report dated Jan. 10, 2003, filed in a counterpart application.

European Search Report dated Jan. 13, 2003, filed in a counterpart application.

Patent Abstracts of Japan of JP 63-086589 dated Apr. 16, 1988.

* cited by examiner

276

LIGHT OUTPUT CONTROL CIRCUIT

This application is a divisional of application Ser. No. 09/505,783, filed Feb. 17, 2000, now U.S. Pat. No. 6,975,813.

BACKGROUND OF THE INVENTION

1. Field of the Invention

The present invention relates to a light output control circuit for controlling the light output of a light-emitting device, such as a semiconductor laser (laser diode—LD) or a light-emitting diode (LED), used in optical communication and other applications.

2. Description of the Related Art

Generally, in an apparatus, such as an optical transmission apparatus, that uses a light-emitting device, the light output of the device must be controlled to a specified value. On the other hand, the light-producing efficiency of a light-emitting device such as an LD has a strong temperature dependence, and furthermore, the efficiency changes with age. Accordingly, to control the light output to a constant value under all possible conditions, the current supplied to the light-emitting device must be controlled to a proper value. Traditionally, negative feedback control is used to control the light output of a light-emitting device to a constant value. FIG. 1 shows a prior art light output control circuit for controlling the light output of a light-emitting device. The operation of this circuit will be described below.

A drive current modulated with data in an LD driving circuit 10 is supplied to a light-emitting device 12. The peak value of this drive current (hereinafter called the drive current value) is controlled in proportion to a digital value input to a D/A conversion circuit 14. The digital value is supplied from a counter 16 placed directly before it. That is, the drive current value obtained is proportional to the counter value.

A photodiode (PD) 18 produces a monitor current proportional to the amount of light emitted by the light-emitting device (LD), and a monitor section 20 converts the monitor current value into a voltage value and holds its peak value. The output of the monitor section 20 is compared with a reference value (voltage) 24 using a comparator 22, and the count value of the counter 16 is manipulated in accordance with the result of the comparison. That is, if the monitor output is smaller than the reference value, the counter value is incremented by 1 to increase the drive current value; on the other hand, if the monitor output is larger than the reference value, the counter value is decremented by 1 to decrease the drive current value. With this operation, the light output is controlled at a constant value with respect to the reference value, using negative feedback control.

At this time, the drive current value is controlled with an accuracy equivalent to the resolution determined by the least significant bit (LSB) of the D/A conversion circuit 14. For example, when a 10-bit D/A conversion circuit is used, a resolution of $2^{10}=1024$ is obtained. When controlling the output current within a range of 10 to 100 mA using this circuit, a current mirror circuit in the LD driving circuit 10 is designed so that 1 LSB corresponds to 0.1 mA, with digital values 100 to 1000 corresponding to drive current values 10 to 100 mA. In this case, since, at the minimum value 10 mA of the drive current, the current 0.1 mA per LSB corresponds to 1%, the above circuit can control the drive current with an accuracy of about 1% (the light output is also proportional to it). The prior art has achieved highly precise control using the above-described circuit.

The problem of the prior art output control circuit is that it takes time for the light output to reach the desired value, that is, the rise time is long.

FIG. 2 shows the operating characteristic of the prior art light output control circuit. Time is plotted along the abscissa and the drive current value along the ordinate. The value of the counter circuit is reset at power on. When the above-described feedback is activated, the counter value is updated by incrementing or decrementing by 1 at a time, depending on the result of the comparison made between the output of the monitor section 20 and the reference value 24, and the drive current value is updated accordingly, causing the drive current to change in a steplike manner. At this time, the drive current value changes in steps of 0.1 mA which is proportional to the current corresponding to the least significant bit (LSB) of the D/A conversion circuit. When the drive current value reaches the target value, the drive current value oscillates between two values, one above and the other below the target value, and a light output value stabilized within this range is obtained.

In this prior art, since the digital value is incremented or decremented in steps of 1 after power on until reaching the target value, if the difference between the target value and the current value (digital value) at power on is large, it takes a large number of steps until the current rises to the desired value, and the rise time thus becomes long.

In access optical communication systems that have recently entered commercial service, a burst transmission method that divides data into cells and transmits them in bursty manner has to be employed as the method of transmission between the subscriber and the network. FIG. 3 shows the operation when the prior art light output control circuit is applied for burst transmission applications, to explain the problem of the prior art. As in FIG. 2, the time is plotted along the abscissa and the drive current value along the ordinate.

When starting up a burst transmission apparatus, only a short period of time of a few microseconds allocated to initial starting cells is allowed for the light output to rise to the target value. Accordingly, if the prior art light output control circuit were used for burst transmission, the light output could not rise fully during the starting cell period and hence could not be stabilized before the output of ordinary communication cells. Consequently, the prior art light output control circuit cannot be used for such applications.

For example, when the counter is started at an initial value 0 and is operated to count up until a maximum drive current value of 100 mA is obtained using, for example, a 10-bit D/A conversion circuit, in the worst case the counter would have to be updated 1024 times before the output is stabilized.

Thus the prior art has had the problem that it cannot be used for burst transmission applications because the rise time is long.

In the case of continuous transmission also, data cannot be transmitted during the start-up period. If the rise time of the optical module transmitter is long, the problem is that it takes time to start up the entire system. This also limits the time margin of the system or slows the system power up.

Another problem that arises when the prior art of FIG. 1 is used for burst transmission concerns the control when no cells exist. In the prior art of FIG. 1, since the control of the counter 16 is performed at all times regardless of the presence or absence of a signal, the time constant of the monitor section 20 must be made sufficiently long in order to maintain stable control even when there are no cells. Increasing the time constant, however, leads to the problem of slow response.

A further problem with the prior art of FIG. 1 concerns very small fluctuations occurring after the control has reached a steady-state condition. As shown in FIG. 2, in the prior art light output control circuit, after the start up of the light output control circuit is completed and steady state is reached, the light output value continually oscillates between two values around the reference value. Usually, the circuit is designed to control the light output within specified limits despite the variations between the two values, but the light output value cycles through unnecessary changes.

Especially, in burst transmission, the time required for the light output to stabilize must be shortened; to achieve this, the feedback loop speed must be increased, but if the feedback is always performed at high speed, unnecessary updates will be repeated. This problem will result in increased error rate at the optical signal receiving end.

Furthermore, in the prior art light output control circuit, when the light output control circuit updates its light output value, the digital code input to the D/A conversion circuit 14 changes, and at this time, a spike called a glitch occurs. This glitch appears in the drive current, causing waveform distortion. This problem also results in increased error rate at the optical signal receiving end.

SUMMARY OF THE INVENTION

Accordingly, it is a first object of the present invention to provide a light output control circuit that rises quickly when starting.

It is a second object of the present invention to provide a light output control circuit that is suitable for burst transmission.

It is a third object of the present invention to provide a light output control circuit that can reduce the fluctuations after the light output is stabilized.

It is a fourth object of the present invention to provide a light output control circuit that is less prone to glitches caused by D/A conversion.

The first object is achieved by providing a light output control circuit comprising: a photodetector which detects the light output of a light-emitting device; a comparator which compares a light output detection value with a reference value; a light output control device which controls the light output of the light-emitting device in a discrete manner in accordance with the result of the comparison output from the comparator; and a switching circuit which counts the number of control actions performed by the light output control device, and which instructs the light output control device to perform control in accordance with a start-up mode until the number of control actions after starting the control reaches a predetermined value, and to perform control in accordance with a steady-state mode after the number of control actions has reached the predetermined value.

The first object is also achieved by providing a light output control circuit comprising: a photodetector which detects the light output of a light-emitting device; a comparator which compares a light output detection value with a reference value; a light output control device which controls the light output of the light-emitting device in a discrete manner in accordance with the result of the comparison output from the comparator; and a switching circuit which instructs the light output control device to perform control in accordance with a start-up mode until the light output detection value, after the start of the control, enters a window of a prescribed width, and to perform control in accordance with a steady-state mode after the detection value has entered the window.

The first object is also achieved by providing a light output control circuit comprising: a photodetector which detects the light output of a light-emitting device; a comparator which compares a light output detection value with a reference value; a light output control device which controls the light output of the light-emitting device in a discrete manner in accordance with the result of the comparison output from the comparator; and a switching circuit which instructs the light output control device to perform control in accordance with a start-up mode until the control history of the light output control device, after starting the control, matches a prescribed pattern, and to perform control in accordance with a steady-state mode after the control history has matched the prescribed pattern.

The second object is achieved by providing a light output control circuit comprising: a photodetector which detects the light output of a light-emitting device; a comparator which compares a light output detection value with a reference value; a light output control device which controls the light output of the light-emitting device in a discrete manner in accordance with the result of the comparison output from the comparator; and a clock control circuit which detects data to be supplied to the light-emitting device, generates a clock in accordance with the result of the detection, and supplies the clock as a timing signal indicating control timing to the light output control device.

The third object is achieved by providing a light output control circuit comprising: a photodetector which detects the light output of a light-emitting device; a comparator which compares a light output detection value with a reference value; a light output control device which controls the light output of the light-emitting device in a discrete manner in accordance with the result of the comparison output from the comparator; and an update permit control circuit which, after the light output has stabilized, prohibits updating of a control value for the light output from the time that the control value is last updated, until the time that a prescribed condition is satisfied.

The fourth object is achieved by providing a light output control circuit comprising: a photodetector which detects the light output of a light-emitting device; a comparator which compares a light output detection value with a reference value; and a light output control device which controls the light output of the light-emitting device in a discrete manner in accordance with the result of the comparison output from the comparator, wherein, after the light output has stabilized, the frequency band of a drive current for the light-emitting device is reduced in width.

DESCRIPTION OF THE PREFERRED EMBODIMENTS

Figure 1:
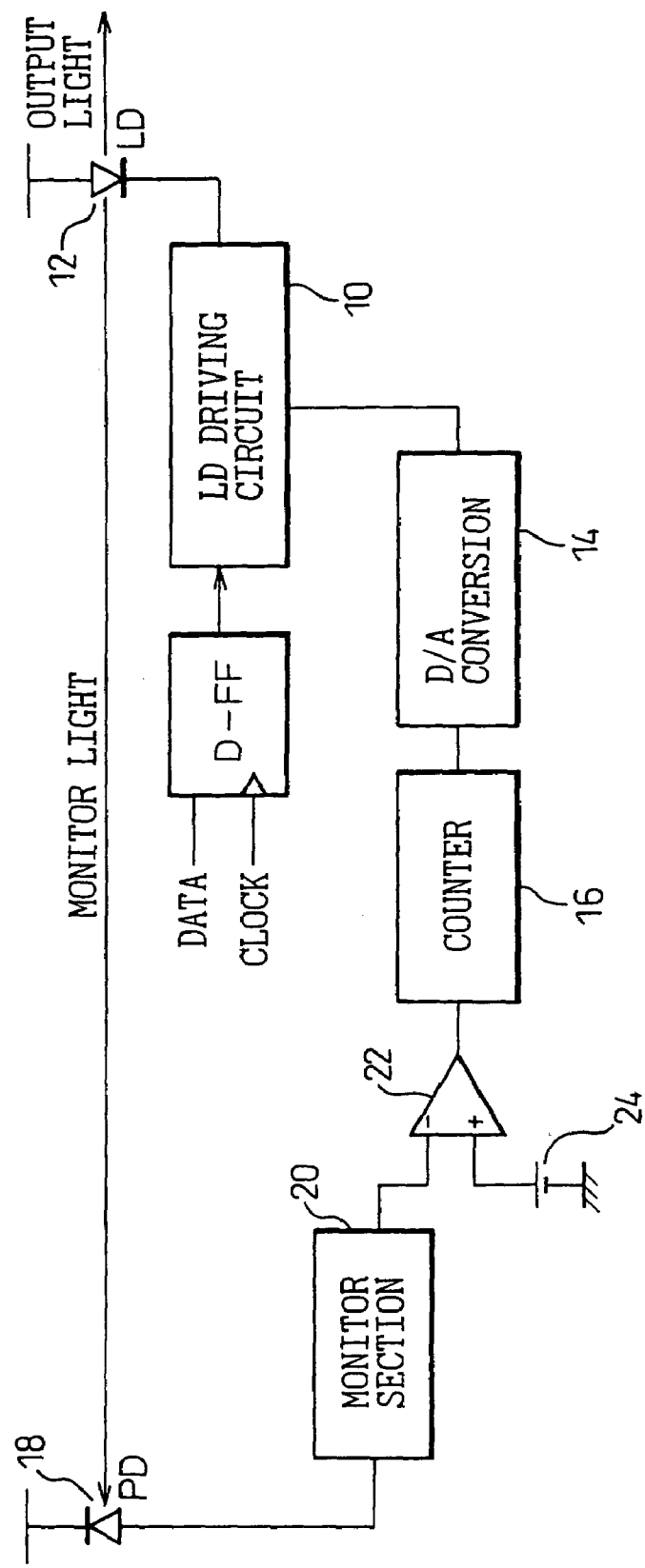
FIG. 1 is a block diagram of a prior art light output control circuit.
Figure 2:
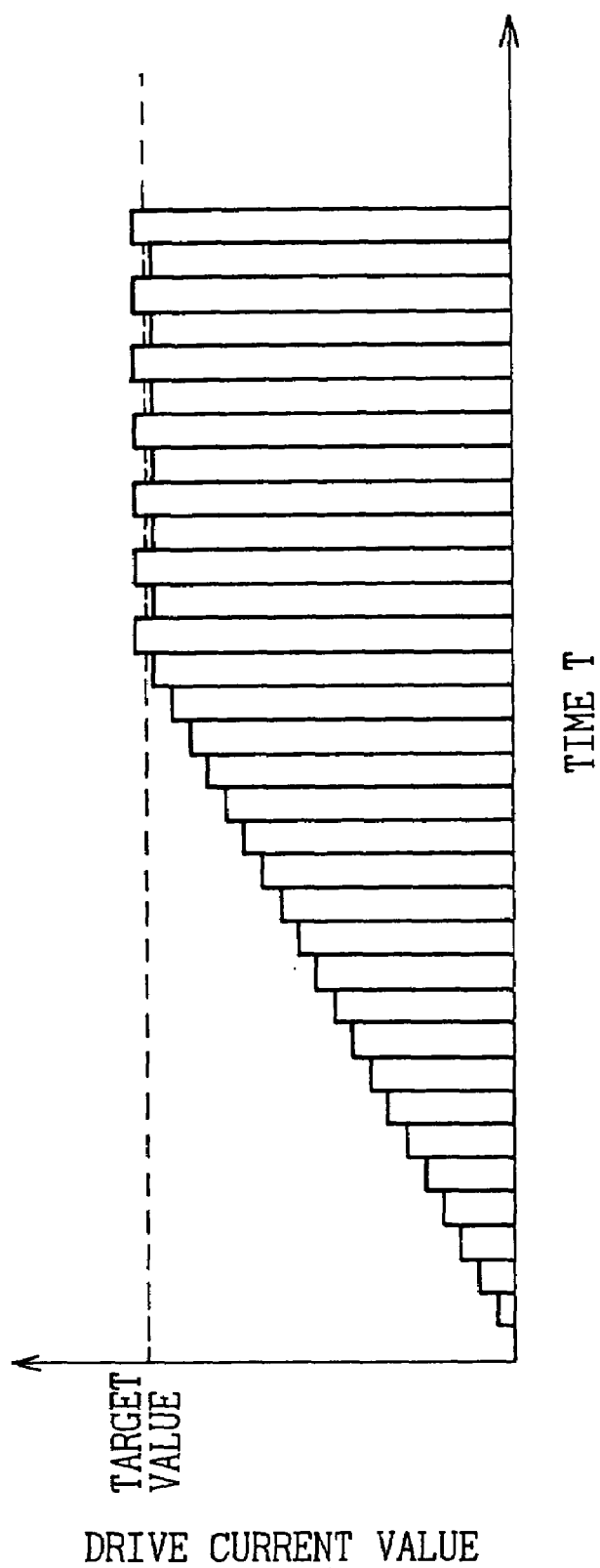
FIG. 2 is a graph for explaining the operation of the circuit of FIG. 1.
Figure 3:
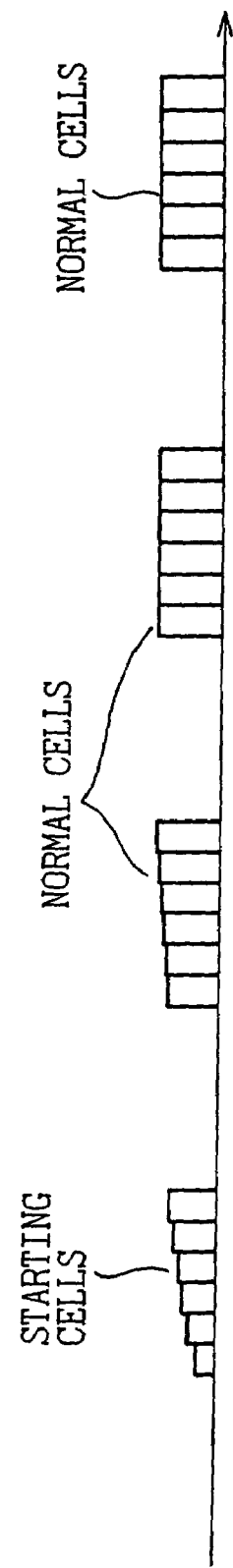
FIG. 3 is a diagram showing a burst signal.
Figure 4:
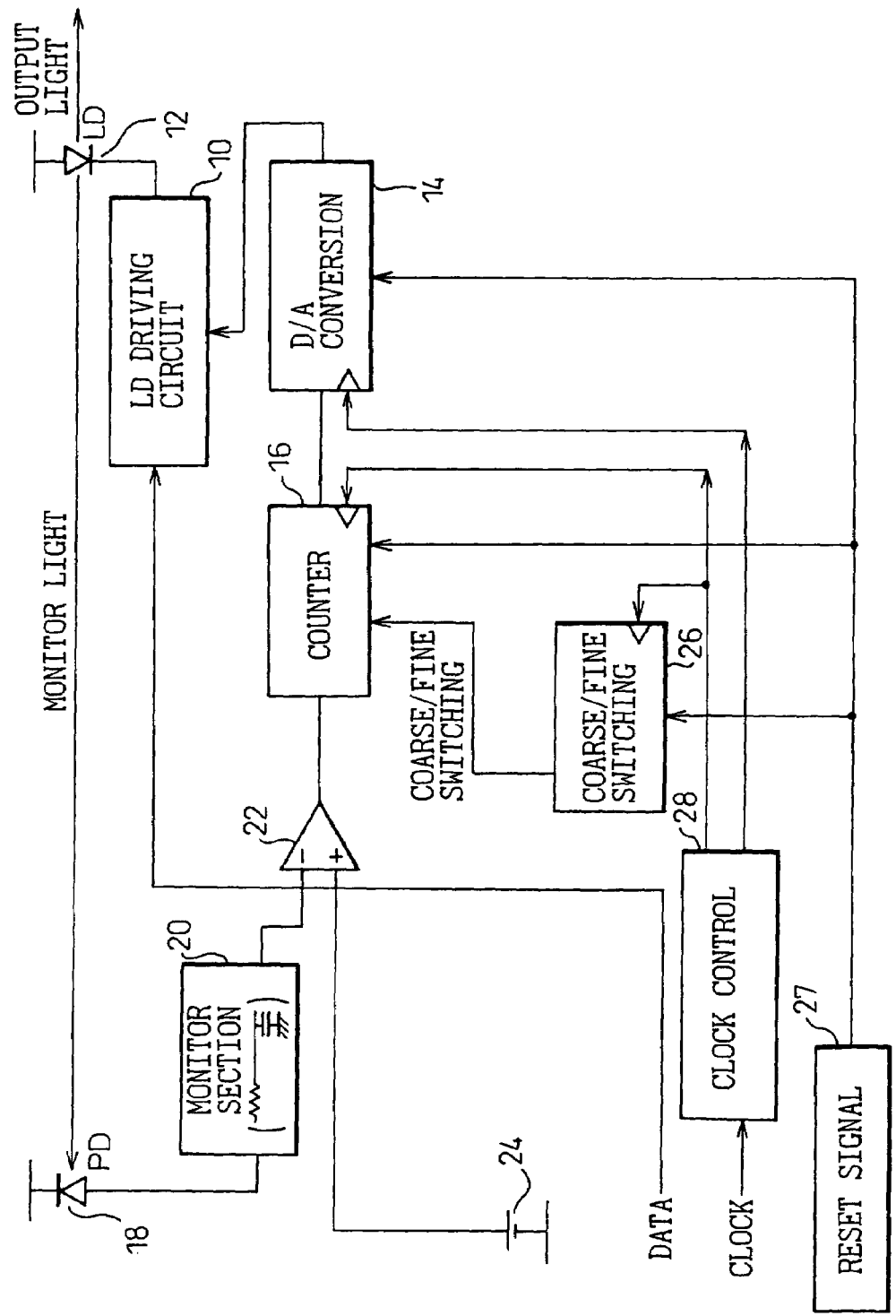
FIG. 4 is a block diagram of a first embodiment of the present invention.

FIG. 4 shows a first embodiment of the present invention. The same constituent elements as those in FIG. 1 are designated by the same reference numerals. In this embodiment, after resetting a coarse/fine switching circuit 26 by a reset signal, the counter 16 that controls the light output value is caused to count up or down with a large step a predetermined number of times, and then the operation mode of the counter 16 is switched to count up or down in the small step. The present embodiment concerns a light output control circuit for use with a laser driving circuit for continuous transmission applications.

In the illustrated circuit, as in the prior art circuit of FIG. 1, a drive current modulated with a data signal in the LD driving circuit 10 is supplied to the light-emitting device. The drive current value is controlled using the counter 16 and the D/A conversion circuit 14. The monitor current proportional to the LD output is I/V converted by the monitor section 20, and the result is compared with the reference value 24 to manipulate the counter 16. If a 10-bit D/A converter is used as the D/A conversion circuit 14, and a drive current of 0.1 mA is made to correspond to a digital value 1, the controllable range of the drive current is 0 to 102.3 mA.

A conventional voltage regulation circuit using a BRG or a Zener diode is used to provide the reference value. A differential amplifier circuit is used as the comparator 22. Since this control circuit is used for continuous transmission, the monitor section 20 uses an average value detection circuit comprising a resistor and a capacitor. It is also possible to create the reference value by inputting a data signal to a circuit similar to the monitor section.

The present embodiment differs from the prior art of FIG. 1 by the inclusion of a mechanism for switching the counter 16 between coarse and fine settings to control the drive current. In the present embodiment, the coarse/fine switching is performed based on the number of feedback operations (the number of updates of the up/down counter) during initial power up.

The coarse/fine operation of the counter 16 is controlled by a coarse/fine switching signal which is output from the coarse/fine switching circuit 26. The coarse/fine switching circuit 26 is controlled by a clock and the reset signal 27. The clock supplied to the counter 16, coarse/fine switching circuit 26, and D/A conversion circuit 14 is created by a clock control circuit 28.

Figure 5:
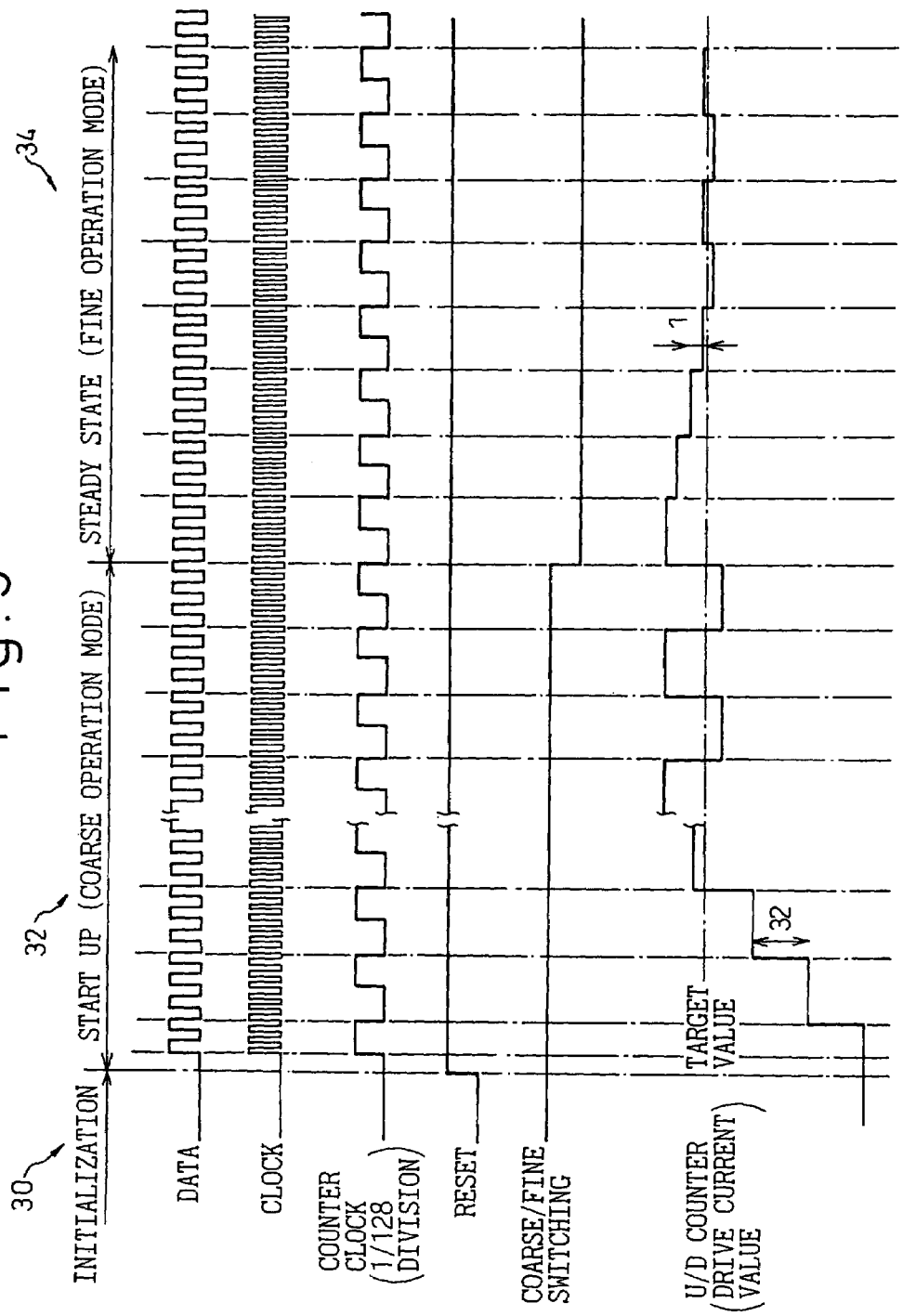
FIG. 5 is a timing chart for explaining the operation of the circuit of FIG. 4.

The operation of the present embodiment will be described below with reference to FIG. 5.

Initial start up 30: The value of the counter 16 and the value of a counter in the coarse/fine switching circuit 26 are cleared by an initial start-up reset signal (low). At this time, the coarse/fine switching output is high to indicate coarse operation mode.

Coarse operation mode 32: When the clock and data are input, the LD driving circuit 10 outputs a drive current modulated with the data. First, the current value is 0 mA because the counter 16 is reset. Next, the monitor current value is compared with the reference value, as a result of which the value of the counter 16 increases. Since the coarse/fine switching signal is high (indicating coarse operation), the counter value increases by 32 each time the counter 16 is updated, and the drive current thus rises by 3.2 mA each time. This operation is repeated until the drive current reaches the target value and, once the target value is reached, the current value oscillates around the target value, varying between two values with a difference of 3.2 mA. The number of updates of the counter 16 up to this point is reduced to 1/M (in the illustrated example, 1/32), and the rise time can be shortened correspondingly. In the illustrated example, when the counter 16 is operated starting at its initial value 0, the maximum current value of 102.4 mA can be reached with 32 updates in the worst case.

The clock supplied to the counter 16 and coarse/fine switching circuit 26 is a slow clock derived by frequency-dividing the base clock by 128, considering the time constant of the average value circuit in the monitor section 20. The frequency-divided clock is generated within the clock control circuit 28 (described in detail later).

The coarse operation mode ends when the counter (described in detail later) in the coarse/fine switching circuit 26 has counted up to 32; thereupon, the output of the coarse/fine switching circuit 26 changes to low, stopping the counter, while causing the mode to switch to the fine operation mode. The update cycle of the counter 16 is equal to the cycle of the frequency-divided clock, and the duration of the coarse operation mode in this embodiment is 128×32=4096 times the cycle of the base clock.

Fine operation mode 34: In the fine operation mode, the counter 16 updates its value in increments of a minimum unit 1. Consequently, the drive current changes in increments of 0.1 mA, approaching the final steady-state value. Once the target value is reached, the drive current value oscillates between two values closest to the target value. The number of updates of the counter 16 required to reach the final steady-state value after entering the fine operation mode is M or less (in the illustrated example, 32 or less). Accordingly, the steady-state value can be reached with 32+32=64 updates (coarse and fine operation modes combined) under worst case conditions. In the prior art, it takes 1024 updates in the worst case. In the present embodiment, therefore, the speed is increased by a factor of more than 10.

Figure 6:
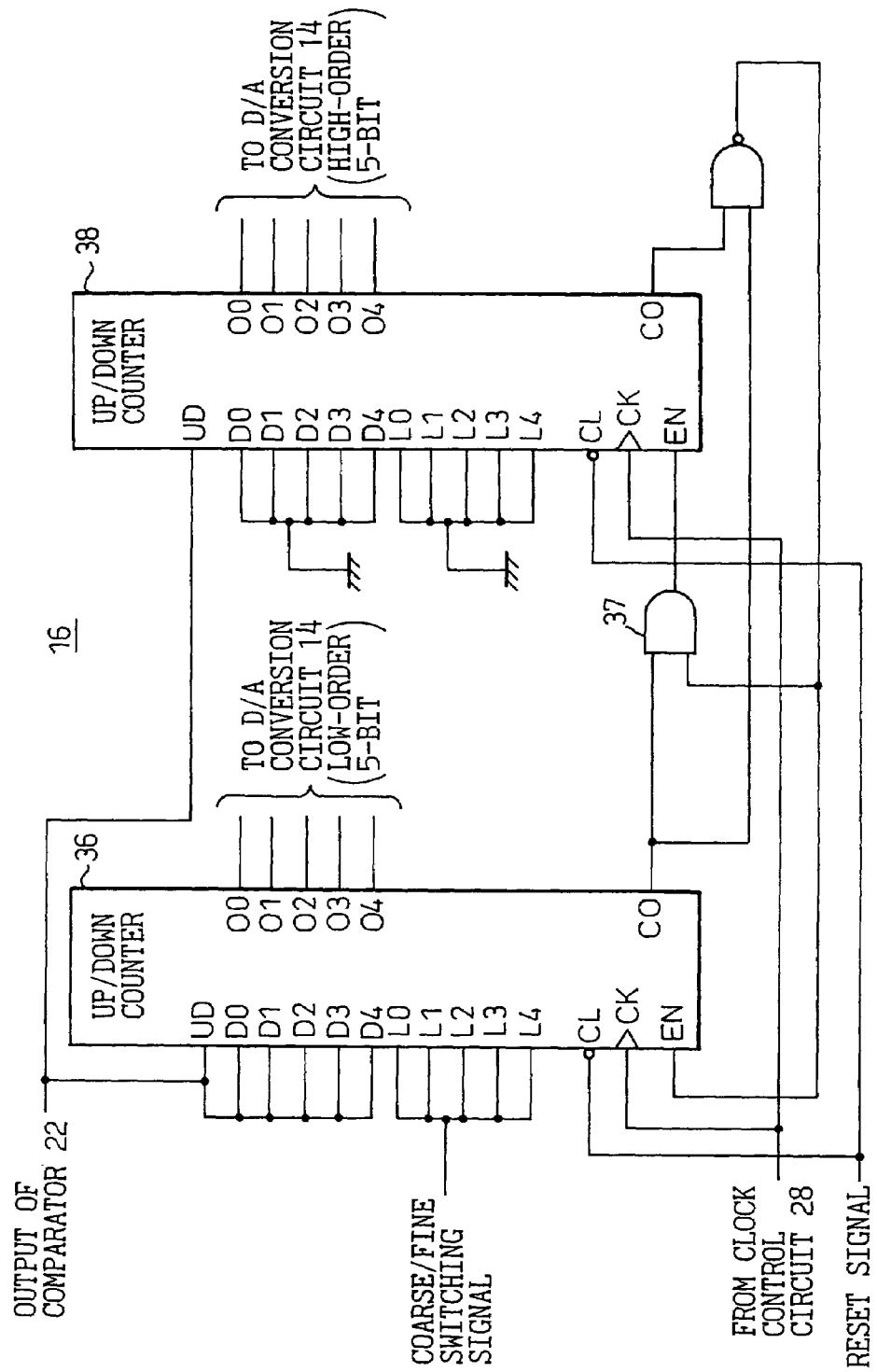
FIG. 6 is a circuit diagram showing one example of a counter 16.

FIG. 6 shows a detail circuit block diagram of the counter 16. This circuit comprises a 10-bit up/down counter which stores a drive current control value and is capable of switching between coarse and fine modes. The 10-bit up/down counter is implemented by connecting two 5-bit up/down counters 36 and 38. The meanings of input/output signals of the 5-bit up/down counters 36 and 38 are given below.

UP: Up/down input. High for UP and low for DOWN.
CL: Clear input. Low for clear.
CK: Clock input.
EN: Enable input. High to operate and low to hold.
CO: Carry output. High when carry or borrow occurs.
D0-D4: LOAD data inputs.
L0-L4: LOAD control input. High to load LOAD data in the corresponding bit.
O0-O4: Output (count value) data.

The operation of the circuit of FIG. 6 constructed by connecting the two 5-bit counters will be described below.

(1) When Coarse/Fine Switching Signal=H (Coarse Operation Mode)

When the coarse/fine switching signal is high, since all the LOAD inputs of the up/down counter 36 are high, the output of the comparator is loaded into all the bits of the count value of the up/down counter 36. The output of the comparator is also input to the up/down input of the counter 36. When the monitor value is smaller than the reference value, and therefore the output of the comparator is high, all the bits of the counter 36 are 1s. Since, at this time, the up/down input is high (UP), a carry occurs for every clock. If the output of the comparator is low, all the bits of the counter 36 are 0s, and the up/down input is low (DOWN), so that a borrow occurs for every clock. When a carry or a borrow occurs in the counter 36, the up/down counter 38 is enabled via an AND gate 37. Since the L0 to L4 inputs of the high-order counter 38 are low, data is not loaded and the high-order counter 38 counts up or down. That is, D0 to D4 of the high-order counter 38 count up or down in accordance with the up/down signal supplied from the comparator 22.

In this way, in the coarse operation mode, all 1s or all 0s are loaded into the low-order five bits by the up or down signal, and the resulting carry or borrow causes the high-order 5-bit counter 38 to count up or down, thus accomplishing the coarse mode operation.

(2) When Coarse/Fine Switching Signal=L (Fine Operation Mode)

Since the L0 to L4 inputs of both the high-order and low-order counters are all low, the counters together operate as a normal 10-bit up/down counter with all 10 bits (5×2) counting up or down (fine mode operation).

In this way, the counter 16 operates as an up/down counter whose operation mode is switchable between the coarse operation and fine operation modes by the coarse/fine switching signal.

Figure 7:
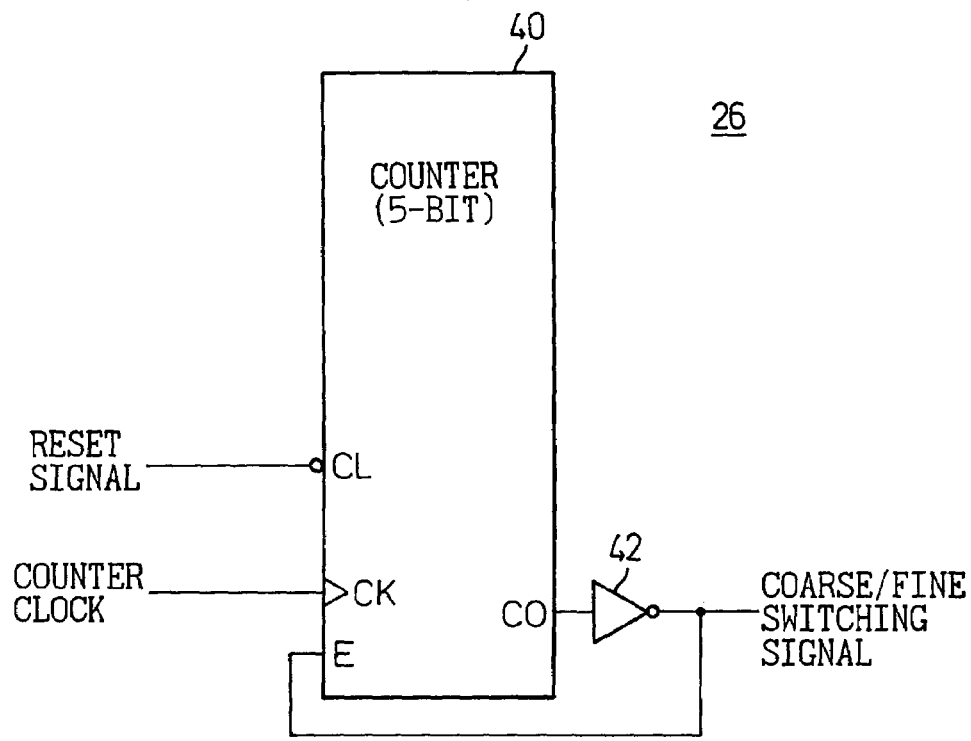
FIG. 7 is a circuit diagram showing one example of a coarse/fine switching circuit 26.
Figure 8:
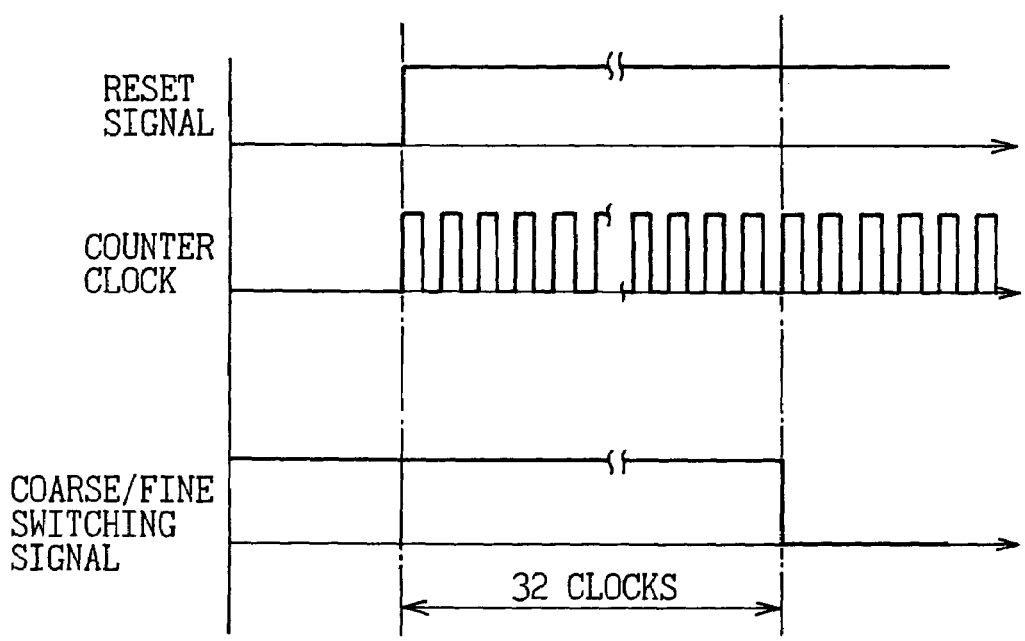
FIG. 8 is a timing chart for explaining the operation of the circuit of FIG. 7.

FIG. 7 shows a detailed circuit block diagram of the coarse/fine switching circuit 26, and FIG. 8 shows the circuit operation. This circuit generates the coarse/fine switching signal from the reset signal and clock signal. The circuit comprises a 5-bit binary counter 40 and an inverter 42.

At initial start up, the reset signal is low to reset the contents of the counter. When the clock is input, the counter counts up, and when the counter counts up to 32=$2^5$, the carry output CO goes high, which is inverted by the inverter 42 and applied as a low signal to the enable terminal E to stop the counter operation. Accordingly, after the reset state is released, the coarse/fine switching output is held high until 32 clock pulses are counted, and thereafter goes low. Since this clock is the same clock supplied to the light output control counter 16, the counter 40 counts the number of updates of the counter 16. The coarse/fine switching function is accomplished by counting the predetermined number of times that the counter 16 is updated in the coarse operation mode.

In FIG. 7, the present embodiment uses a counter of the type that counts up to 32, but if another count number is to be used, a counter of the appropriate type should be used.

Figure 9:
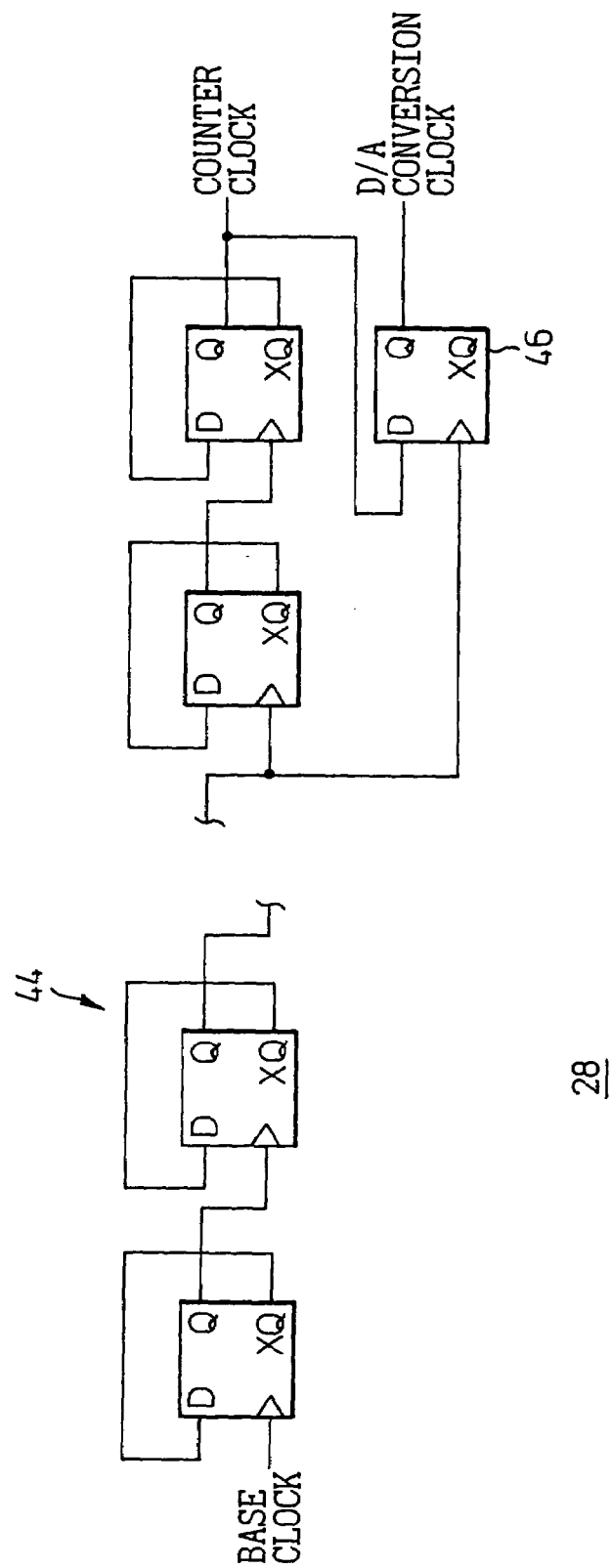
FIG. 9 is a circuit diagram showing one example of a clock control circuit 28.
Figure 10:
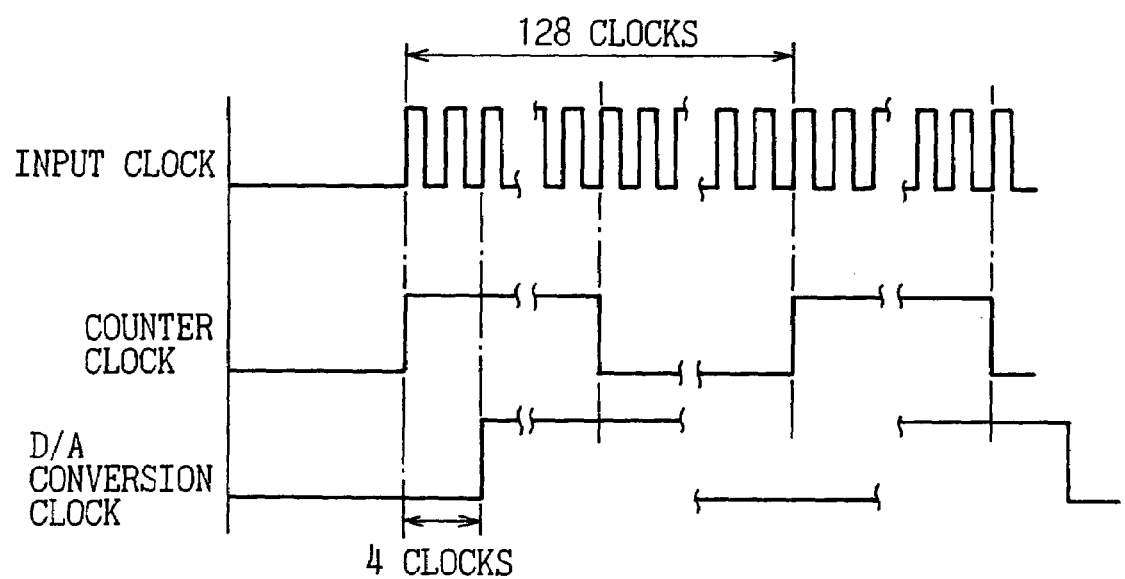
FIG. 10 is a timing chart for explaining the operation of the circuit of FIG. 9.

FIG. 9 shows a detailed circuit block diagram of the clock control circuit 28, and FIG. 10 shows the circuit operation. This clock control circuit is designed for continuous transmission. The base clock is frequency-divided by a factor of 128 to create the counter clock which is supplied to the counter 16 as well as to the coarse/fine switching circuit 26. The frequency dividing circuit consists of seven D-FF (flip-flop) circuits 44, and produces one output clock cycle for every 128 input clock cycles. The clock to be supplied to the D/A conversion circuit 14 is delayed by half a cycle by a D-FF 46.

Figure 11:
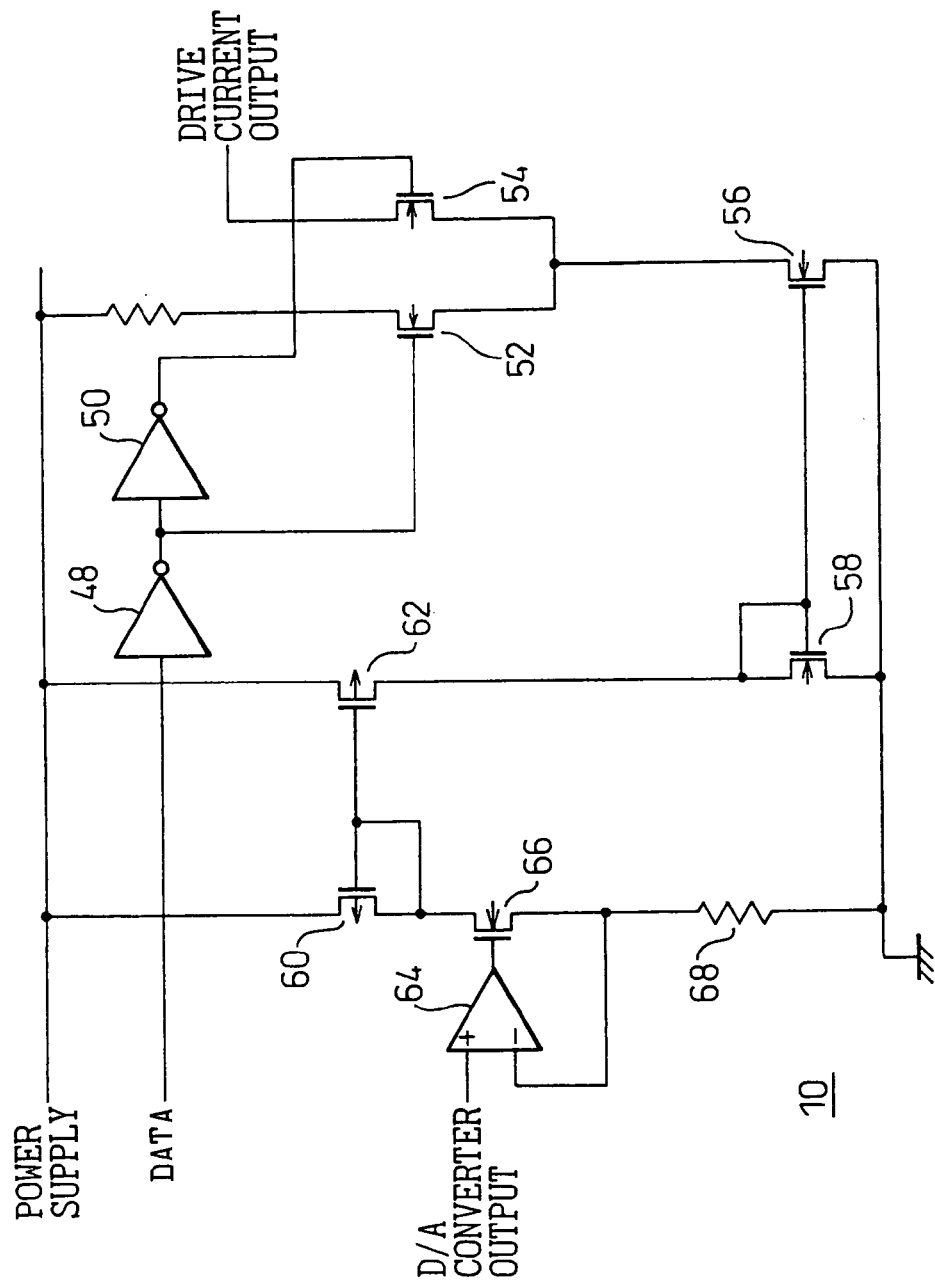
FIG. 11 is a circuit diagram showing one example of an LD driving circuit 10.

FIG. 11 shows a detailed circuit diagram of the LD driving circuit 10. This circuit, using differential data signals output from inverters 48 and 50 and a differential pair consisting of n-channel MOS transistors 52 and 54, modulates the current delivered from an n-channel MOS transistor 56 acting as a current source, and produces the drive current (modulated current) to be supplied to the LD.

The current value of the constant current source 56 is provided by an output current of a current mirror consisting of the n-channel MOS transistors 56 and 58, and its input current is obtained from a current mirror consisting of p-channel MOS transistors 60 and 62, whose input current in turn is obtained by converting the D/A converter output voltage into a constant current value using an operational amplifier 64, an n-channel MOS transistor 66, and a fixed resistor 68. Accordingly, the drive current value is controlled by the output of the D/A conversion circuit 14. The above description has assumed that the output of the D/A conversion circuit is a voltage signal, but if the output is a current, the output can be coupled directly to the current mirror circuit consisting of the transistors 60 and 62 or to the current mirror circuit consisting of the transistors 56 and 58.

As described, in the first embodiment, after resetting the coarse/fine switching circuit, the counter value that determines the light output is increased or decreased in incremental steps a predetermined number of times, the step size being M times the value indicated by the least significant bit of the counter, and after that, the value indicated by the least significant bit of the counter is counted up or down. This speeds the power up of the light output control circuit which is designed for use with the laser diode driving circuit for continuous transmission applications.

In the present embodiment, an external signal is used as the reset signal, but instead, use can also be made of a signal that a supply voltage detection circuit (such as a conventional power-on reset circuit) or the like automatically generates when a supply voltage is turned on.

To quickly raise the light output to or near the target value, the step size in the coarse operation should be increased, but increasing the coarse operation step size will result in increasing the number of steps required to reach the final steady-state value after entering the fine operation mode. Assuming that the number of bits of the D/A conversion circuit is N, and that the coarse operation step size is equal to the Mth lowest bit, then $2^{(N-M)}$ coarse operation steps and $2^M$ fine operation steps, a total of $2^{(N-M)}+2^M$ steps, are required to scan the full range of digital values of the D/A conversion. The total number of steps is the smallest when M=N/2.

That is, when a 10-bit D/A converter is used, it is best to set the number of coarse operation steps to 32, in which case all digits settle down after 64 steps.

In the above embodiment, the number of coarse operation steps is set to 32 (32×32=1024) to scan all the digital values 0 to 1023 input to the 10-bit D/A conversion circuit, but when there is no need to scan the full range during power up, for example, when loading an initial value into the counter, or when the electric current range used is narrow, it is desirable to reduce the number of counts because the rise time can then be shortened.

In the present embodiment, at reset, the value of the light output control counter 16 is reset, but this does not necessarily requires loading the value 0 into the counter 16. For some reason, an initial value may be loaded. For example, when a value corresponding to a current larger than the target value is used as the initial value, it is possible to set the counter 16 to start counting from that value, decrementing by 16 for each update. Furthermore, an appropriate initial value may be loaded in accordance with the type of LD, the value of the current supplied, or the light output accuracy required.

If a value appropriate to the temperature at that time and the temperature characteristic of the LD is loaded as the initial value of the light output control, the desired light output can be obtained starting from the first bit of the first burst signal, and thus, fast response and high precision control of the light output can be achieved at the same time. Furthermore, by performing the above-described initialization between bursts, the light output can be adjusted to compensate for abrupt changes in ambient temperature between burst signals.

In the present embodiment, the 10-bit up/down counter has been described as being constructed by connecting two 5-bit counters; alternatively, two 4-bit counters and one 2-bit counter may be connected together or a 10-bit counter as a single unit may be used.

Figure 12:
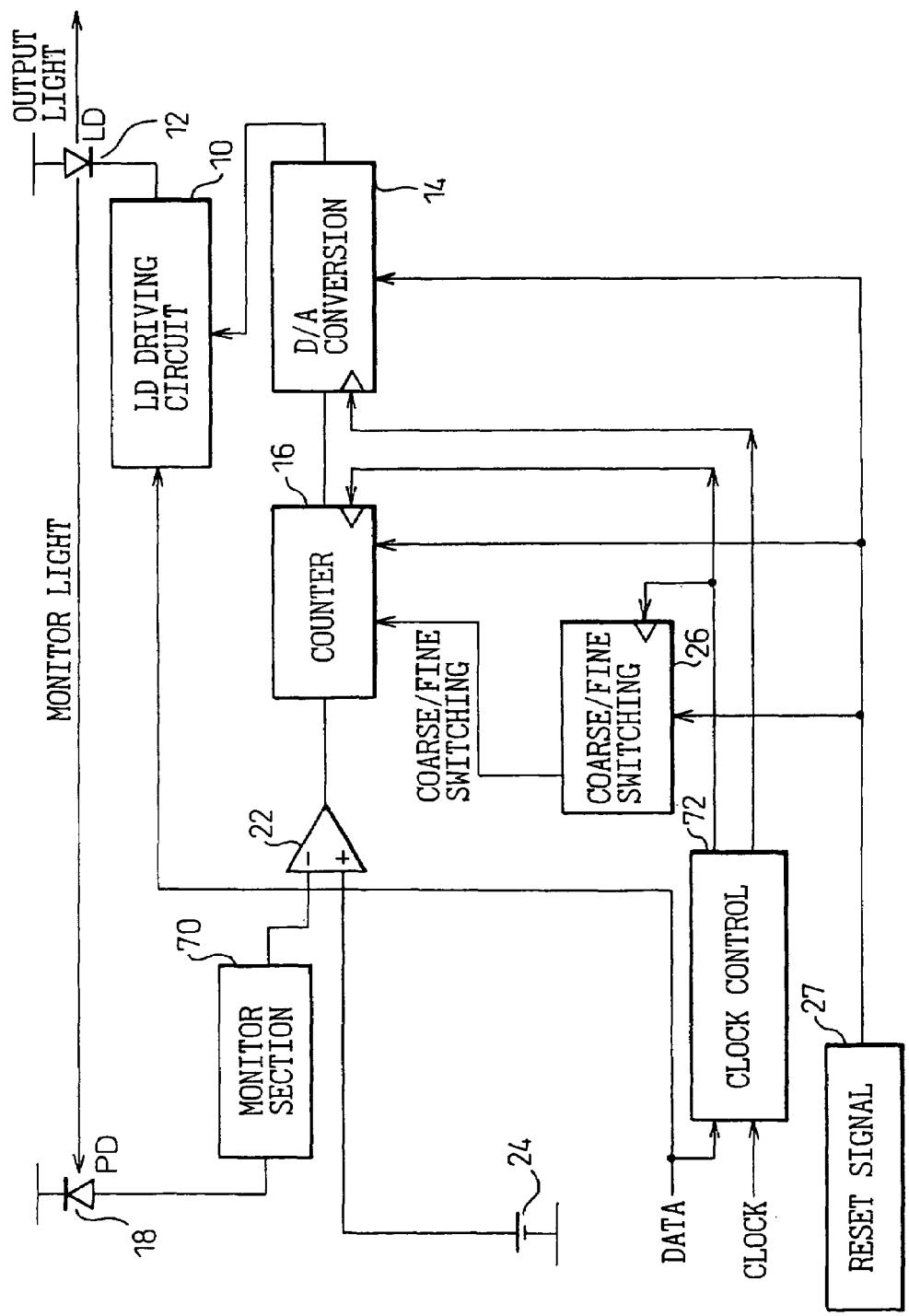
FIG. 12 is a block diagram of a second embodiment of the present invention.

FIG. 12 shows a second embodiment. This embodiment is applicable for both burst transmission and continuous transmission, and differs from the first embodiment (FIG. 4) in the configuration of the monitor section and clock control circuit.

Figure 13:
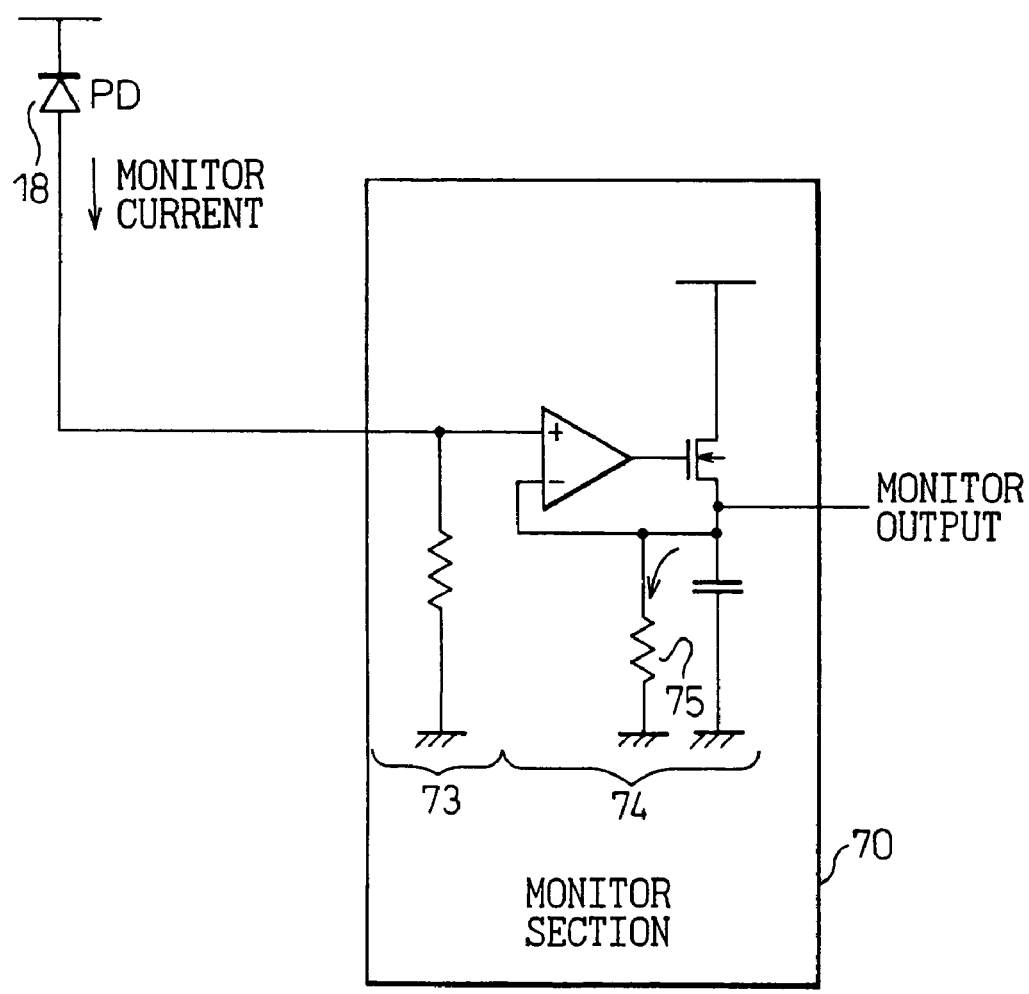
FIG. 13 is a circuit diagram showing one example of a monitor section 20.

FIG. 13 shows a circuit diagram of the monitor section 70. This circuit comprises an I/V conversion circuit 73 and a peak-hold circuit 74. While the monitor section of the first embodiment can be applied only to continuous transmission because of the use of the average value detection circuit having a long time constant, the present embodiment can be applied to burst transmission as well as to continuous transmission because the monitor value of the light output can be detected instantaneously by capturing the peak value of the light output. Spontaneous discharge through a resistor 75 is used to discharge a current and follow the change when an update is made in a direction that reduces the light output value. The peak-hold circuit used in the present embodiment may be replaced by a bottom-hold circuit or a sample-and-hold circuit.

In the clock control circuit 28 of the first embodiment, the clock supplied to the counter was derived by simply dividing the base clock to accommodate continuous transmission. In burst transmission, on the other hand, time intervals during which no data are transmitted are relatively long, and during these intervals, the light output value cannot be fed back. In view of this, the clock control circuit 72 of the second embodiment is configured to stop the supply of the clock to the counter 16, coarse/fine switching circuit 26, and D/A conversion circuit 14 during no-data periods so as not to update the control condition when there are no data.

Figure 14:
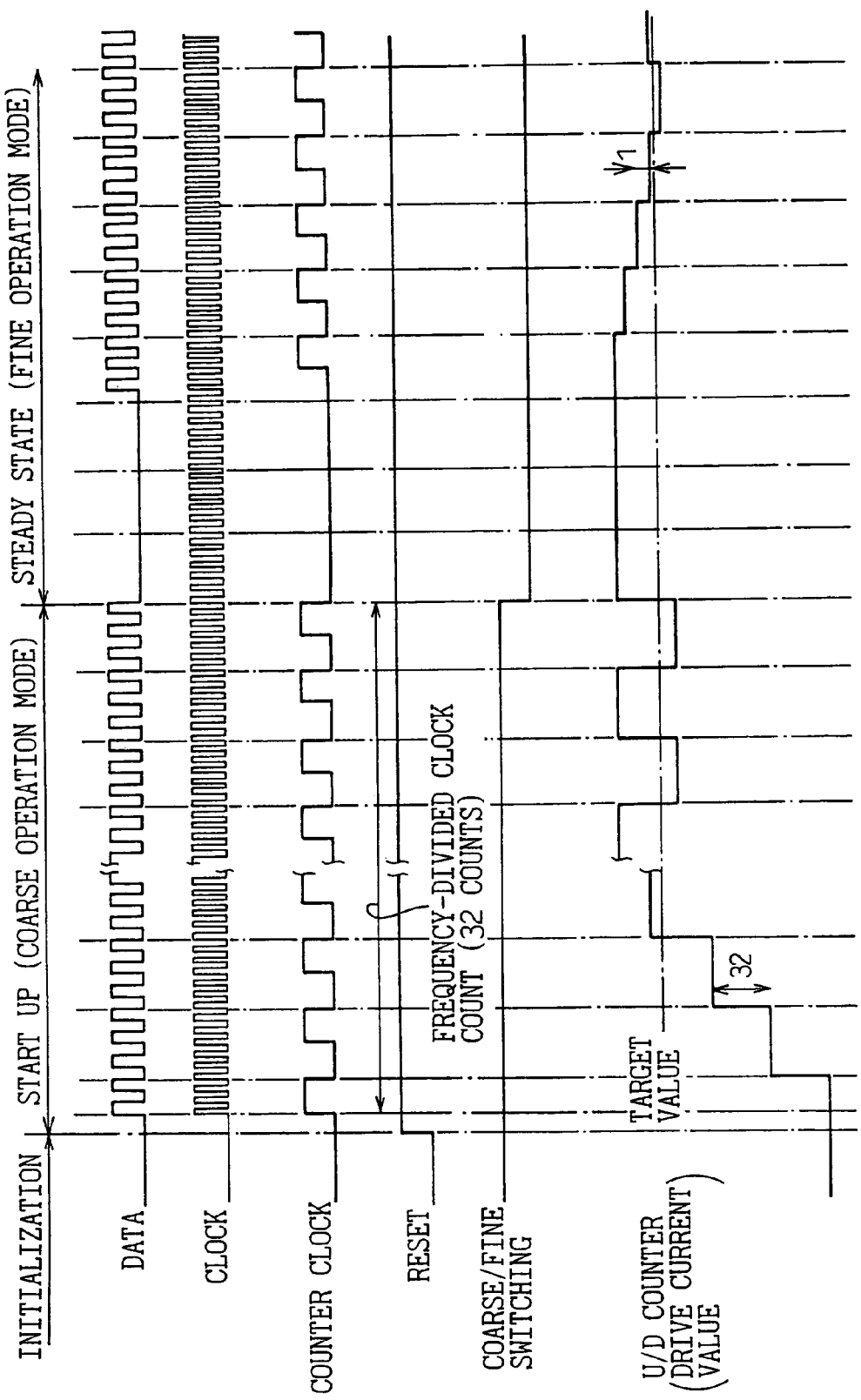
FIG. 14 is a timing chart showing the operation of the second embodiment.

FIG. 14 shows the operation of the present embodiment. The difference from the first embodiment is that during no-data periods, the clock supplied to the counter 16 is stopped to prevent the counter 16 from being updated. The detailed configuration of the clock control circuit 72 will be described later.

In the first and second embodiments, a quick rise is achieved by switching between the coarse operation and fine operation modes, but by increasing the number of steps in the coarse operation mode, the rise time before the final bit stabilizes can be further shortened (multi-stage counting method).

Figure 15:
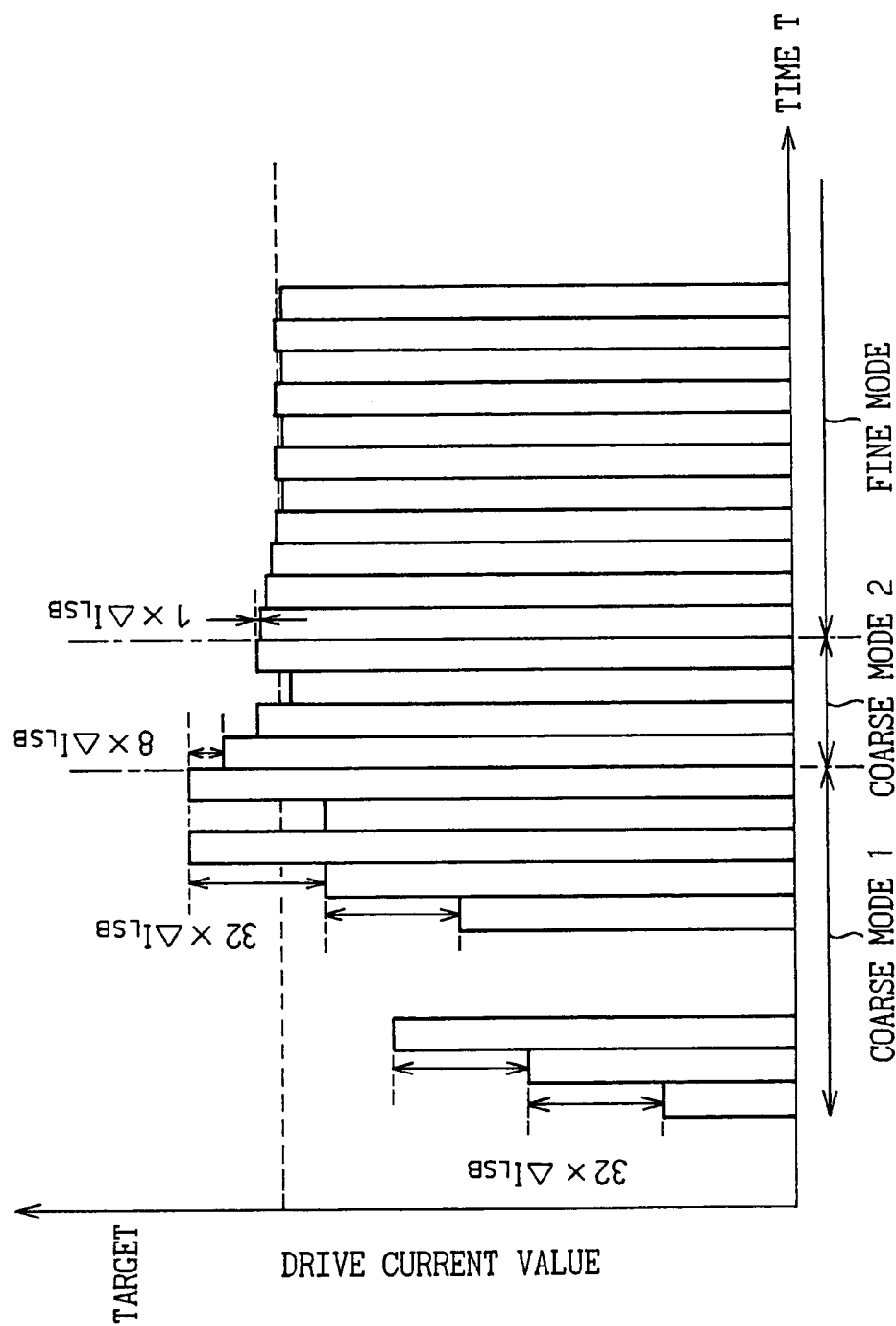
FIG. 15 is a diagram showing the operation of a third embodiment.

FIG. 15 shows the operation of a third embodiment for implementing the above operation.

During the initial power up of the light output control counter, first the counter is updated 32 times by counting up or down the sixth bit of the counter in increments of 32 LSBs, thus increasing or decreasing the drive current in steps of 3.2 mA. Next, the counter is updated four times by counting up or down the fourth lowest bit of the counter in increments of 8 LSBs, thus increasing or decreasing the drive current in steps of 0.8 mA. Thereafter, the counter is updated in increments of 1 LSB, thus increasing or decreasing the drive current in steps of 0.1 mA. In this embodiment, the counter is updated 32+4+8=44 times until the final bit of the counter stabilizes, reaching a steady-state value. This provides an improvement in speed by a factor of 1.5 compared with the second embodiment that required 32+32=64 updates.

Figure 16:
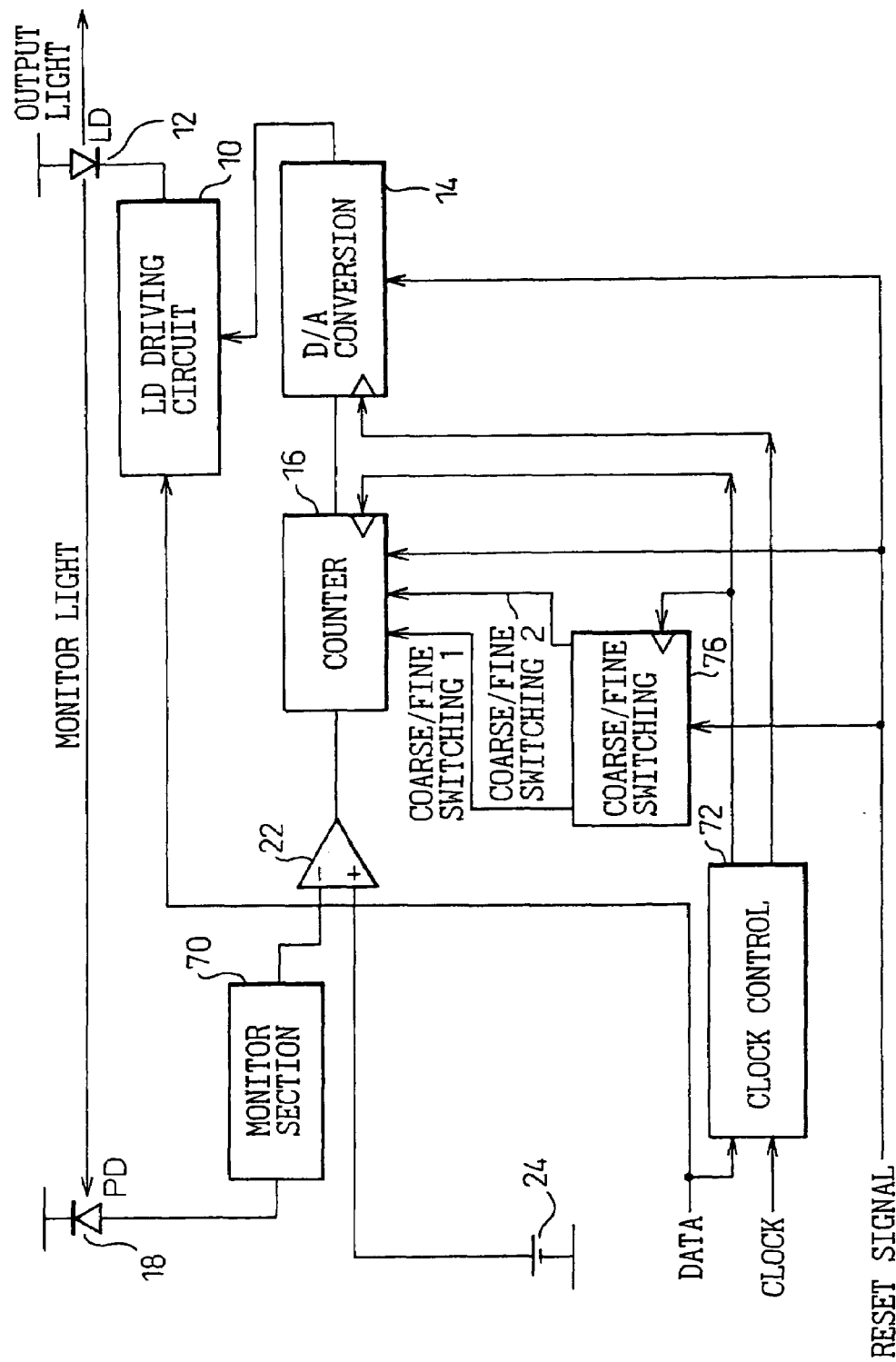
FIG. 16 is a block diagram of the third embodiment.

FIG. 16 shows the circuit block configuration for implementing the third embodiment. The major difference from the second embodiment is that the coarse/fine switching circuit 76 outputs two coarse/fine switching signals for supply to the light output control counter 16 to realize two coarse operation modes.

Figure 17:
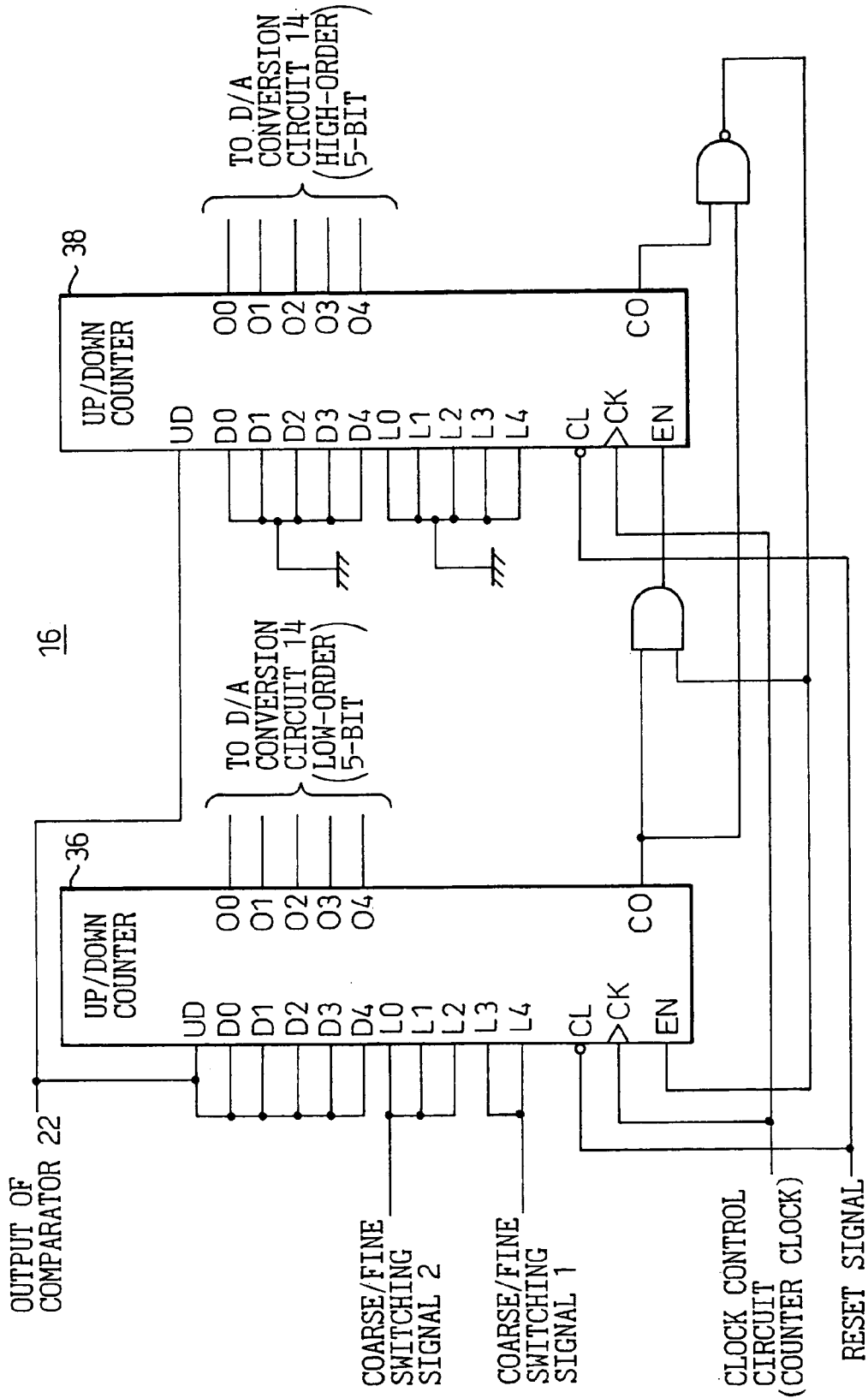
FIG. 17 is a circuit diagram showing one example of the counter 16 used in the second embodiment.

FIG. 17 shows a circuit diagram of the light output control counter 16 used in the above configuration. The difference from the counter of FIG. 6 used in the first and second embodiments lies in the connections associated with the two coarse/fine switching signals. That is, the coarse/fine switching signals 1 and 2 are coupled to their associated bits at the LOAD control inputs of the low-order counter. While the corresponding switching signal is held high, a high state is loaded into each associated bit when counting up or a low state when counting down. The low-order bits 4 and 5 (positions 8 and 16) of the low-order 5-bit counter are controlled by the coarse/fine switching signal 1. The low-order bits 1 to 3 (positions 1, 2, and 4) of the low-order 5-bit counter are controlled by the coarse/fine switching signal 2.

Figure 18:
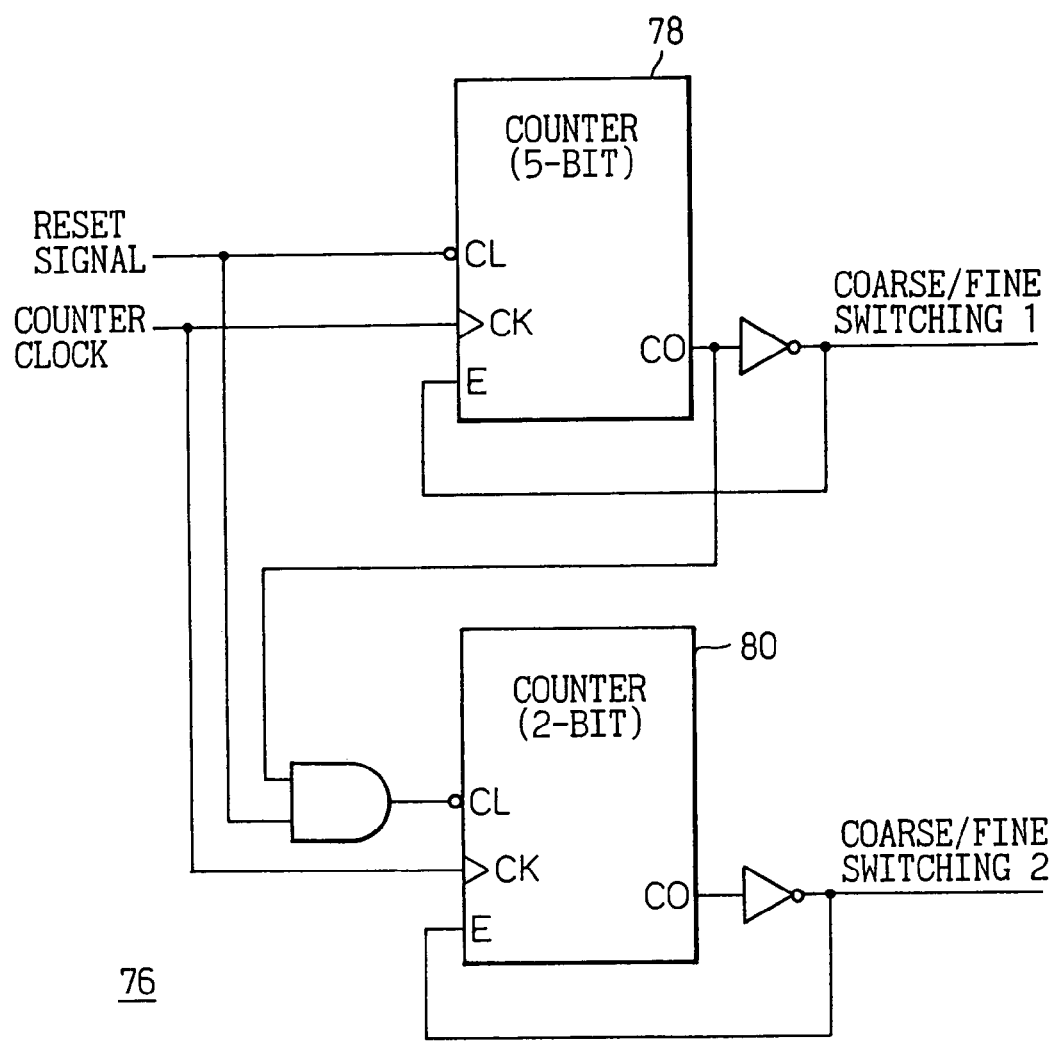
FIG. 18 is a circuit diagram showing one example of a coarse/fine switching circuit 76.
Figure 19:
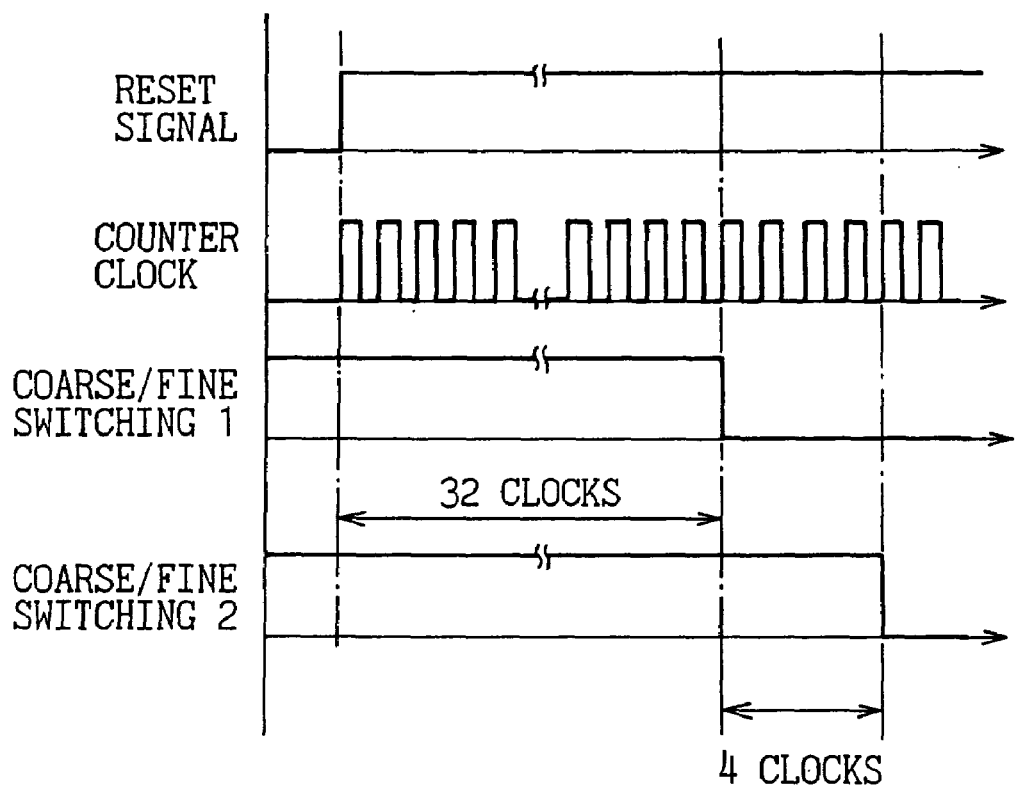
FIG. 19 is a timing chart showing the operation of the circuit of FIG. 18.

FIG. 18 shows a circuit diagram of the coarse/fine switching circuit for generating the coarse/fine switching signals 1 and 2, and FIG. 19 shows the circuit operation. This circuit, unlike the circuit shown in FIG. 7, comprises two counter circuits.

After the reset signal is released (low to high), a clock signal is supplied to operate a 5-bit counter 78, and when the counter has counted up to 32, the counter 78 is stopped, at which point the coarse/fine switching signal 1 changes from high to low. With the carry output of the counter 78 going high, the CL terminal of a counter 80 goes high, causing the 2-bit counter 80 to start counting. When the counter 80 has counted up to 4, the counter 80 is stopped, and the coarse/fine switching signal 2 changes from high to low.

In the third embodiment, two coarse operation modes are provided to improve rise speed. To further improve the speed, it will be effective to increase the number of coarse operation modes. This can be accomplished by increasing the number of coarse/fine switching signals and providing control circuits for controlling them.

Figure 20:
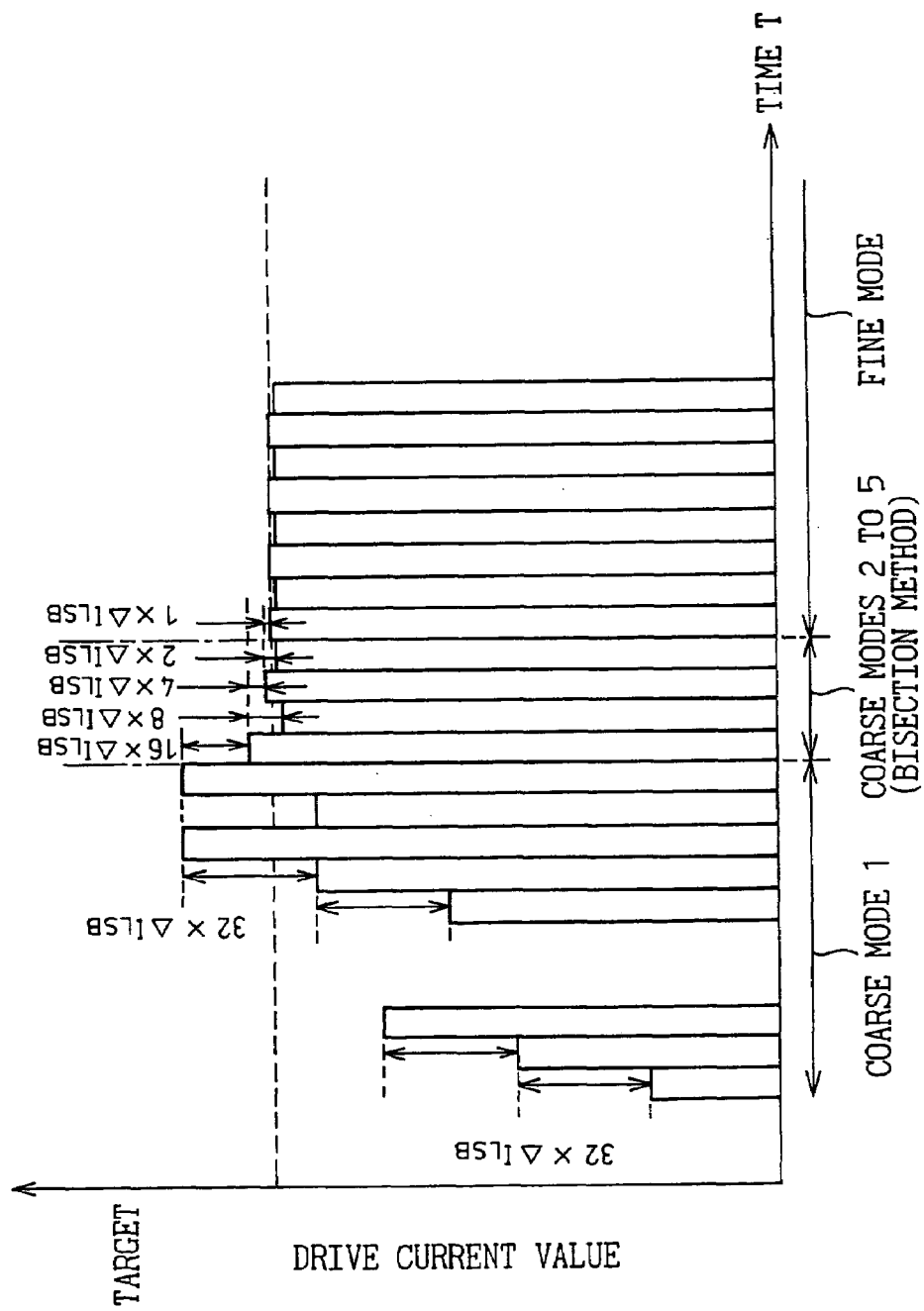
FIG. 20 is a diagram showing the operation of a fourth embodiment of the present invention.

If the number of coarse operation mode stages is further increased to provide a coarse operation mode for each bit, the fastest rise speed can be achieved. FIG. 20 shows the operation of a fourth embodiment (bisection method) according to the present invention.

After resetting, the light output control counter is updated 32 times by counting up or down the sixth and higher bits of the counter in increments of 32 LSBs, thus increasing or decreasing the drive current in steps of 3.2 mA, as in the second embodiment. The characteristic feature of the fourth embodiment is that the updating bit is lowered by one for each of the subsequent updates. That is, the counter is updated once by counting up or down the fifth and higher bits (second coarse operation mode), then the lowest bit is sequentially lowered for each subsequent update, such as the fourth and higher bits (third coarse operation mode), the third and higher bits (fourth coarse operation mode), the second and higher bits (fifth coarse operation mode), and so on, until finally determining the least significant bit (LSB), reaching a final steady-state value. In this embodiment, the counter is updated 32+5=37 times before the final bit of the counter stabilizes, reaching a steady-state value. This achieves a faster speed compared with the second embodiment that required 44 updates.

Figure 21:
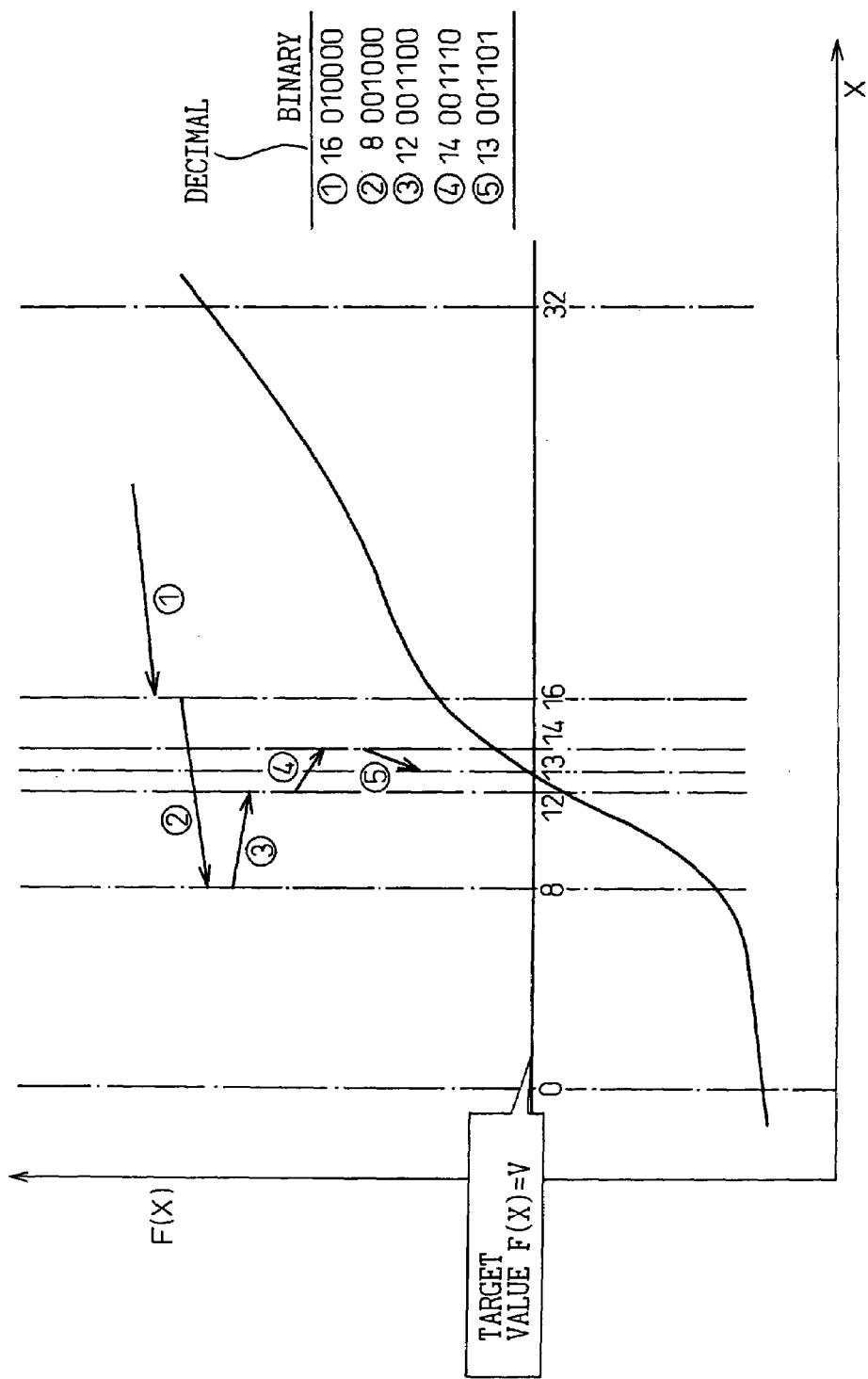
FIG. 21 is a graph for explaining the operation of the fourth embodiment.

A theory of how the rise speed can be improved according to the fourth embodiment will be described below. The power up process of the light output control circuit corresponds to finding a variable X for which the light output F(X), a function of X, equals the target value V. This means determining $X=F^{-1}(V)$ for which F(X)=V. FIG. 21 shows the graph of X–F(X). For example, when the function is known to monotonically increase or decrease over an interval X=0 to 32, that is, F(0)<V<F(32), then $X=F^{-1}(V)$ exists within the interval of 0 to 32.

One method of obtaining the X is the bisection method. The bisection method is an iterative method for finding a solution; that is, when a solution is known to exist within a certain interval, the midpoint of the interval is obtained and the interval containing the solution is narrowed to one half the length of the original interval, and this process is repeated. If the variable X is a binary number (digital), this method corresponds to successively determining bits in the digital value, starting from the highest-order bit, and the solution can be found by repeating the process the same number of times as the number of bits in the digital value. In the fourth embodiment, during initial power-up the counter is caused to count up or down the sixth and higher bits to obtain an interval containing the solution, and then the bisection method is applied to the low-order five bits. With this bisection method, the solution can be found by five iterations.

Figure 22:
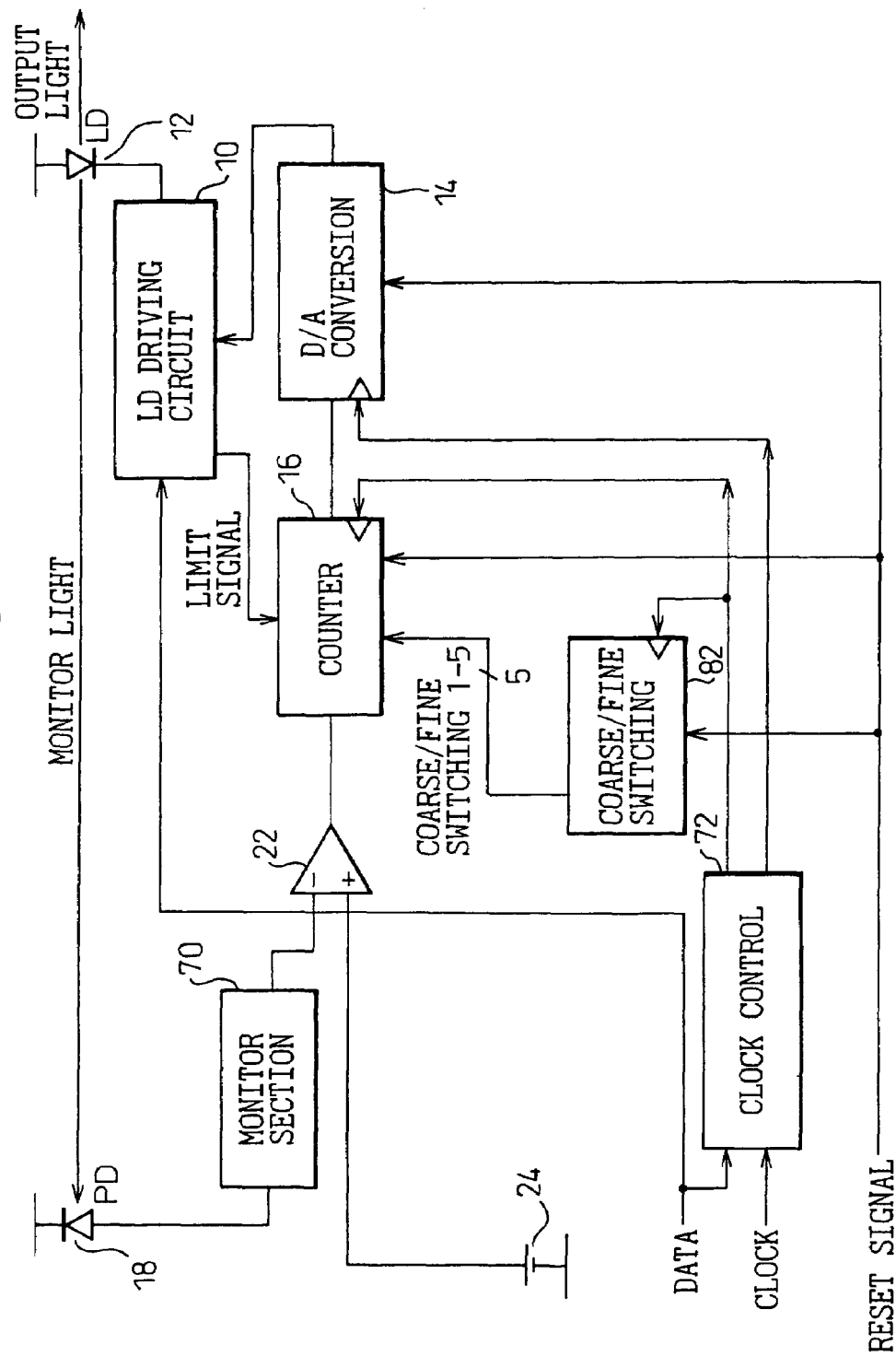
FIG. 22 is a block diagram of the fourth embodiment.

FIG. 22 shows the circuit block configuration for implementing the fourth embodiment. The difference from the second embodiment is that there are five coarse/fine switching signals.

Figure 23:
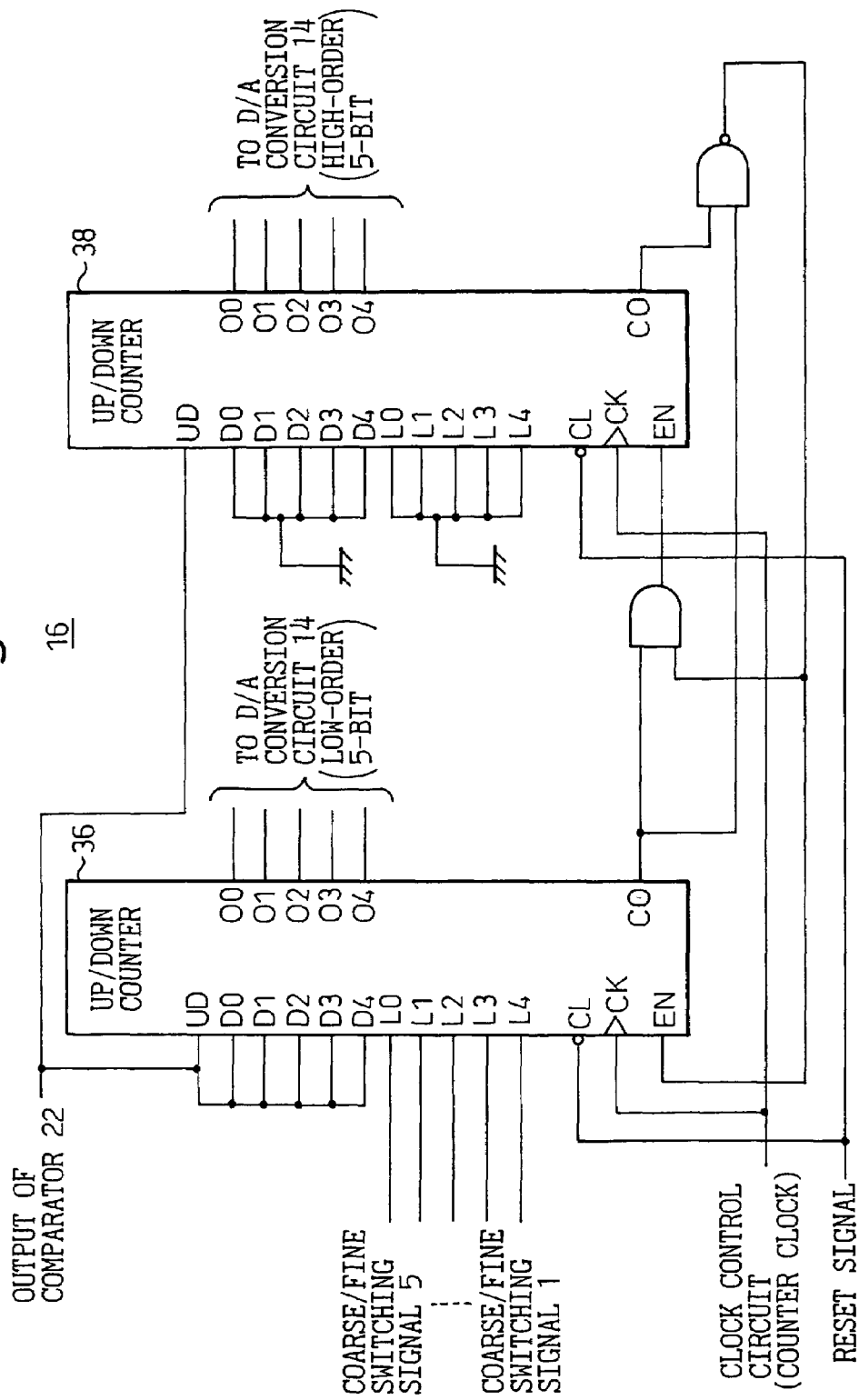
FIG. 23 is a circuit diagram showing one example of the counter 16 used in the fourth embodiment.
Figure 24:
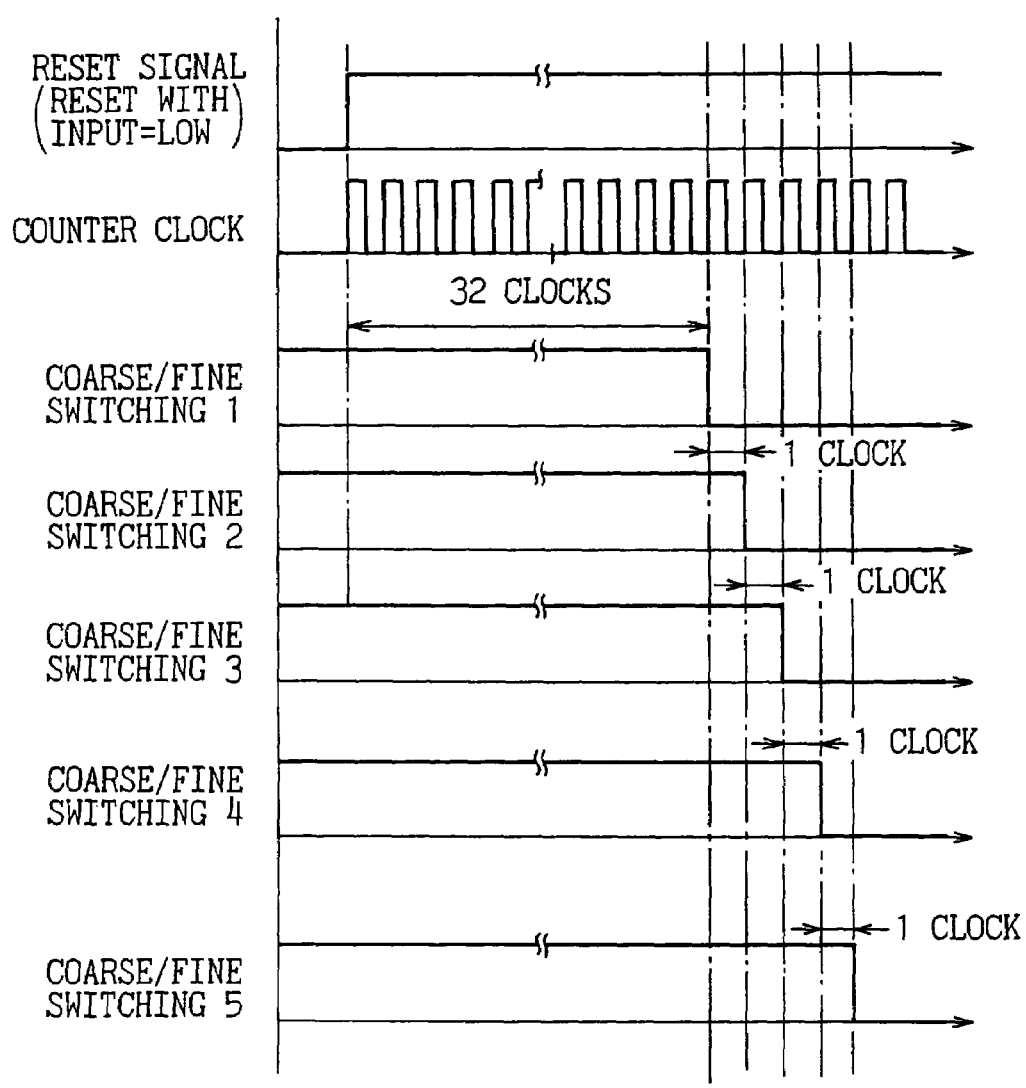
FIG. 24 is a timing chart showing the operation of the fourth embodiment.

FIG. 23 shows a circuit diagram of the light output control counter 16 used in the above configuration. The difference from the counter of the second embodiment shown in FIG. 6 lies in the connections associated with the coarse/fine switching signals. That is, the five coarse/fine switching signals are coupled one for one to their associated bits at the LOAD control inputs L0 to L4 of the low-order counter. By applying the waveforms of FIG. 24 as the coarse/fine switching signals, the sixth and higher bits of the counter can be counted up or down 32 times in the coarse mode, and then the fifth to the least significant bits can be successively determined using the bisection method, as described above.

Figure 25:
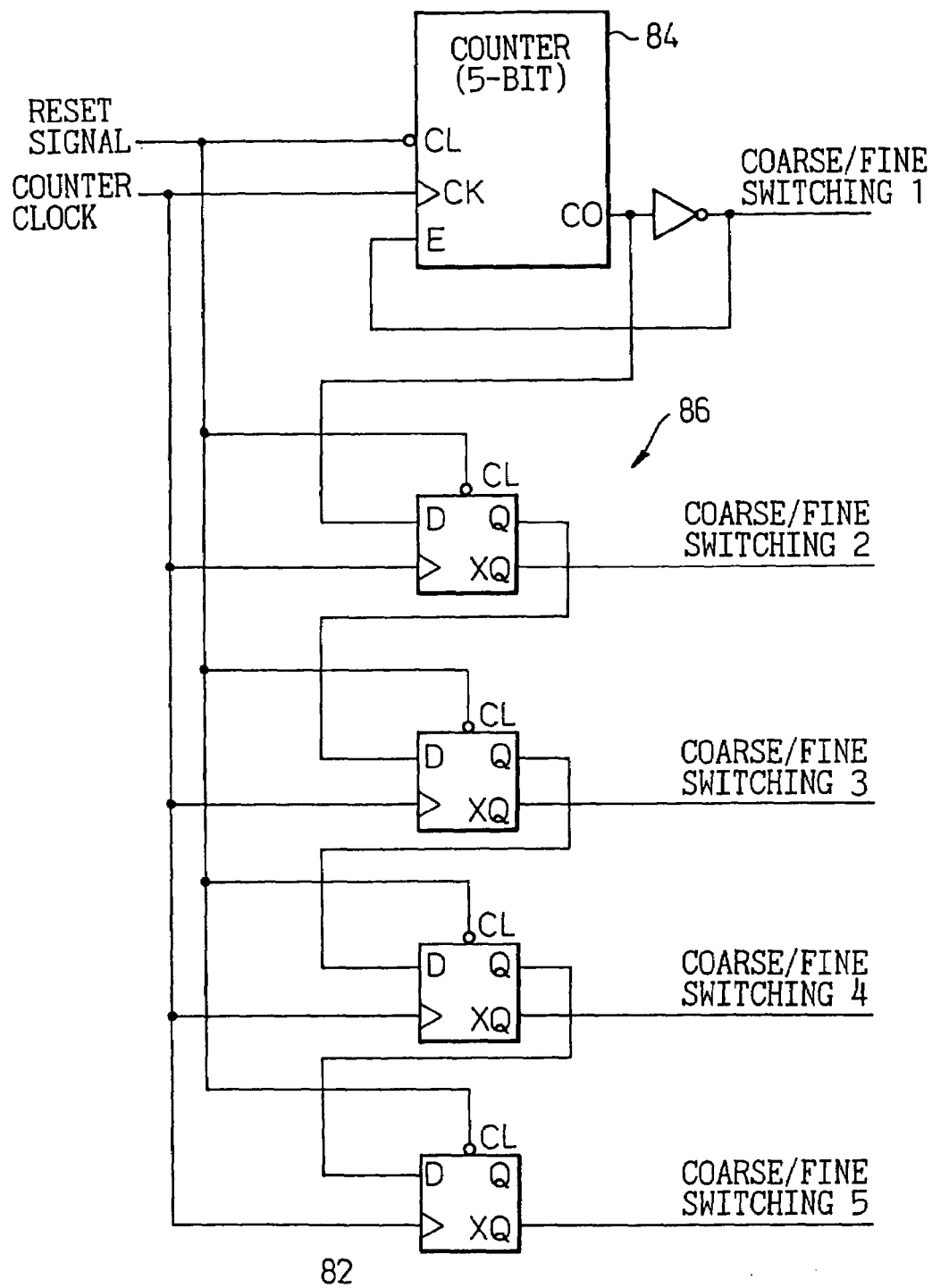
FIG. 25 is a circuit diagram of a coarse/fine switching circuit 82.

FIG. 25 shows a circuit diagram of the coarse/fine switching circuit for generating the coarse/fine switching signals. This circuit, unlike the circuit shown in FIG. 18, comprises a 5-bit counter 84 for counting up to 32 and four 1-bit counters 80 each for counting 1.

In the above fourth embodiment, during initial power-up, the counter is caused to count up or down the sixth and higher bits to obtain an interval containing the solution, and after that, the bisection method is applied; alternatively, the bisection method may be applied from the beginning, starting with the counting up or down of the highest-order 10th digit (or higher) at initial power on. In this case, with a 10-digit or 10-bit binary counter, if the value is updated for each digit starting from the highest-order digit, the target value can be reached with 10 updates.

In the above fourth embodiment, the coarse operation using the bisection method is accomplished by counting up or down once for each bit, but the number of counts for each bit need not necessarily be limited to 1. Though the illustrated example achieves the fastest speed, the number of counts for each bit may be increased for some other reason.

Figure 26:
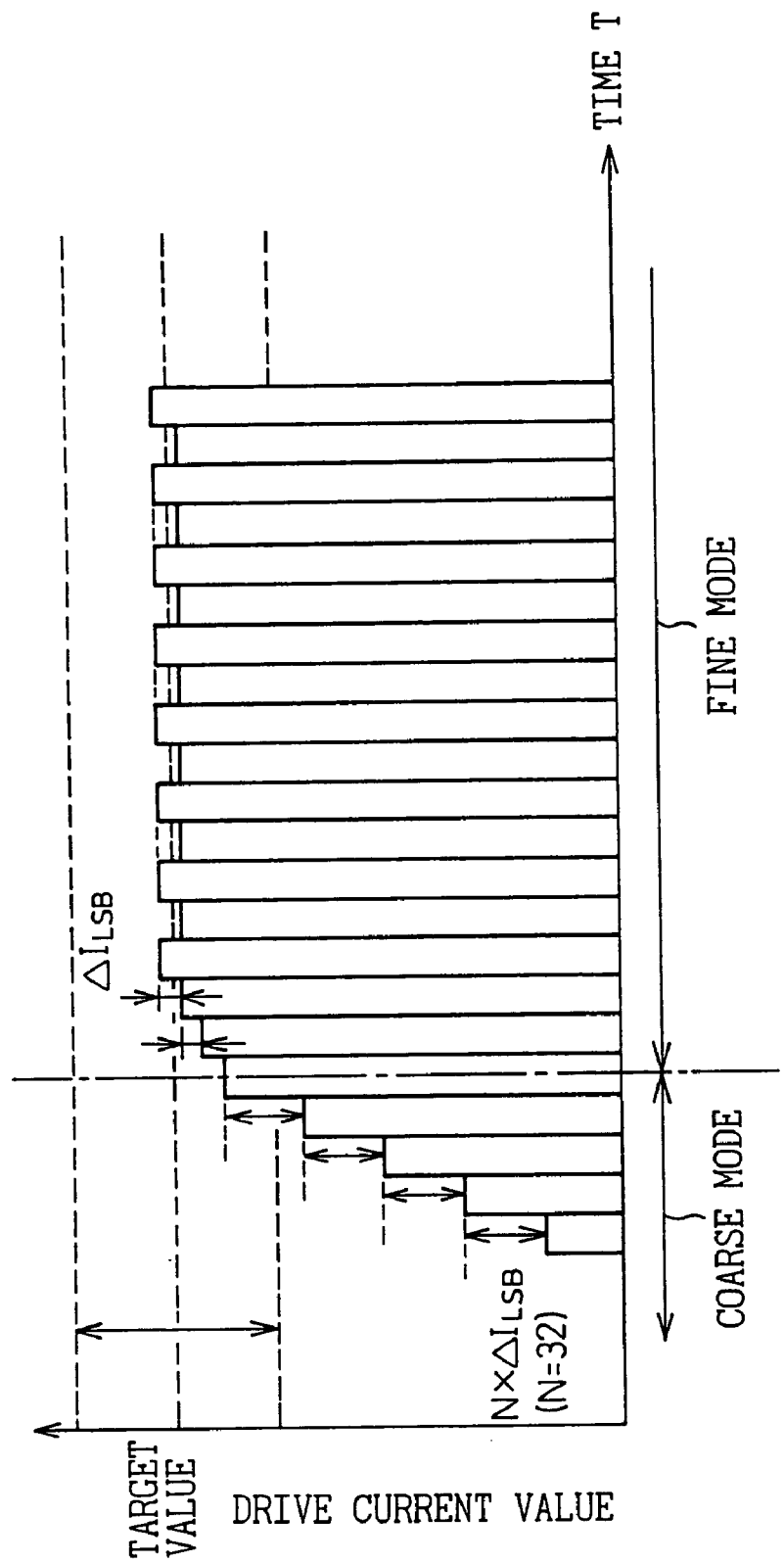
FIG. 26 is a diagram showing the operation of a fifth embodiment of the present invention.

FIG. 26 shows the operation of a fifth embodiment according to the present invention. In this embodiment, the coarse/fine switching is effected by detecting the light output nearing the target value. In the first to fourth embodiments described above, the timing of the coarse/fine switching has been determined so that the coarse mode operation is performed a predetermined number of times during initial power up; by contrast, in the present embodiment, the coarse/fine switching is performed by determining whether the light output is nearing stabilization. This determination is made by providing a window of a predetermined width near the target value and by detecting whether the monitor value has entered this window.

Figure 27:
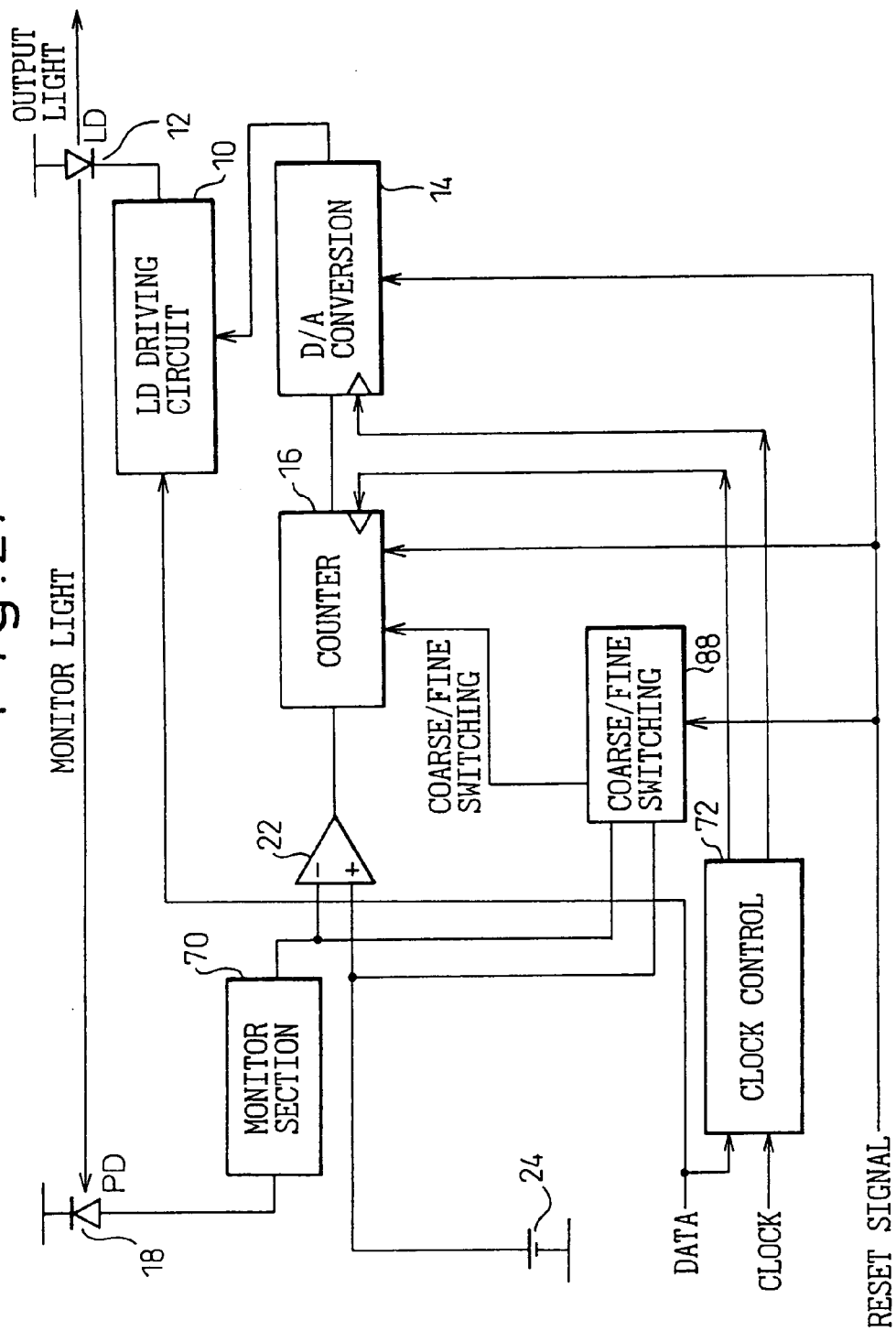
FIG. 27 is a block diagram of the fifth embodiment.

FIG. 27 shows a block diagram of this embodiment. The difference from the first to fourth embodiments is that the coarse/fine switching circuit 88 is supplied with the monitor value and reference value signals.

Figure 28:
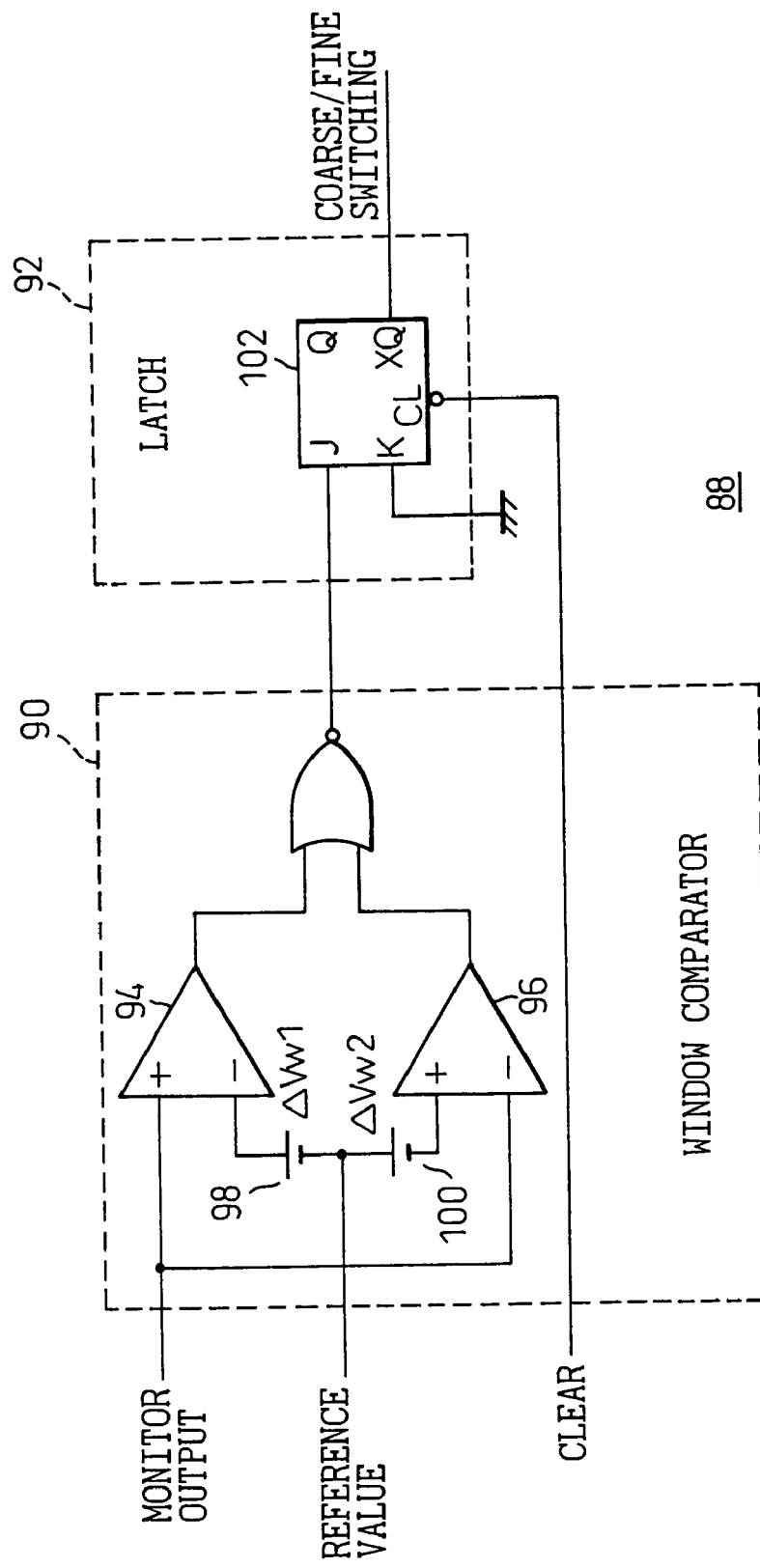
FIG. 28 is a circuit diagram of a coarse/fine switching circuit 88.

FIG. 28 shows the configuration of the coarse/fine switching circuit 88. The coarse/fine switching circuit 88 comprises a window comparator 90 and a latch 92. The window comparator 90 includes two comparators 94 and 96, each constructed from a differential amplifier circuit, that compare the monitor output with the respective reference values created by shifting the input reference value by voltages ΔVw1 and ΔVw2 supplied from level shift voltage sources 98 and 100. The comparison results are then NORed, and the result of the NORing is output as the window comparator output. That is, when the monitor value enters the window of the width ΔVw1+ΔVw2, the window comparator output goes high.

The latch 92 is provided to implement the coarse operation mode after resetting. A JK flip-flop 102 is used as the latch. At power up, the latch 92 is reset, and latch XQ=High is output as the output of the coarse/fine switching circuit, thereby sending a coarse operation mode signal. When the coarse mode power up proceeds to the point where the monitor value enters the window, latch J input goes high, causing the XQ output to go low and thus sending a fine operation mode signal.

Here, the window width must be made larger than the width of change of the monitor value per control action in the coarse operation mode. When the window width is smaller, if the monitor value goes up or down exceeding the range of the window in the coarse operation mode, the coarse operation mode might continue infinitely.

Figure 29:
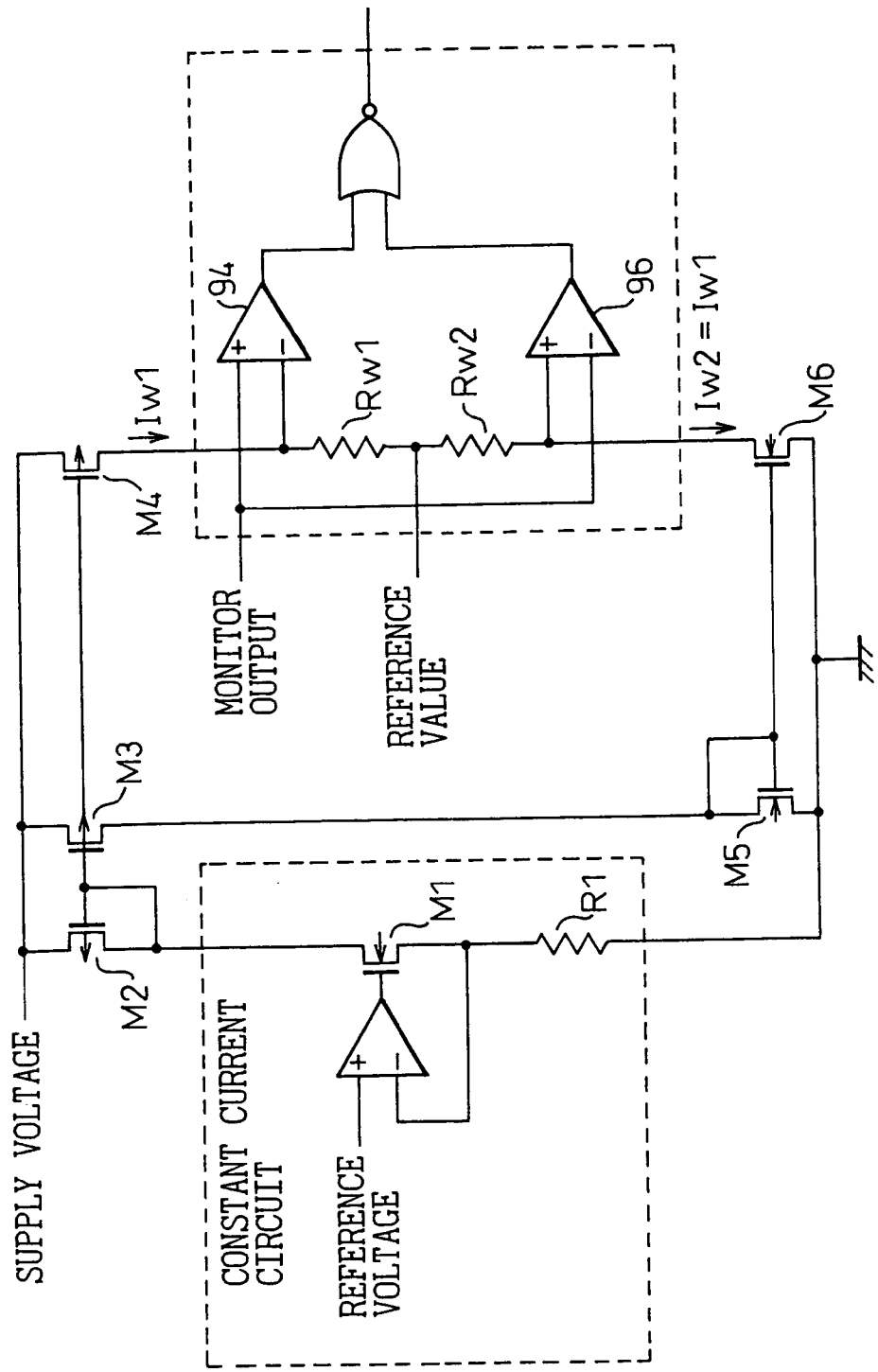
FIG. 29 is a circuit diagram showing one example of level shift voltage sources 98 and 100.

FIG. 29 shows a further detailed circuit diagram of the level shift voltage sources 98 and 100 in the window comparator. In the circuit shown, the level shift voltage sources are realized by passing currents Iw1=Iw2=50 μA through two resistors RW1 and RW2, respectively. Component values are, for example, RW1=RW2=1 kΩ and Iw1=Iw2=50 μA, and as a result, $\Delta Vw1=\Delta Vw2=50$ mV is obtained. The current Iw1 is produced by duplicating, through a current mirror consisting of p-channel MOS transistors M2 and M4, the output current of a constant current circuit comprising a reference voltage source (a conventional constant voltage circuit such as a Zener diode type or a BGR type), a resistor R1, an operational amplifier, and an n-channel MOS transistor M1. Likewise, the current Iw2 is produced by transferring the output current of the constant current circuit through a current mirror consisting of p-channel MOS transistors M2 and M3, and by duplicating it through a current mirror consisting of n-channel MOS transistors M5 and M6.

Figure 30:
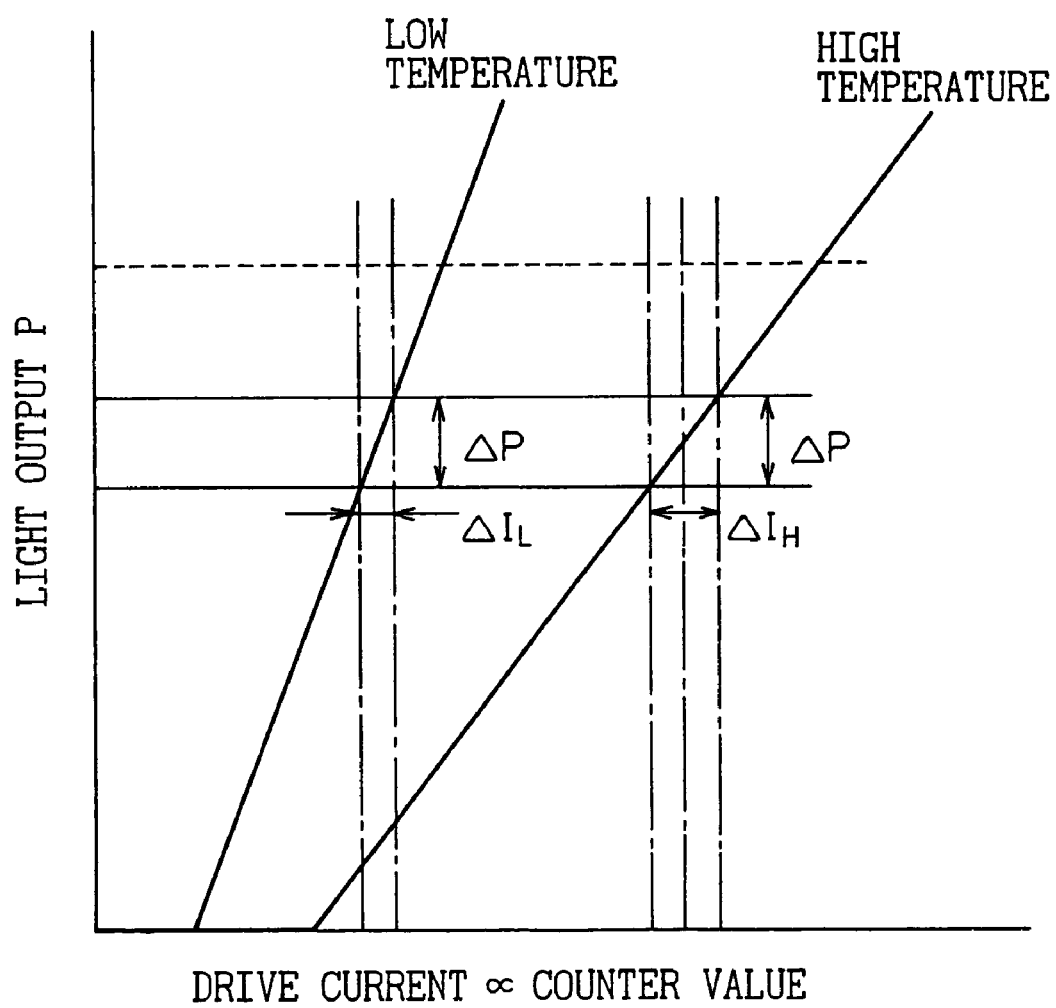
FIG. 30 is a graph showing the current versus light output characteristics of a laser diode.

As a modification of the fifth embodiment, if the window width of the window comparator is made temperature dependent, the rise time can be further shortened. The principle behind this idea will be explained with reference to FIG. 30. FIG. 30 shows the current versus light output characteristics of a laser diode. Lasing occurs when the drive current exceeds the threshold, but the differential efficiency=$\Delta L/\Delta I$ has a pronounced temperature dependence and decreases with increasing temperature. Accordingly, in digital control of the drive current, the rate of change of light amount with respect to the digital value change of 1 decreases as the temperature increases. As a result, if the window width is fixed, the number of updates required until stabilization is achieved after entering the fine operation mode will increase at high temperatures. To address this problem, at high temperatures the window width is reduced in proportion to the temperature dependence of the light amount step size (proportional to the laser's differential efficiency), thereby eliminating the temperature dependence of the number of updates required until stabilization is achieved after entering the fine operation mode. This serves to shorten the rise time over a wide temperature range.

In a specific method for achieving this, the fixed resistor R1 in the constant current generating circuit of FIG. 29 is replaced by a positive temperature coefficient resistor (also called a positive temperature coefficient thermistor) having temperature dependence, or a resistor constructed by combining such a resistor with a fixed resistor, so that the voltage of the voltage source that determines the window width can be reduced with increasing temperature.

In the above description of the window comparator, the level shift voltages are shown as being set $\Delta Vw1=\Delta Vw2$, but these voltages need not necessarily be set identical. Similarly, RW1 and RW2 need not necessarily be made equal to each other.

Figure 31:
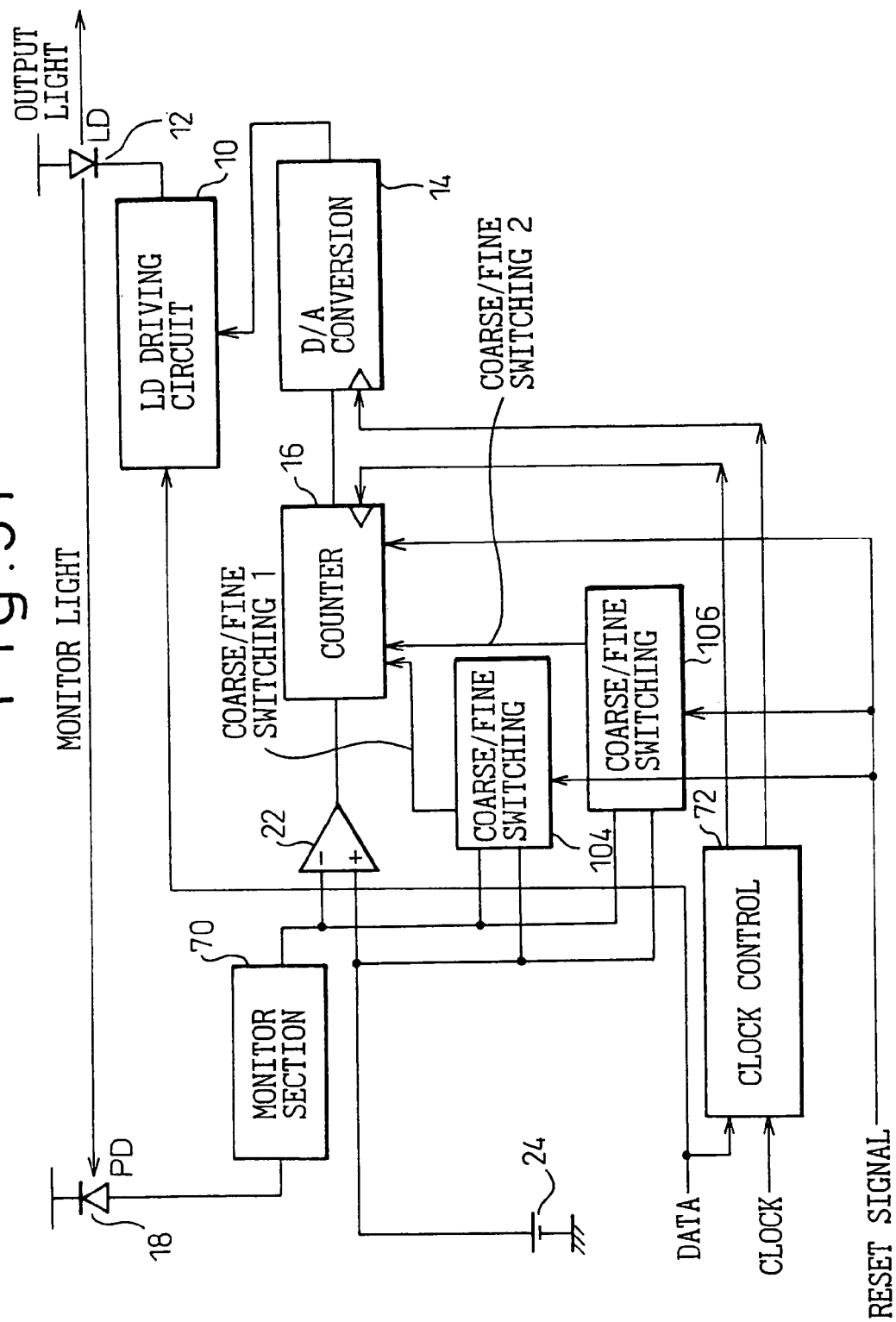
FIG. 31 is a block diagram of a sixth embodiment of the present invention.

FIG. 31 shows a sixth embodiment. This embodiment is identical to the fifth embodiment, except that the coarse operation mode is divided into two stages. Two coarse/fine switching circuits are therefore provided. The counter 16 is the same as that used in the third embodiment shown in FIG. 17. The coarse/fine switching circuit 104, in which the window of the window comparator is the larger, outputs a coarse/fine switching signal 1, and the coarse/fine switching circuit 106, in which the window of the window comparator is the smaller, outputs a coarse/fine switching signal 2.

With the above configuration, the sixth embodiment improves rise time by switching the operation of the up/down counter between the coarse and fine modes using the plurality of window comparators during initial power up.

Figure 32:
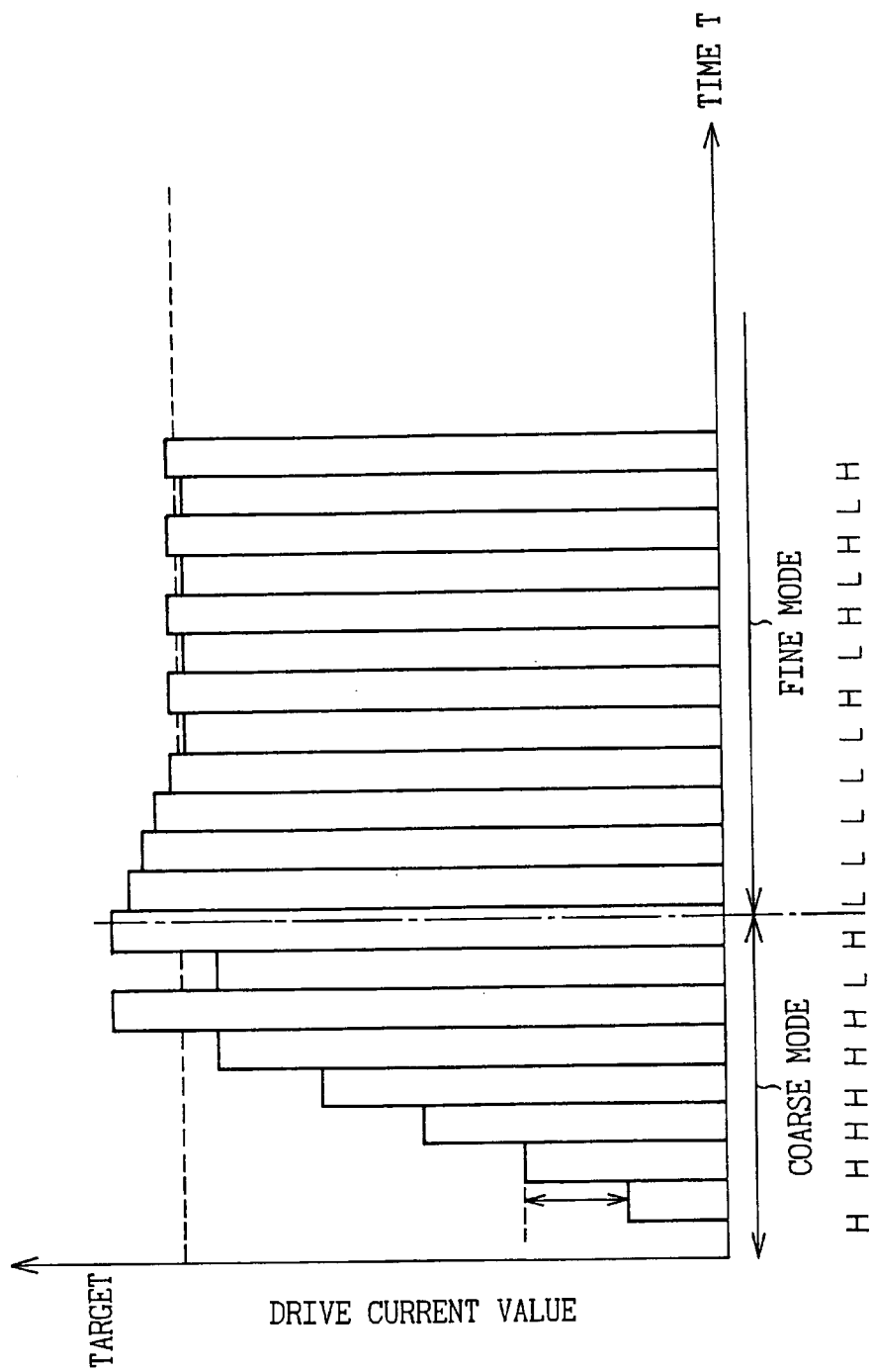
FIG. 32 is a diagram showing the operation of a seventh embodiment of the present invention.

FIG. 32 shows the operation of a seventh embodiment. This embodiment uses an update history of the light output control counter to detect whether the light output is nearing the target value. More specifically, in the light output control circuit using the comparator and the light output control up/down counter, the comparator output applied to update the up/down counter is such that when there is a disparity between the light output and the target value, only an UP control or DOWN control is repeated, and once the light output is stabilized, UP control and DOWN control are repeated alternately. Accordingly, by keeping UP/DOWN history records, and checking whether UP control and DOWN control are mixed, it can be determined whether the light output has stabilized or not in the coarse operation mode.

Figure 33:
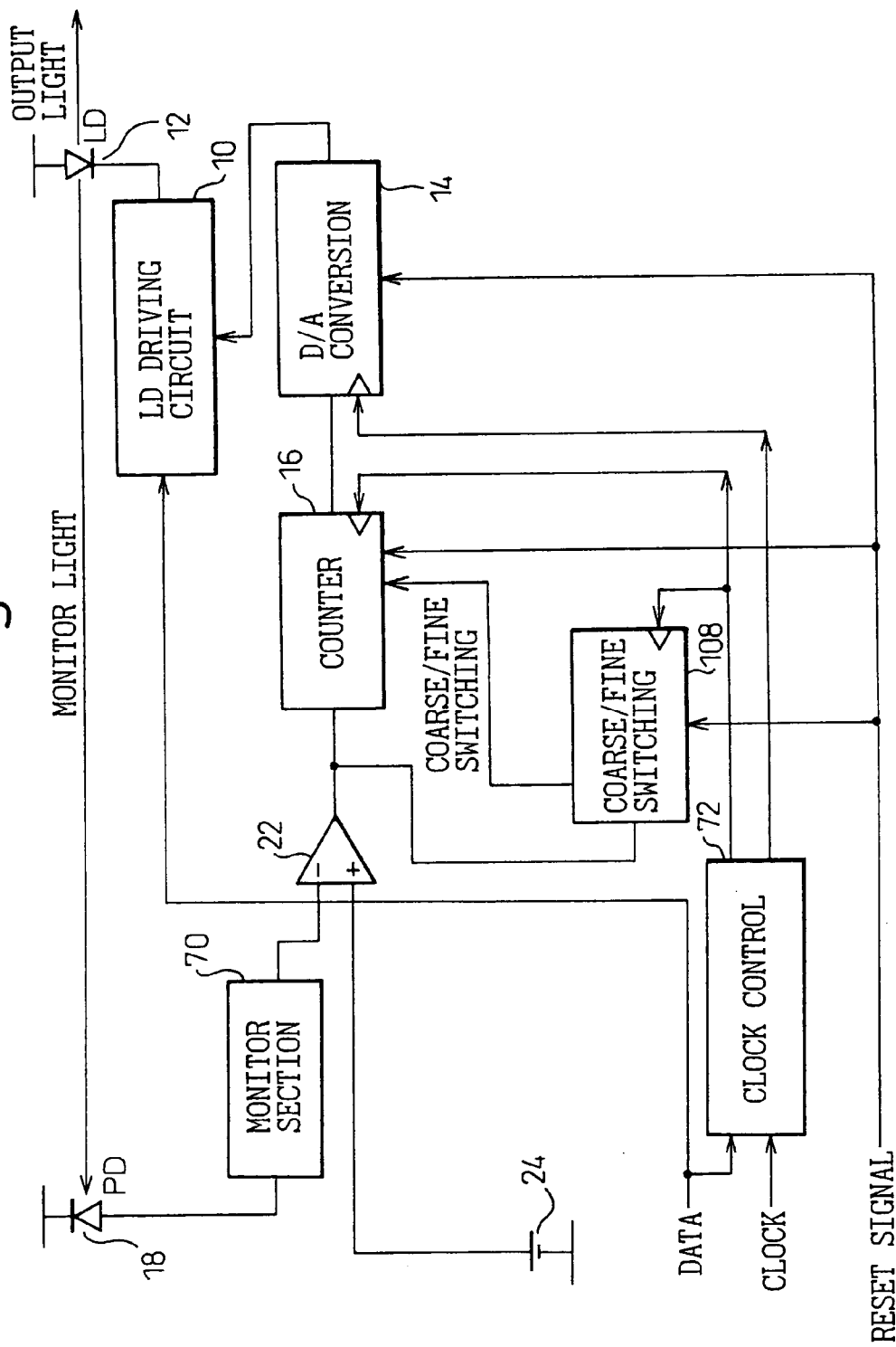
FIG. 33 is a block diagram of the seventh embodiment.

FIG. 33 shows the configuration of the seventh embodiment. The difference from the other embodiments is that the output of the comparator is also connected to the coarse/fine switching circuit 108.

Figure 34:
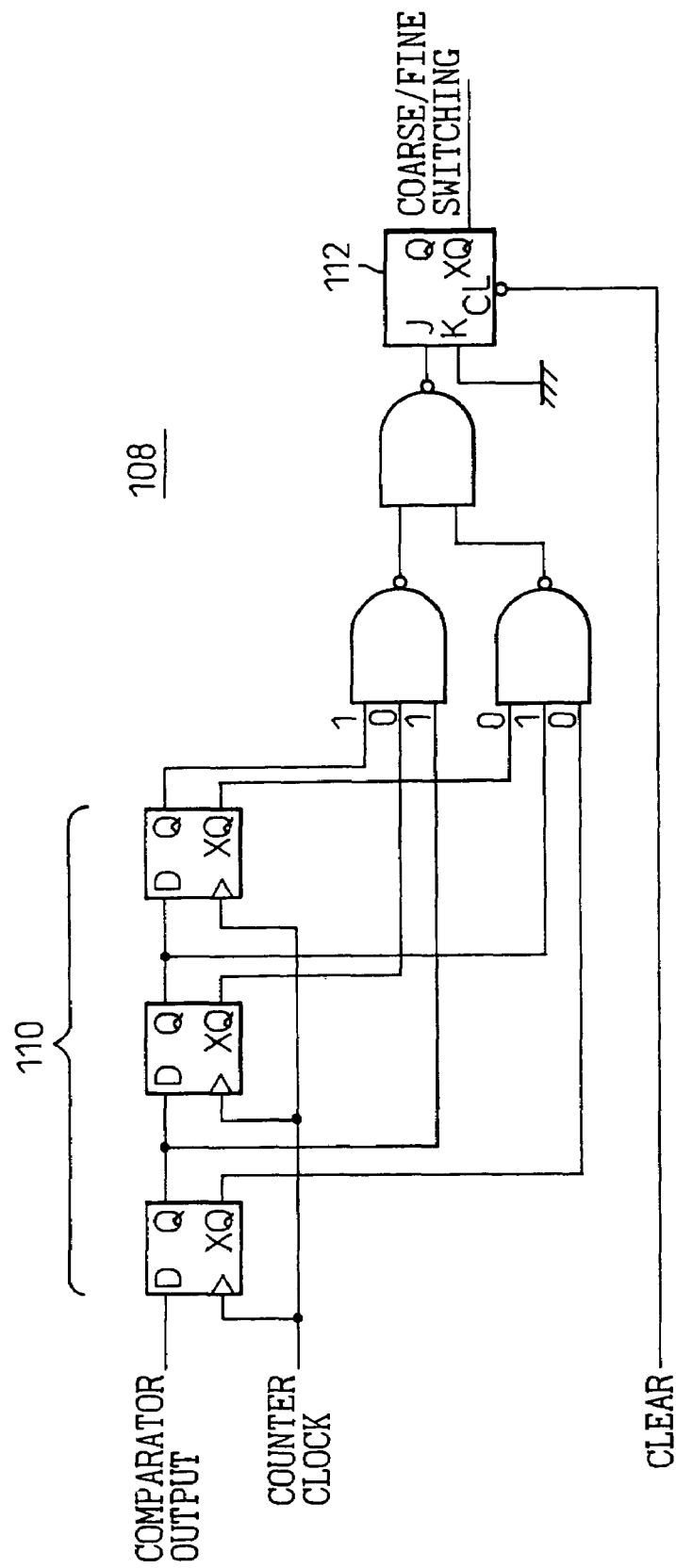
FIG. 34 is a circuit diagram showing one example of a coarse/fine switching circuit 108.

One specific example of the coarse/fine switching circuit 108 is shown in FIG. 34. This circuit stores the output history of the comparator in a shift register 110, and generates a signal based on the logic state of each digit. When the digits of the register differ from each other, i.e., the state "101" or "010", this state is detected using NAND circuits, and an XQ output of a latch 112 is set low. With this configuration, the coarse/fine switching signal can be generated by detecting, based on the comparator output history, that the light output has reached the target value in the coarse operation mode.

Figure 35:
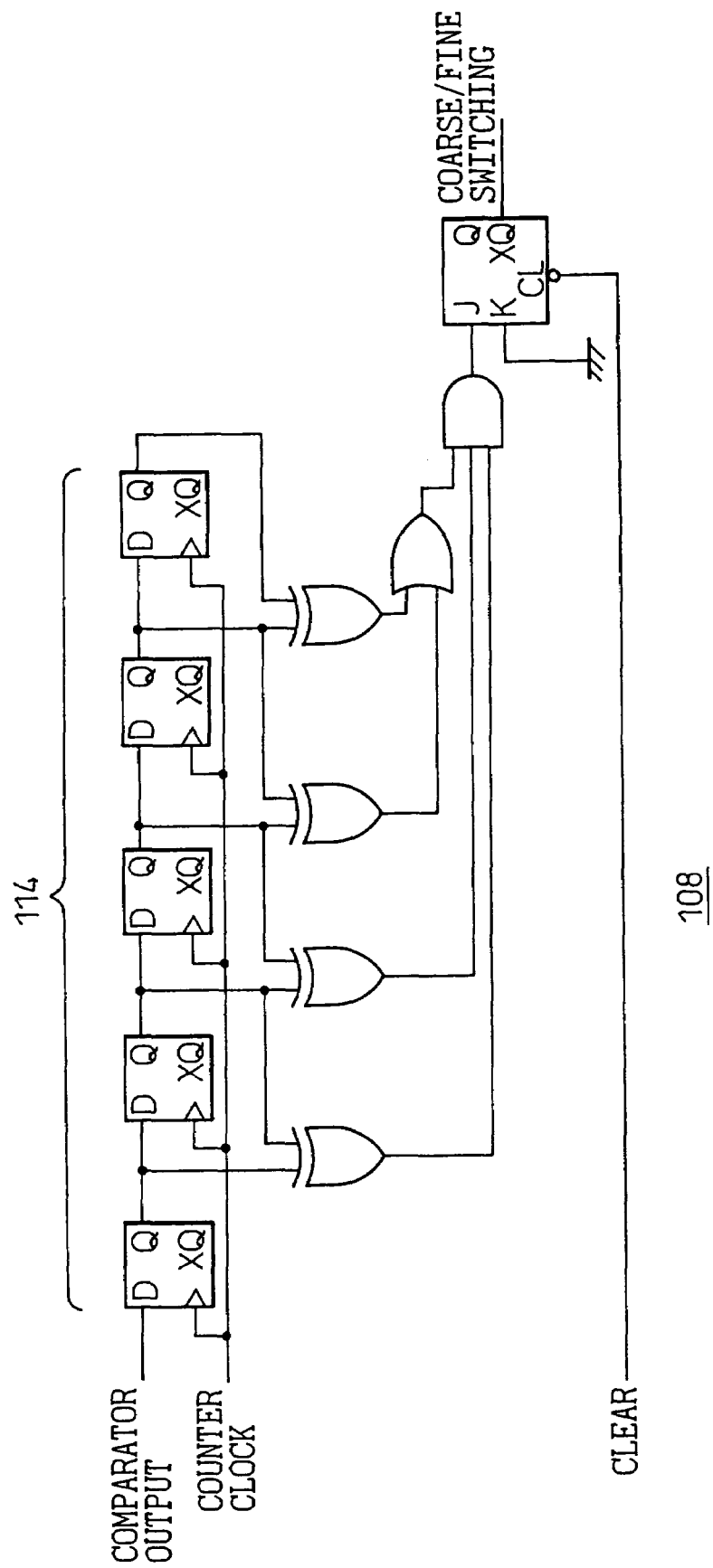
FIG. 35 is a circuit diagram showing another example of the coarse/fine switching circuit 108.

Another example of the coarse/fine switching circuit 108 is shown in FIG. 35. This circuit stores the output history of the comparator in a 5-bit shift register 114, and generates a signal based on the logic state of each digit. Whether the digits of the register differ from each other is detected using exclusive-OR (EXOR) circuits. The conditions for determining that the target value is reached are expanded to include not only "010" and "010", but also "10010", "011010". "11010", "10101", "01010", and "00101".

Figure 36:
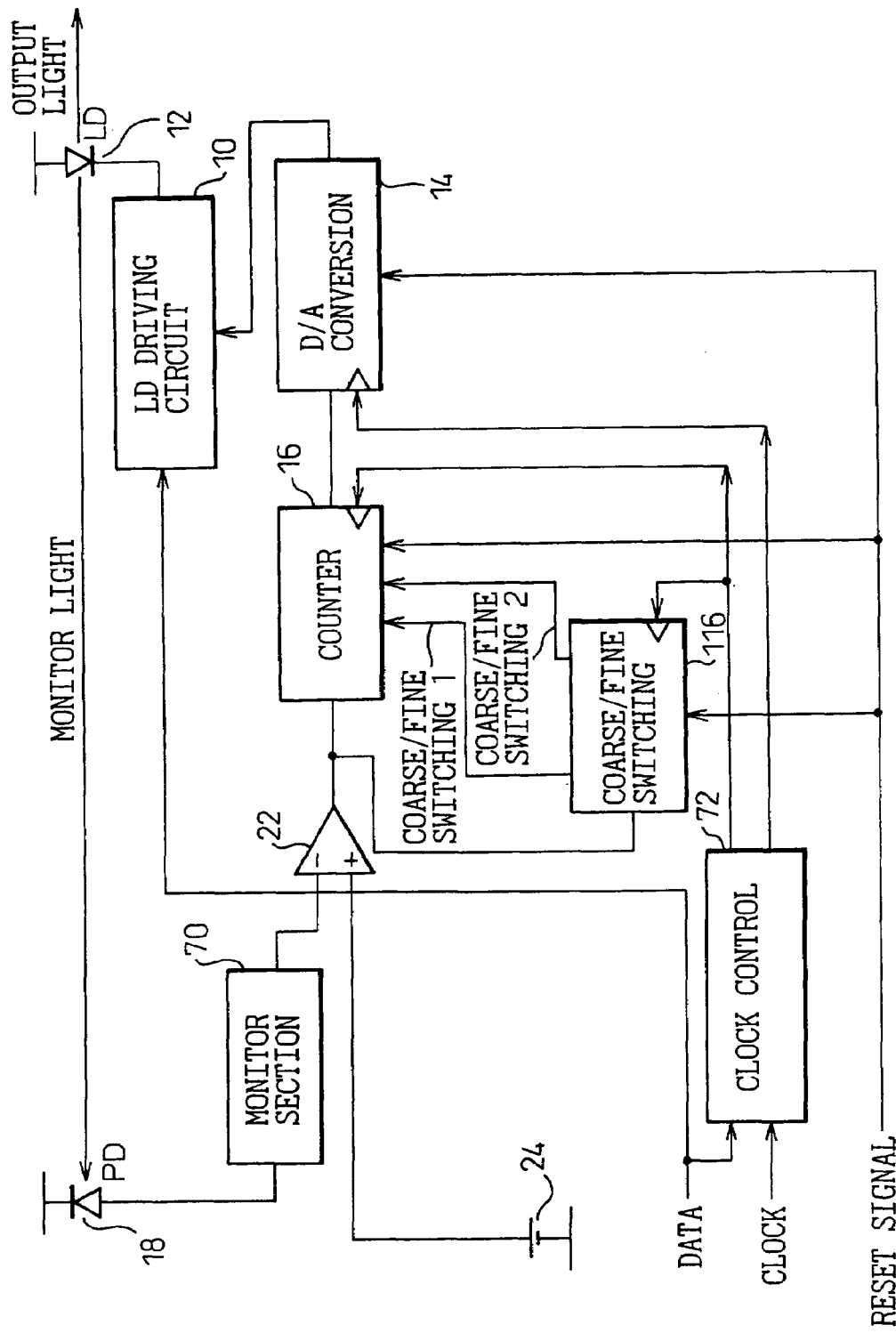
FIG. 36 is a block diagram of an eighth embodiment of the present invention.
Figure 37:
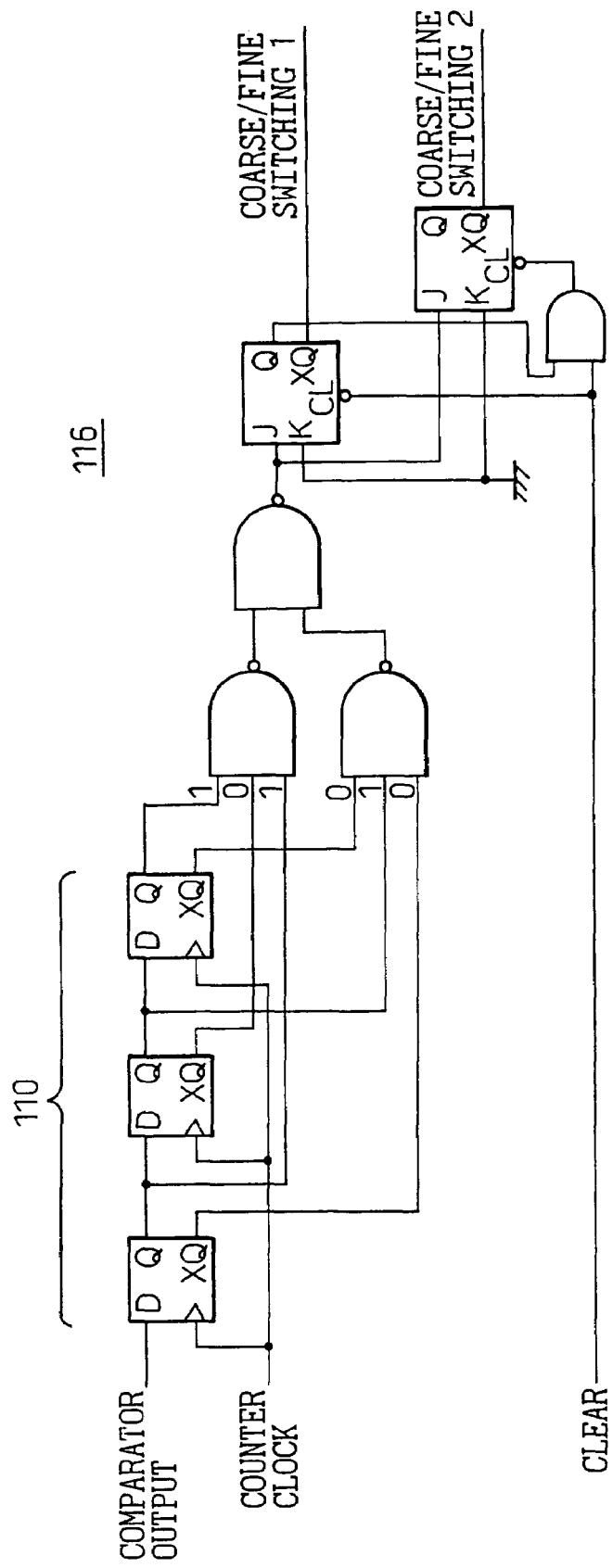
FIG. 37 is a circuit diagram showing one example of a coarse/fine switching circuit 116.

FIG. 36 shows an eighth embodiment of the present invention. This embodiment differs from the seventh embodiment (FIGS. 32 and 33) by the provision of two coarse operation modes. In the circuit diagram, two coarse/fine switching signals are shown. A specific example of the coarse/fine switching circuit 116 is shown in FIG. 37. This circuit differs from the circuit of the seventh embodiment shown in FIG. 34 in that two latches are provided to generate two coarse/fine switching signals to effect the two coarse operation modes.

Figure 38:
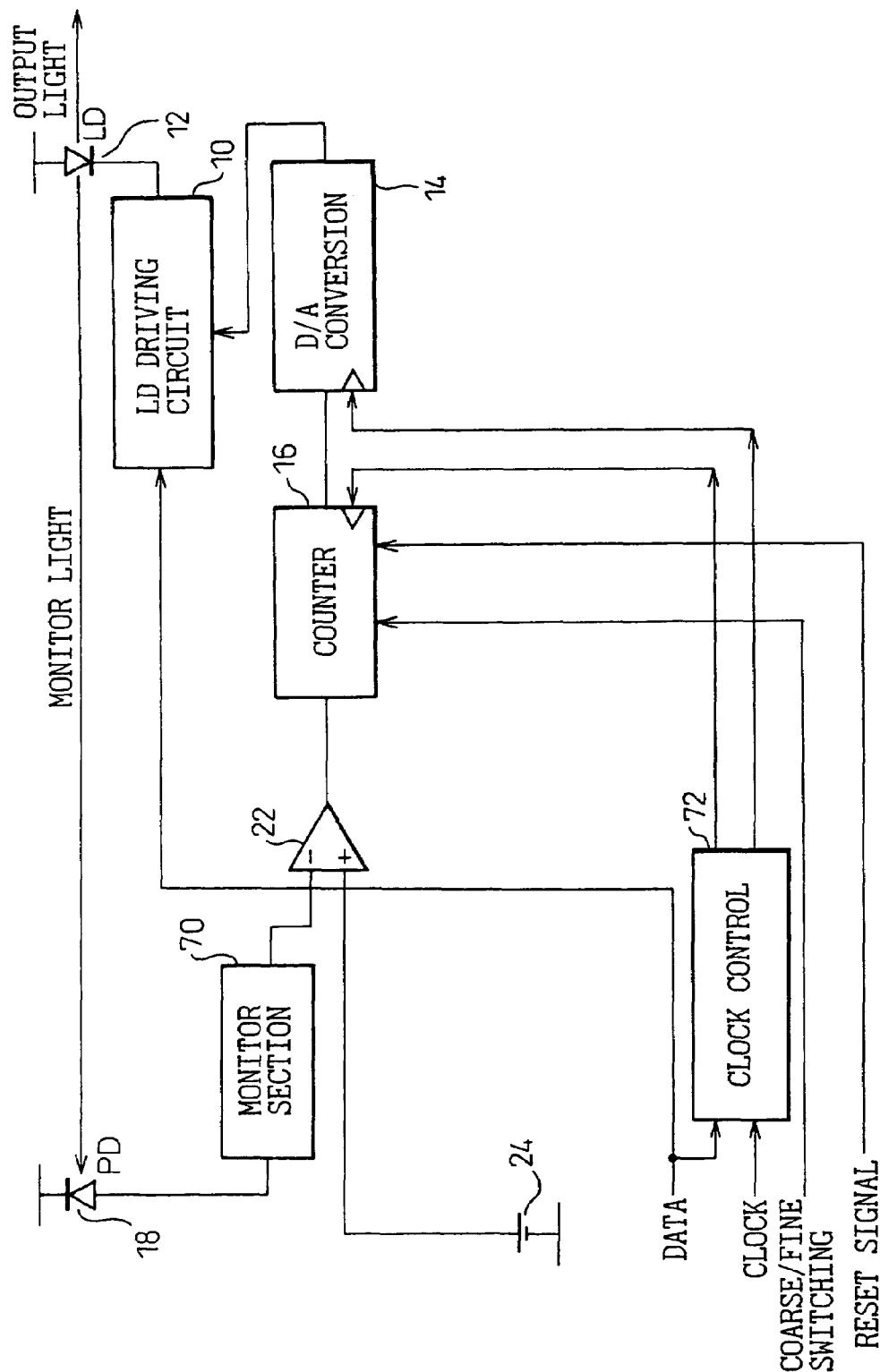
FIG. 38 is a block diagram of a ninth embodiment of the present invention.

FIG. 38 shows a ninth embodiment of the present invention. This embodiment includes a coarse/fine switching terminal so that the coarse/fine switching can be effected by the application of an external signal. In applications such as optical communication systems or the like, when the optical transmitter is constructed as a module, various control signals are supplied from the main unit; this embodiment is particularly useful in applications where the coarse/fine switching signal is supplied from the main unit.

A 10th embodiment is a combination of the second embodiment (counting method) and the fifth embodiment (window comparator). At power on, the sixth lowest bit of the counter 16 is caused to count up or down 32 times, and then the fourth lowest bit of the counter 16 is caused to count up or down until the monitor value is brought inside the level width of the window comparator, and finally the lowest bit is caused to count up or down.

Figure 39:
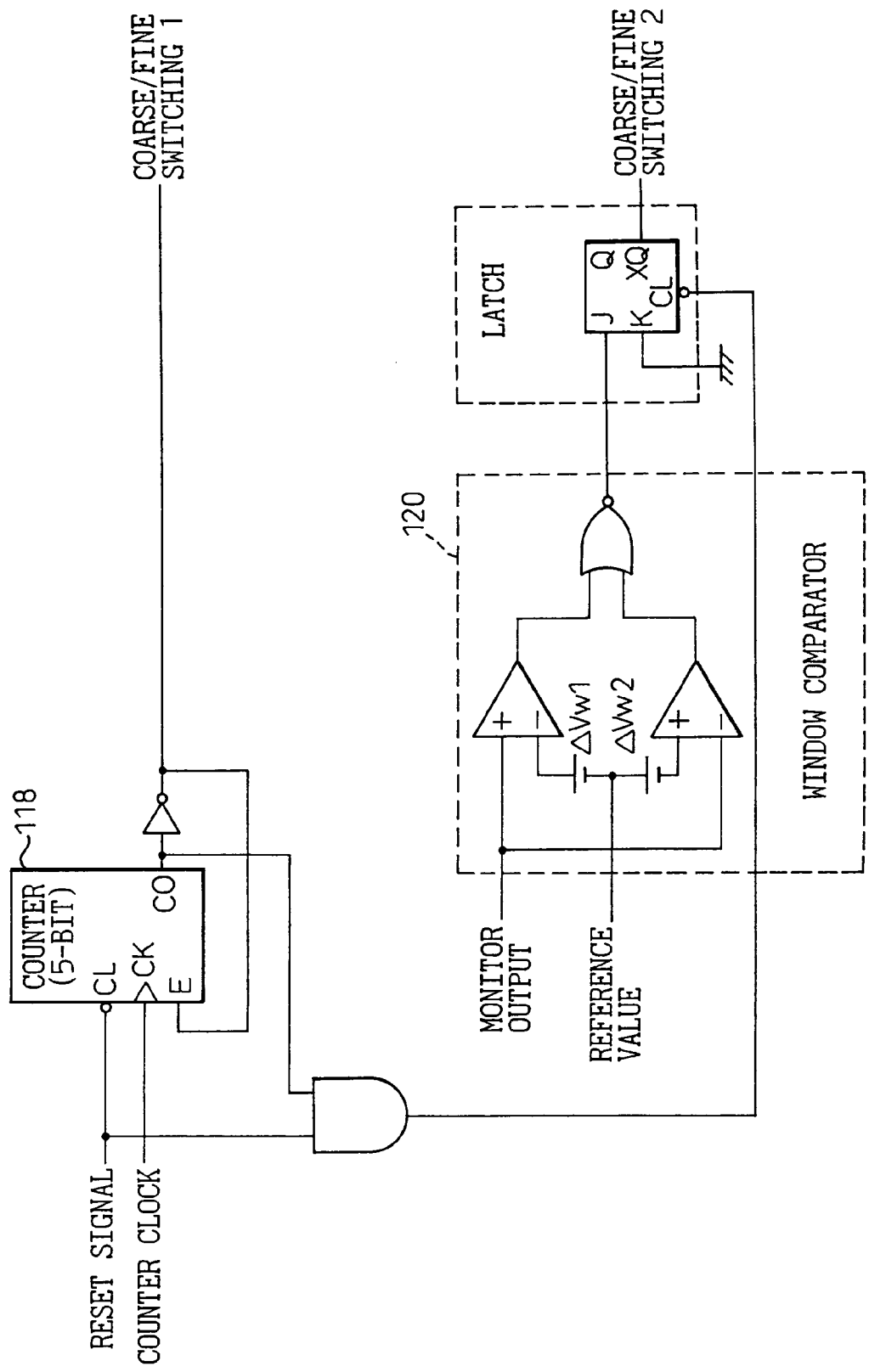
FIG. 39 is a circuit diagram showing one example of a coarse/fine switching circuit according to a 10th embodiment of the present invention.

The entire configuration is the same as that shown in FIG. 27, except that two coarse/fine switching signals are output. The configuration of the coarse/fine switching circuit is shown in FIG. 39. First, a counter 18 performs counting and outputs the coarse/fine switching signal 1. Next, a window comparator 120 performs coarse/fine control to accomplish the above-described operation.

Figure 40:
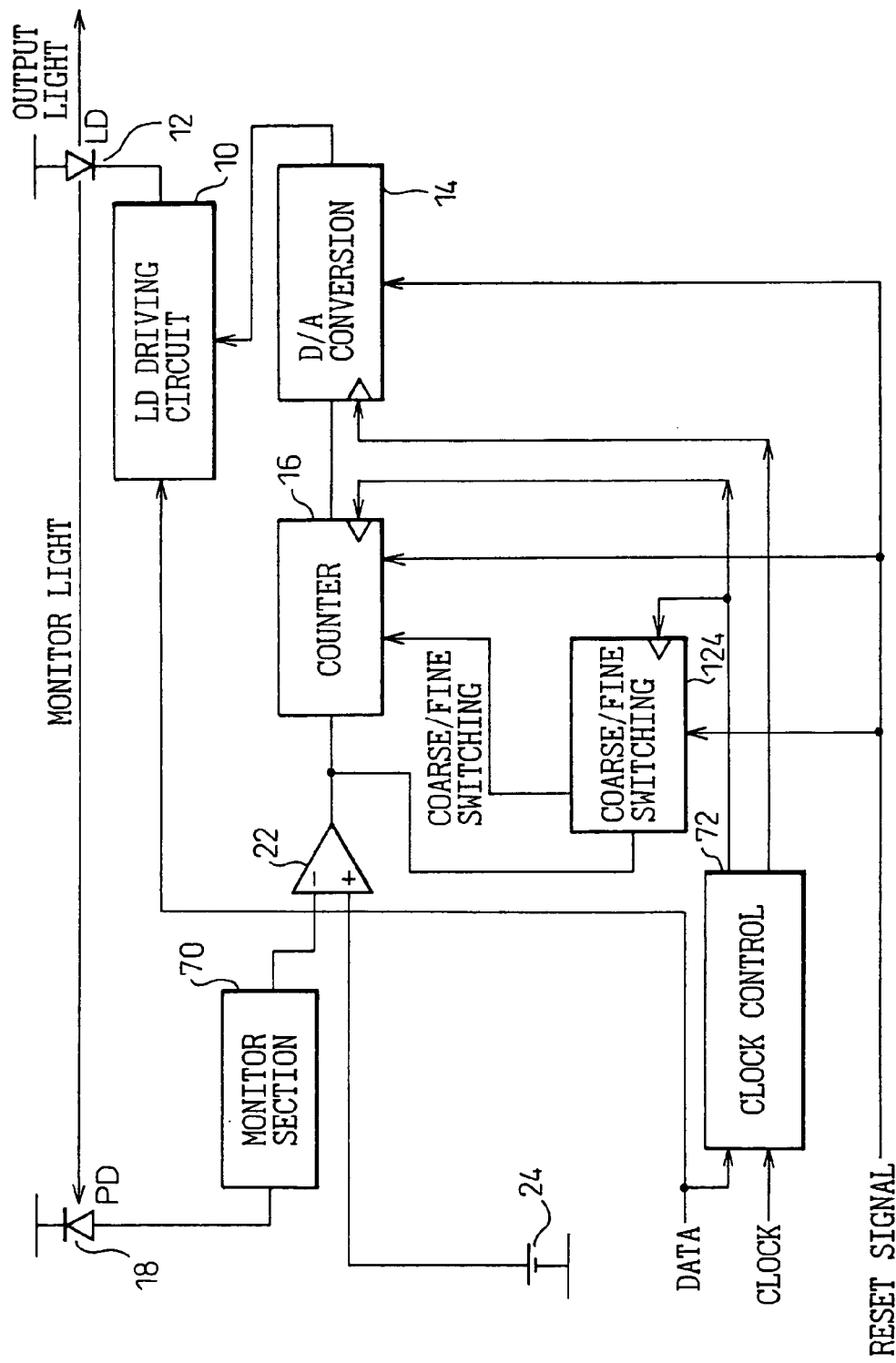
FIG. 40 is a block diagram of an 11th embodiment of the present invention.

FIG. 40 shows an 11th embodiment. This embodiment is a combination of the second embodiment (counting method) and the seventh embodiment (history recording, FIG. 33). At start up, the sixth lowest bit of the counter is caused to count up or down; then, the third lowest bit of the counter is caused to count up or down until the output history of the comparator circuit shows UP control and DOWN control in a mixed manner, and finally the lowest bit is caused to count up or down. The output of the comparator 22 as well as the clock necessary for counting is connected to the coarse/fine switching circuit 124.

Figure 41:
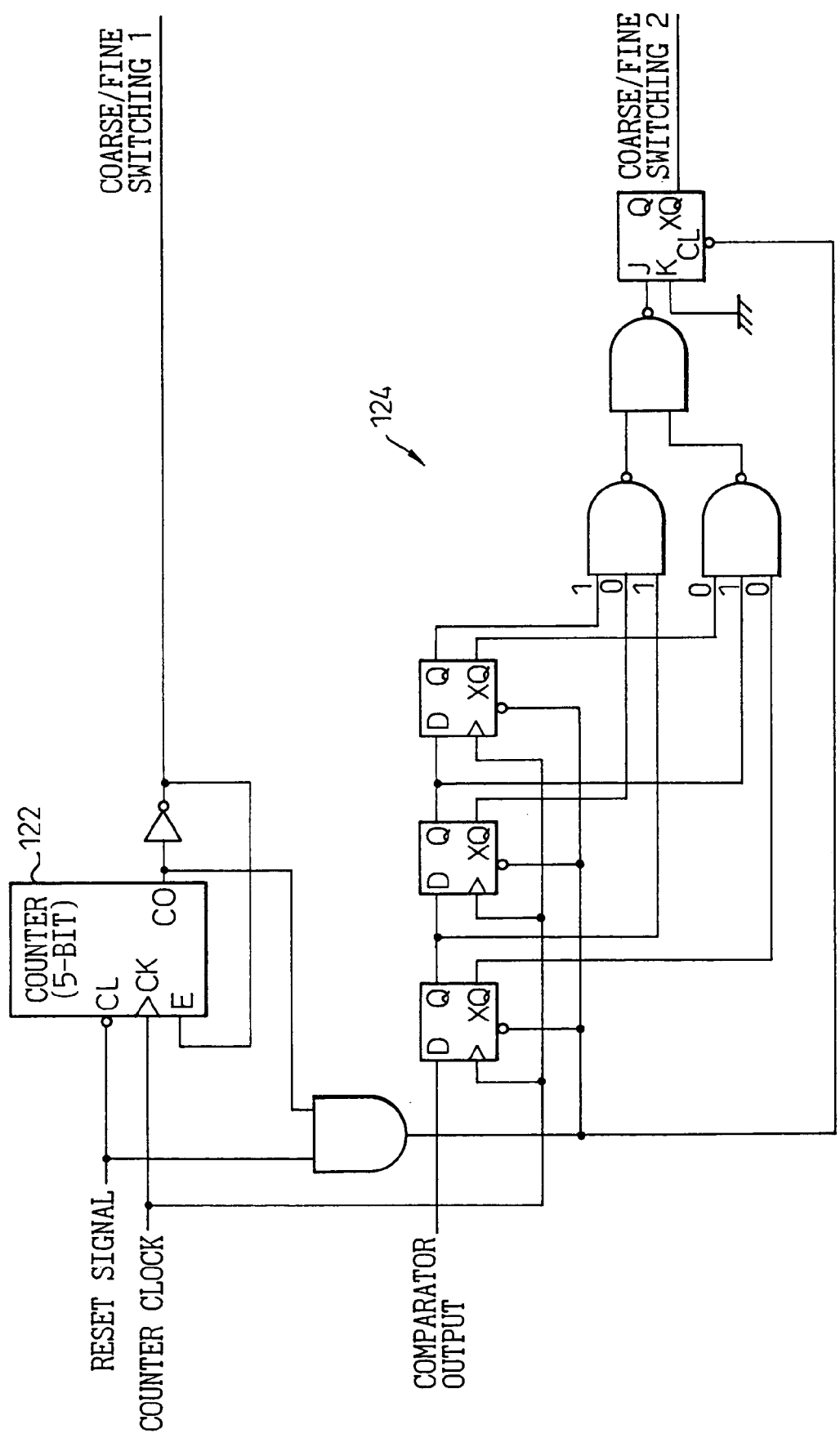
FIG. 41 is a circuit diagram showing one example of a coarse/fine switching circuit 124.

One example of the coarse/fine switching circuit 124 is shown in FIG. 41. First, a counter 122 (equivalent to the one shown in FIG. 7) performs counting and outputs the coarse/fine switching signal 1. Next, a circuit (equivalent to the one shown in FIG. 34) performs coarse/fine control based on the output history of the comparator to accomplish the above-described operation.

Figure 42:
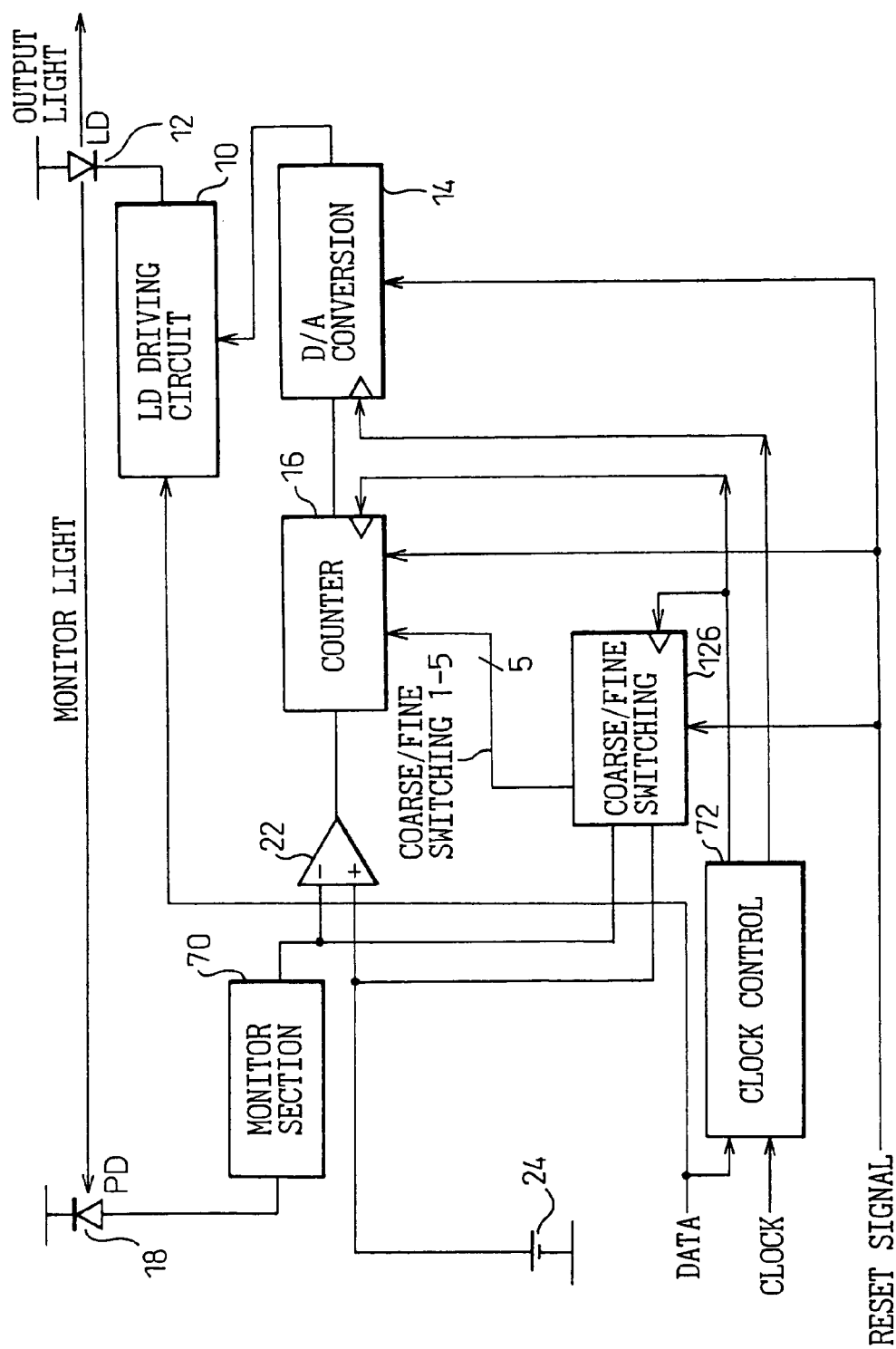
FIG. 42 is a block diagram of a 12th embodiment of the present invention.

FIG. 42 shows a 12th embodiment. This embodiment is a combination of the fifth embodiment (window comparator, FIG. 27) and the fourth embodiment (bisection method, FIG. 22). At power on, the sixth lowest bit of the counter is caused to count up or down until the monitor value is brought inside the level width of the window comparator, then the fifth bit of the counter is caused to count up or down once, followed by counting up or down the fourth bit once; the process is repeated to count up or down the value indicated by the bits higher than the least significant bit of the counter, and finally the least significant bit is counted up or down repeatedly to stabilize the light output.

Figure 43:
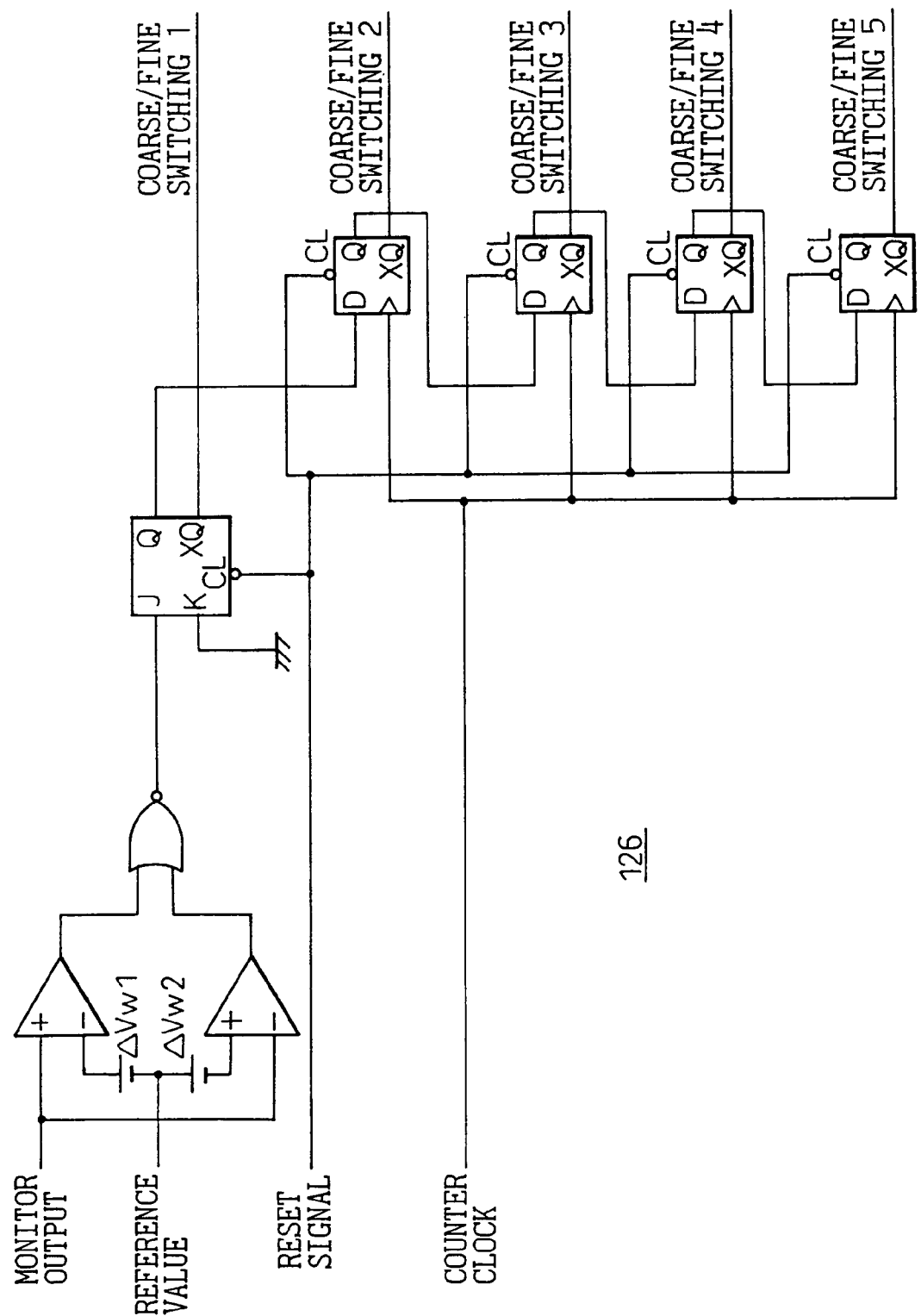
FIG. 43 is a circuit diagram showing one example of a coarse/fine switching circuit 126.

In operation, the signal from the monitor section 70 and the reference value 24 are supplied to the coarse/fine switching circuit 126, and the coarse/fine switching signal is output with five bits in parallel to implement the bisection method. One example of the coarse/fine switching circuit 126 is shown in FIG. 43. The circuit comprises the window comparator of the fifth embodiment (FIG. 28) and the bisection method control circuit (equivalent to the one shown in FIG. 25) of the fourth embodiment.

Figure 44:
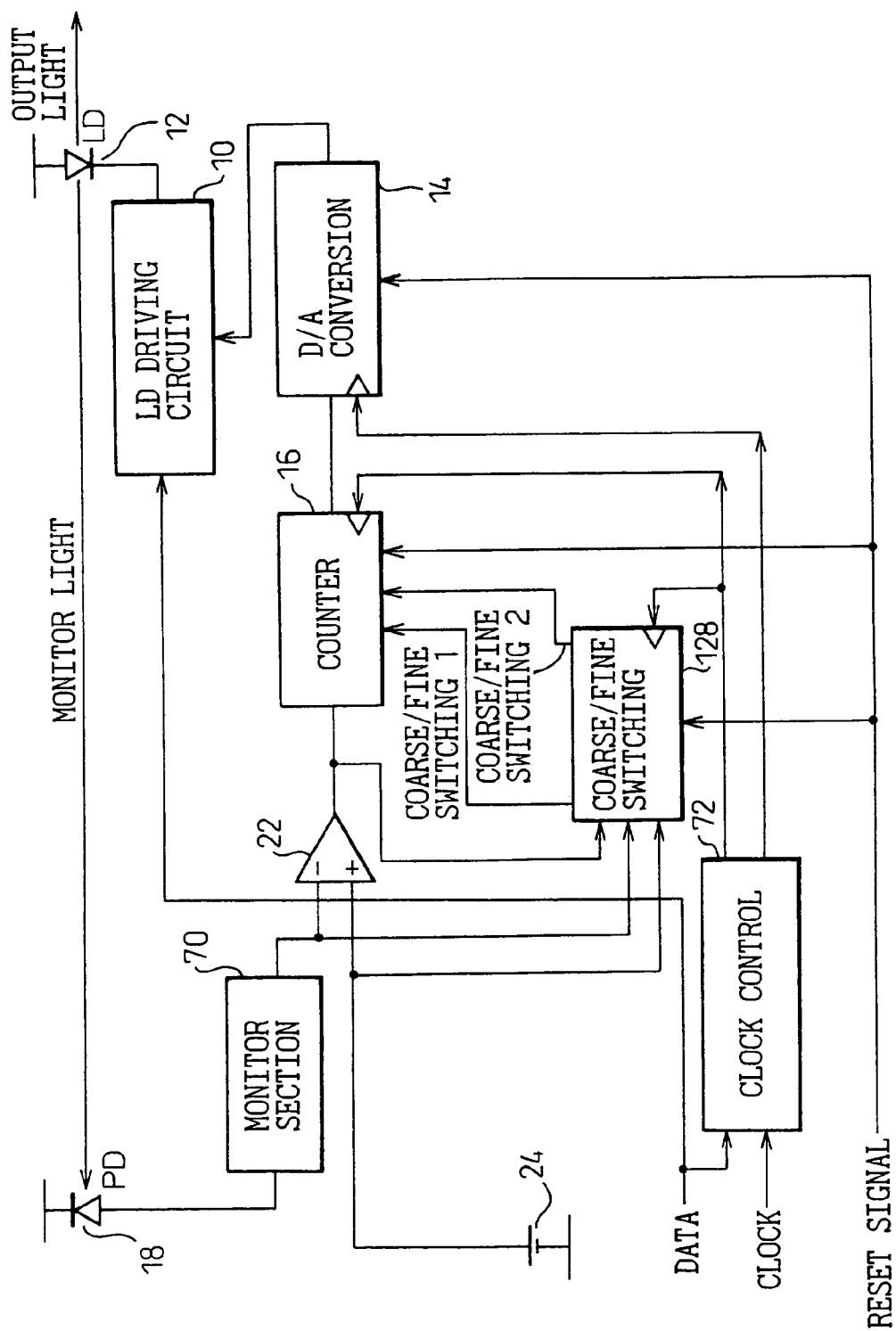
FIG. 44 is a block diagram of a 13th embodiment of the present invention.

FIG. 44 shows a 13th embodiment. This embodiment is a combination of the fifth embodiment (window comparator, FIG. 27) and the seventh embodiment (history recording, FIG. 33). The output of the comparator 22 and the monitor value and reference value to be supplied to the window comparator are coupled to the coarse/fine switching circuit 128.

At start up, the sixth lowest bit of the counter is caused to count up or down until the monitor value is brought inside the level width of the window comparator, and then the third lowest bit of the counter is caused to count up or down. After repeating the predetermined up/down pattern, the least significant bit is caused to count up or down repeatedly to stabilize the light output.

Figure 45:
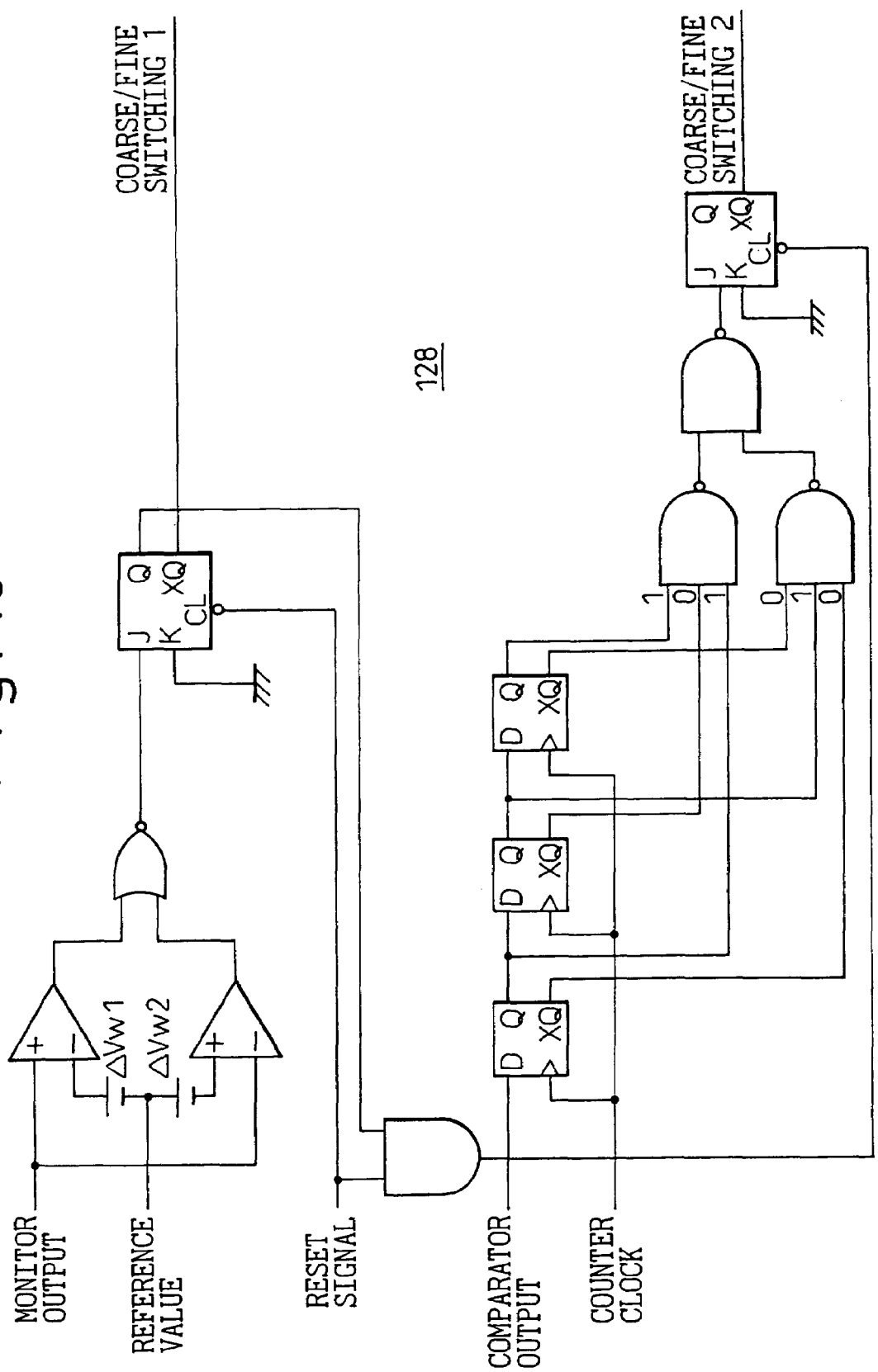
FIG. 45 is a circuit diagram showing one example of a coarse/fine switching circuit 128.

FIG. 45 shows the detailed configuration of the coarse/fine switching circuit 128. The circuit comprises the window comparator of the fifth embodiment (FIG. 28) and the history recording shift register of the seventh embodiment (FIG. 34).

Figure 46:
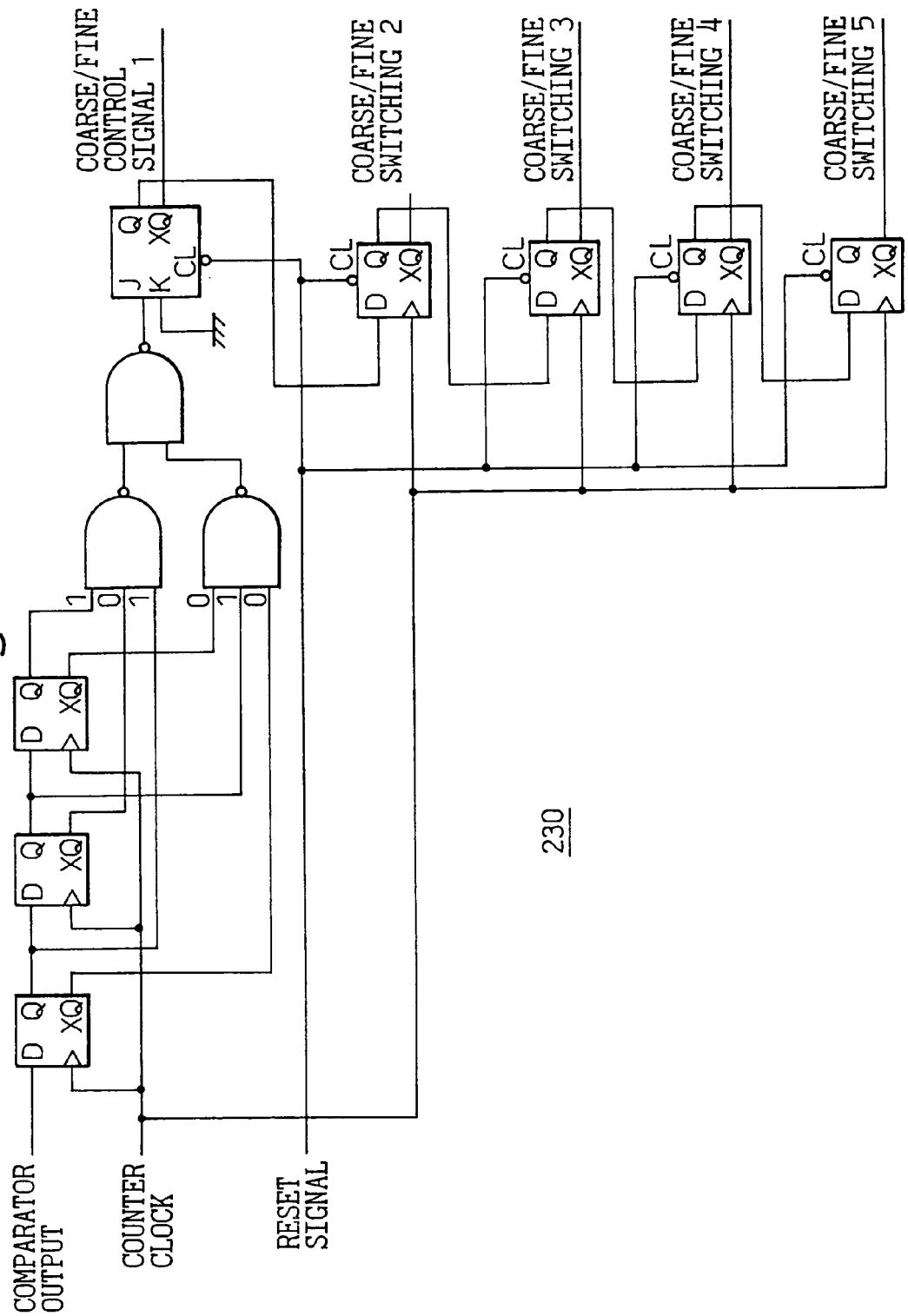
FIG. 46 is a circuit diagram showing one example of a coarse/fine switching circuit 230 according to a 14th embodiment of the present invention.

FIG. 46 shows a coarse/fine switching circuit 230 used in a 14th embodiment. This embodiment is a combination of the eighth embodiment (history recording, FIG. 37) and the fourth embodiment (bisection method, FIG. 25). The output of the comparator is connected to the coarse/fine switching circuit 230. The coarse/fine switching circuit 230 comprises the history recording shift register of the eighth embodiment (FIG. 34) and the bisection method coarse/fine control circuit (FIG. 25).

Figure 47:
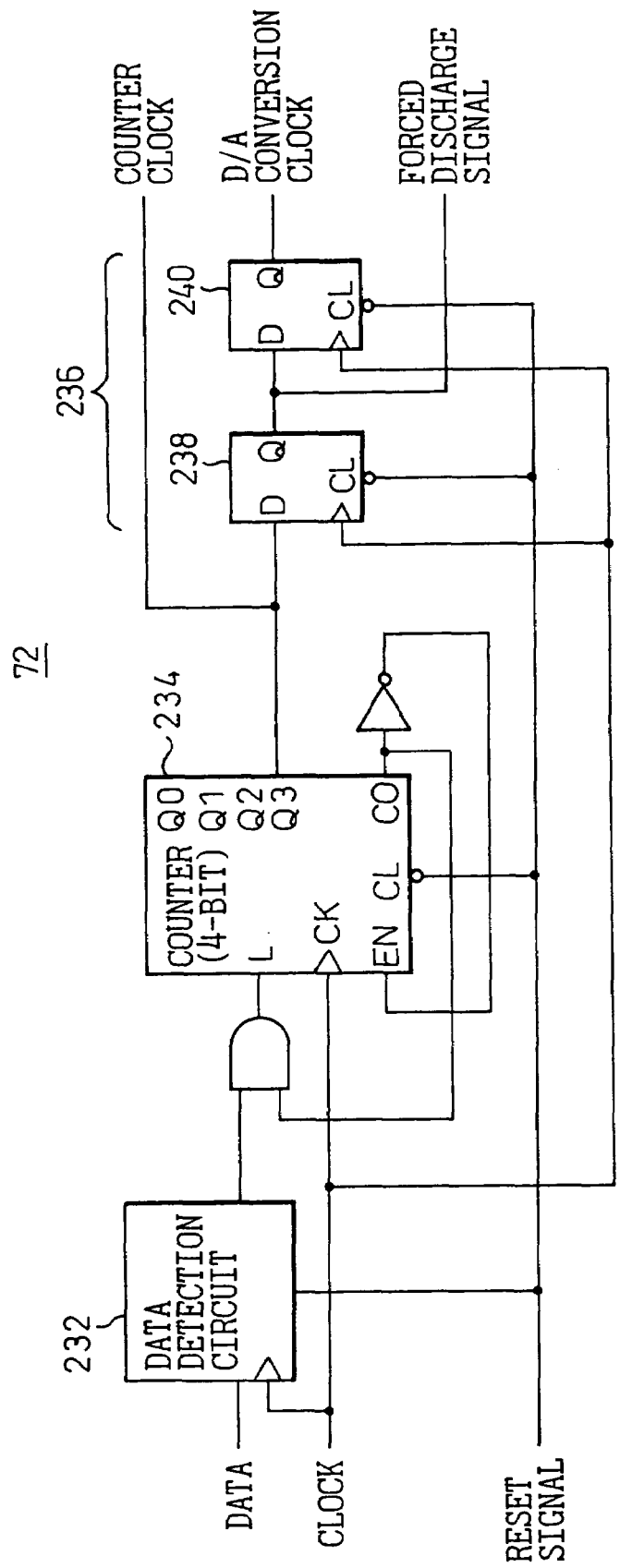
FIG. 47 is a circuit diagram showing one example of a clock control circuit 72.

FIG. 47 shows a first example of the circuit configuration of the clock control circuit 72 used in each of the above-described embodiments other than the first embodiment.

In burst transmission, time intervals during which no data are transmitted are relatively long, and during these intervals, the light output value cannot be fed back. In view of this, the clock signals to be supplied to the counter 16, the coarse/fine switching circuit 26, 76, 82, 108, 116, 120, 124, 126, 128, or 230, and the D/A conversion circuit 14 are created from the input data and the base clock so that the counter will be updated only when there exists input data. The clock control circuit comprises a data detection circuit 232, a 4-bit binary counter 234, and a delay circuit 236. The data detection circuit 232 detects input data and produces a high output. Only when the output of the data detection circuit is high, and the carry of the 4-bit binary counter 234 is up (high), does the LOAD control input of the 4-bit binary counter go high, causing the data to be loaded into the 4-bit binary counter; thereafter, when the carry is cleared, the counter starts counting. The time chart shown in FIG. 48 for the clock control circuit shows the setting in which a carry occurs when the data loaded into the 4-bit binary counter is "2" or when the count value is "1". The value of the most significant bit, Q3, of the 4-bit binary counter is supplied as the counter clock signal.

Figure 48:
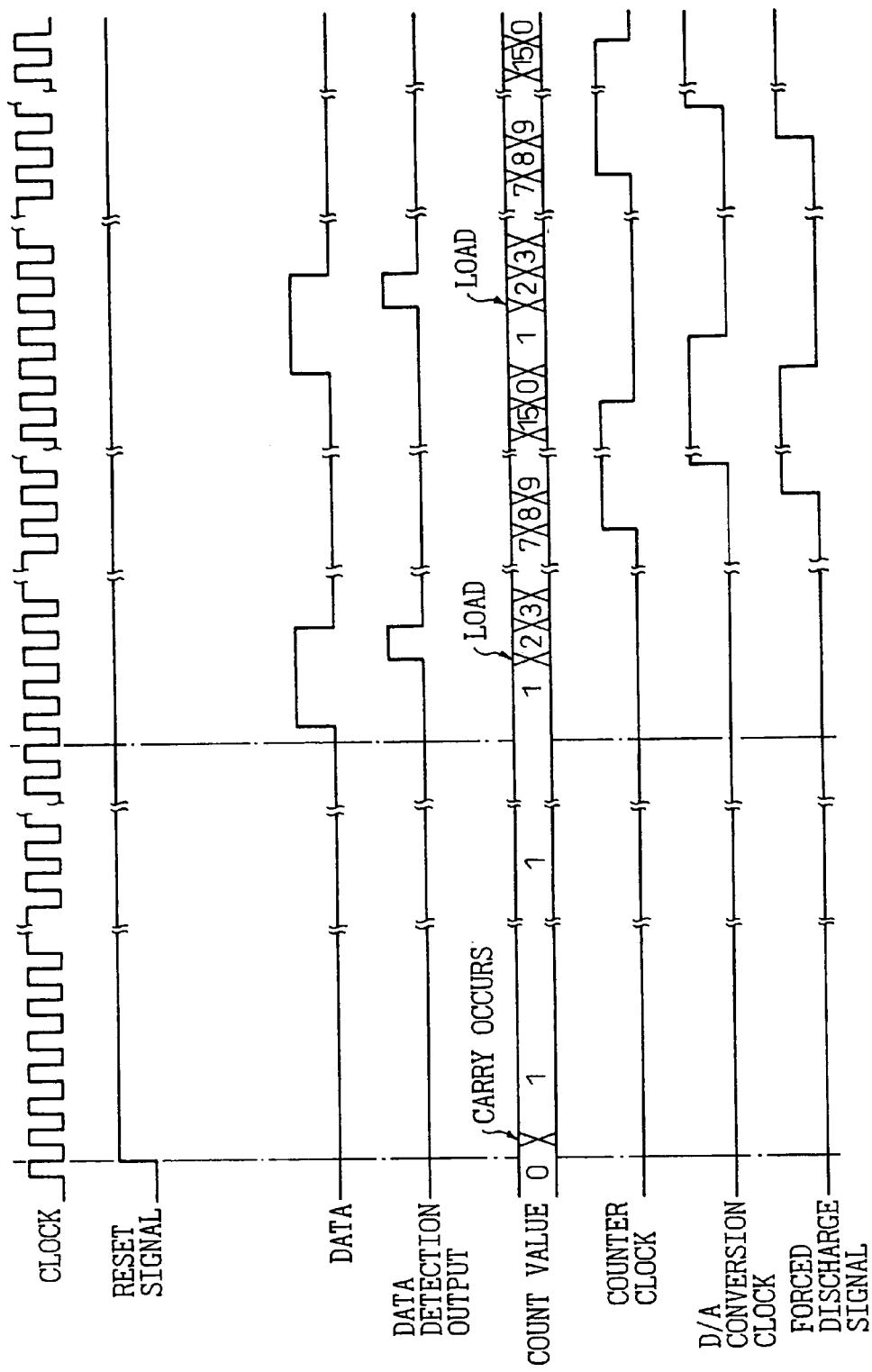
FIG. 48 is a timing chart showing the operation of the circuit of FIG. 47.

The operation of the clock control circuit according to the present invention will be described with reference to FIGS. 47 and 48. First, the counter 234 is reset to zero by the reset signal and, when the count value becomes "1" at the next clock input, a carry occurs and the EN input of the counter 234 goes to the low level, so that the counting is stopped. Though the details of the data detection circuit 232 will be described later, when the data input to the data detection circuit 232 is "1" for three bits in succession, the output of the data detection circuit 232 goes high, and the value "2" is loaded into the counter 234. Thereupon, the counter 234 resumes counting; when the count value becomes "8", the output Q3 goes to the high level, and hence the counter clock is high. When the count value becomes 0, the output Q3 goes to the low level, so that the counter clock is low. When the count value becomes "1", a carry occurs, and the counter 234 stops. Thereafter, when the output of the data detection circuit 232 goes to the high level, the above process is repeated. A forced discharge signal (described later) is output from a flip-flop 238 in the delay circuit 236 with a delay of one clock relative to the counter clock. The D/A conversion clock is output by being delayed one more clock through a flip-flop 240.

In this way, the counter clock for defining the light output update timing is generated only when an input data signal occurs. That is, light output update timing synchronized to input data "1" can thus be realized.

Figure 49:
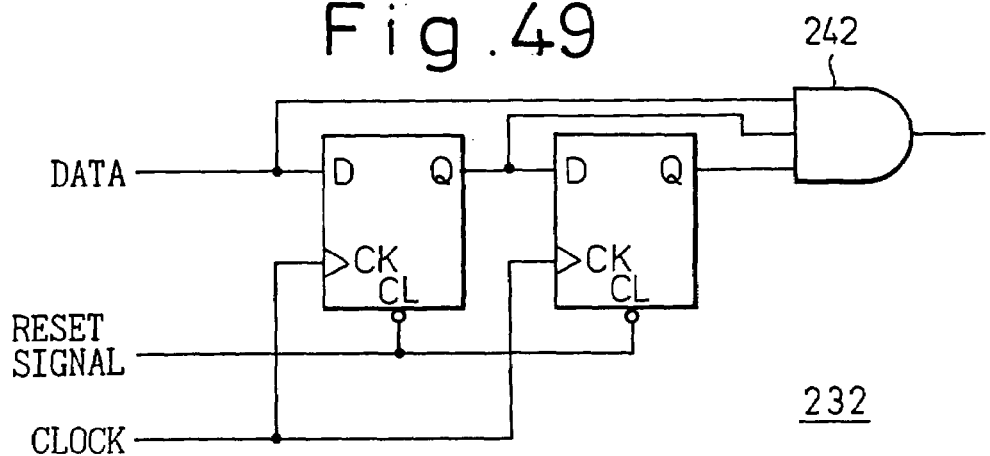
FIG. 49 is a circuit diagram showing one example of a data detection circuit 232.

One example of the data detection circuit 232 is shown in FIG. 49. When an input data signal occurs for three bits in succession, all inputs to an AND gate 242 are 1s, so that the data detection output signal is high and the 4-bit binary counter starts counting. In this example, an input data signal occurring for three bits in succession is detected, but this is not an essential condition.

The clock to be supplied to the D/A conversion circuit 14 is derived by delaying the output of the 4-bit binary counter 234 through the delay circuit 236 by considering the delay time through the counter 16 and the delay due to the input setup time, etc. of the D/A conversion circuit 14.

Figure 50:
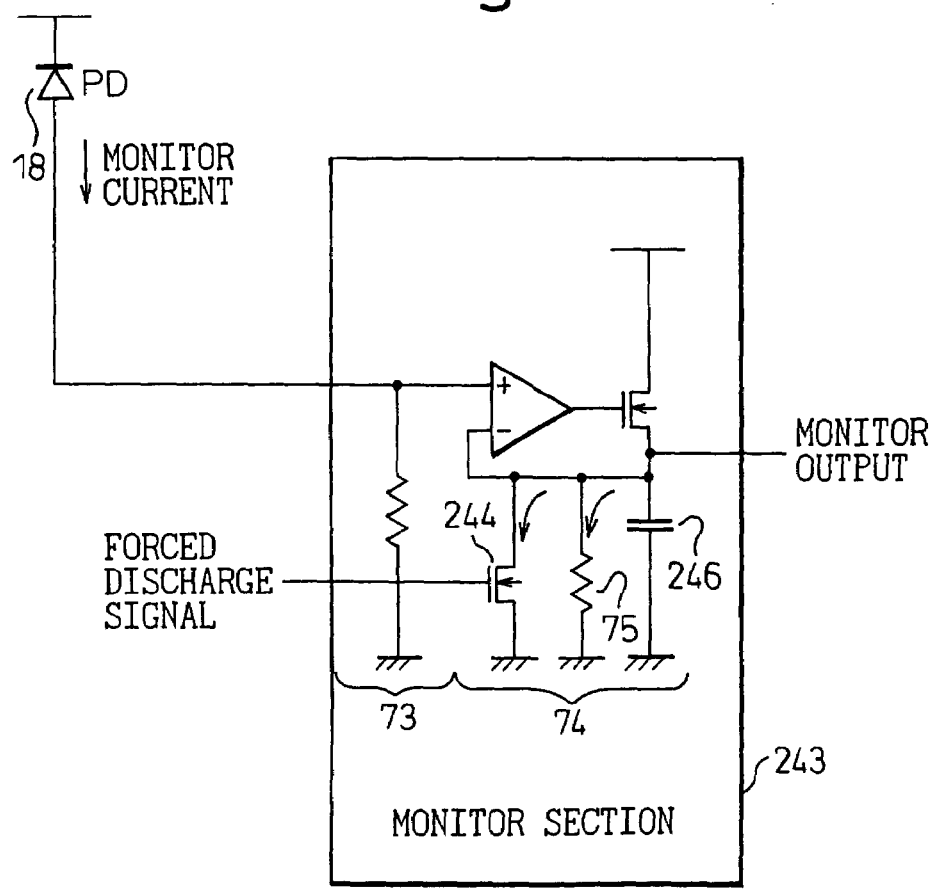
FIG. 50 is a circuit diagram showing one example of a monitor section 243.

The forced discharge signal is used in the monitor section when it is needed to quickly lower the light output, for example, when starting control from an initial value higher than the target value. In the monitor section 70 shown in FIG. 13, when the monitor output is higher than the target value, the control value is reduced to lower the light output, and when the monitor current decreases, the monitor output gradually decreases due to the spontaneous discharge through the resistor 75. As a result, the monitor output may be judged as being higher than the reference value when the light output is actually lower than the reference value, and the actual light output may be caused to drop far below the reference value. To address this problem, in the monitor section 243 shown in FIG. 50, a transistor 244 is inserted in parallel with the resistor 75. At the completion of the updating of the counter 16, the transistor 244 is turned on by the forced discharge signal, forcing the charge on the capacitor 246 to be discharged. This improves the ability of the monitor output to follow a rapid decrease in the light output. If the reference value for the light output control is to be generated from the data signal, a similar circuit can be used for the discharge of the reference value. Also, a conventional constant voltage circuit, such as the previously described one, may be used as the reference value generating circuit.

When the initial value after clearing the digital value by the reset signal is invariably lower than the light output reference value, and it is, therefore, not necessary to quickly reduce the light output, the forced discharge signal is not needed.

Furthermore, the monitor section and the reference value source may be constructed using a sample-and-hold circuit or an edge detection circuit that has neither a spontaneous discharge nor a forced discharge function.

In the above description, the update timing of the various output signals of the clock control circuit may be determined arbitrarily, considering the delay times, etc. of the various blocks implementing the light output control method of the present invention.

In the above embodiment, an external signal is used as the reset signal, but instead, use can also be made of a signal that a supply voltage detection circuit or the like (such as a conventional power-on reset circuit) automatically generates when a supply voltage is turned on. Furthermore, the reset signal may be generated using a clock-off detection circuit that detects the absence of an input clock. Moreover, a combination of two or more of the external signal, the supply voltage detection circuit, and the clock-off detection circuit, may be used.

Figure 51:
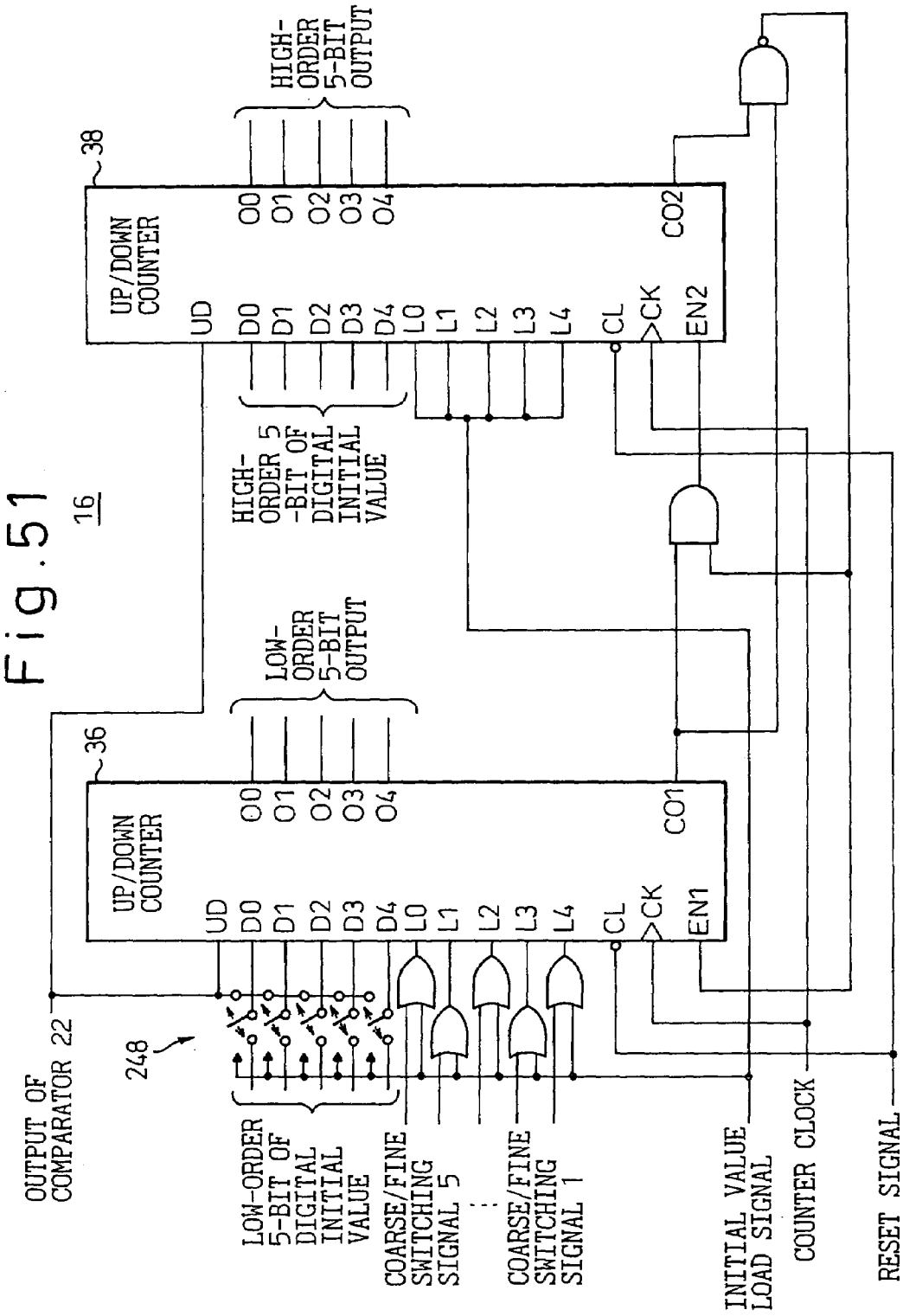
FIG. 51 is a circuit diagram showing another example of the counter 16.

FIG. 51 shows the detailed configuration of the counter 16 to explain how the initial value is loaded into the counter 16. The high-order five bits of the initial value are connected directly to the load data inputs of the high-order 5-bit up/down counter 38. The low-order five bits are connected to one side of a five-gang switch 248. When the initial value load signal is high, the switch 248 selects the low-order five bits of the initial value for connection to the load data inputs of the up/down counter 36. When the initial value load signal is low, the output of the comparator 22 is selected for connection to the load data inputs.

Figure 52:
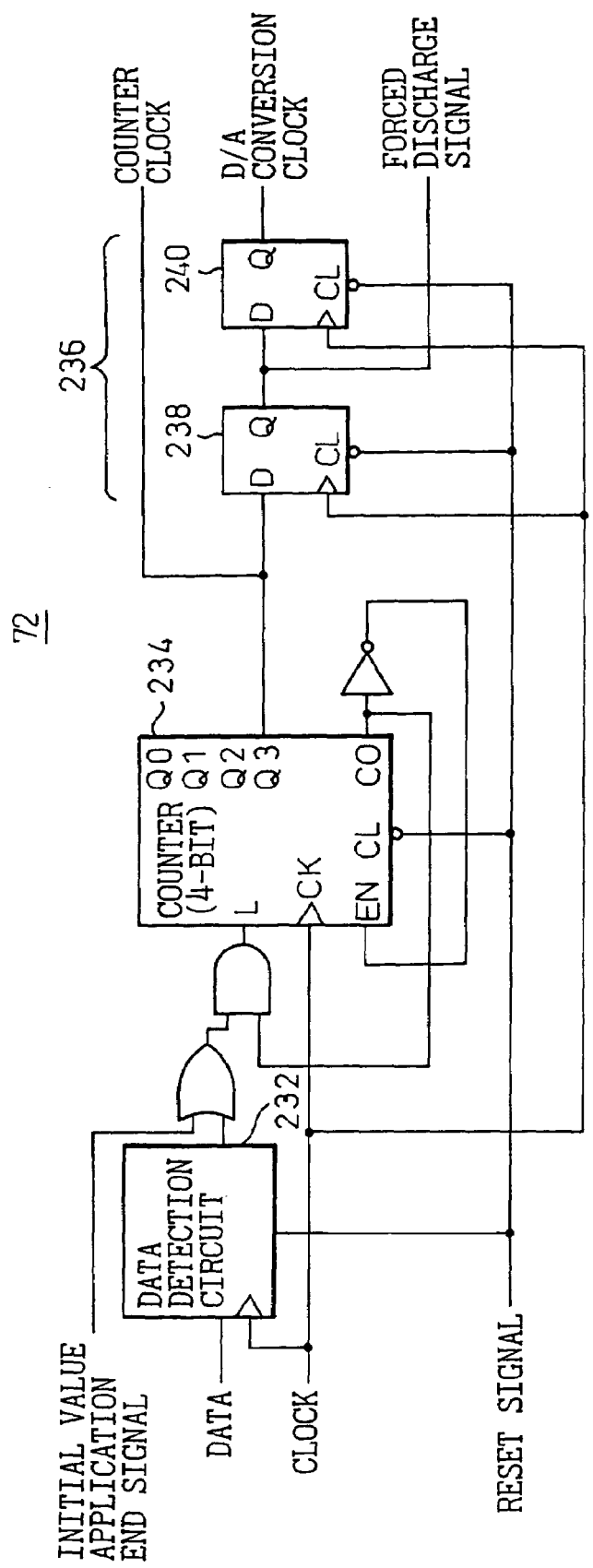
FIG. 52 is a circuit diagram showing a second example of the clock control circuit 72.
Figure 53:
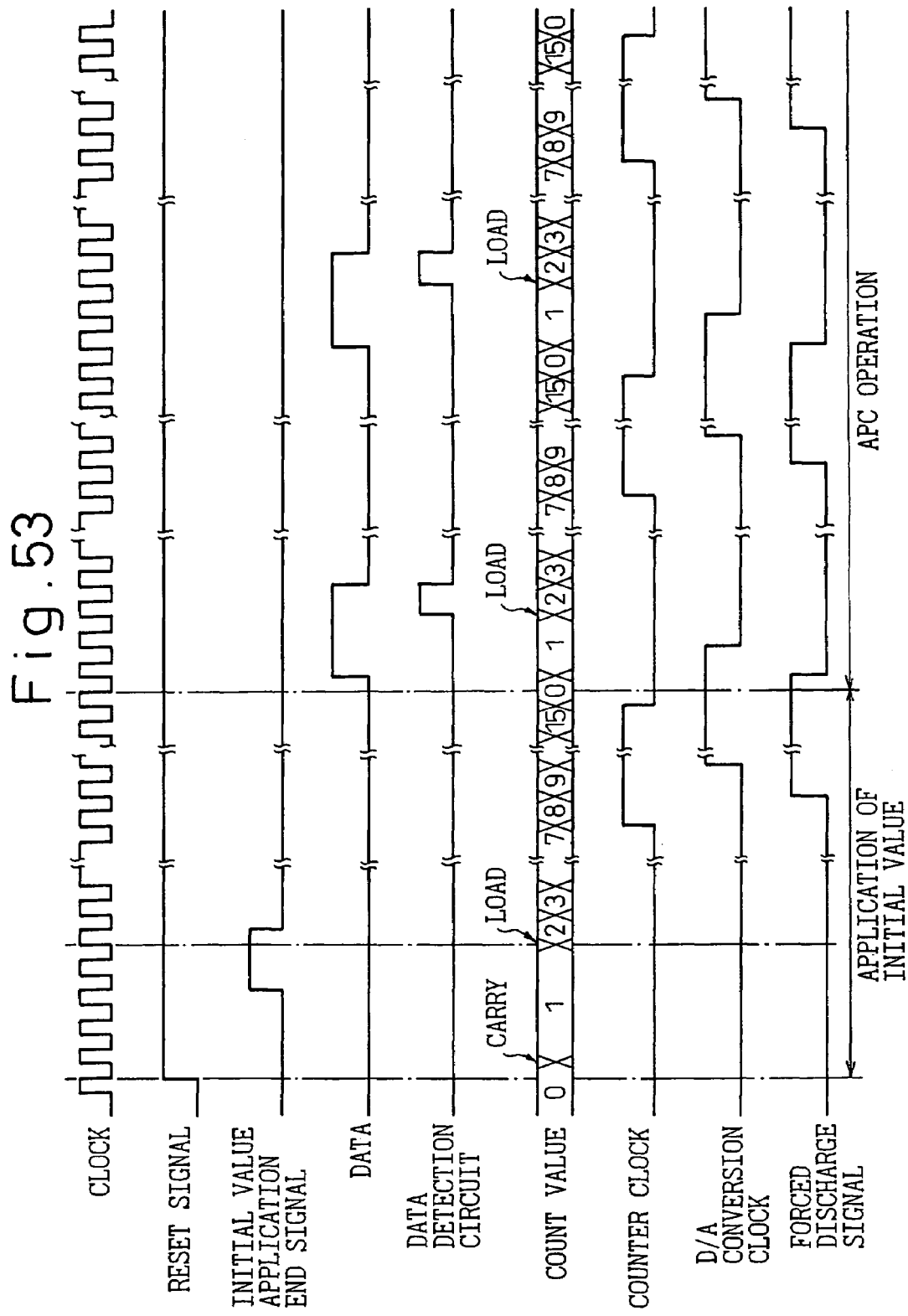
FIG. 53 is a timing chart showing the operation of the circuit of FIG. 52.

FIG. 52 shows a second example of the clock control circuit 72. To load the counter 16 with the initial value for the light output, the output signal from the data detection circuit is ORed with an initial value application end signal, and the result is input to the LOAD terminal of the counter 234. With this arrangement, the counter clock is output at the end of the initial value application, as shown in FIG. 53, and the initial value is loaded into the counter 16.

Figure 54:
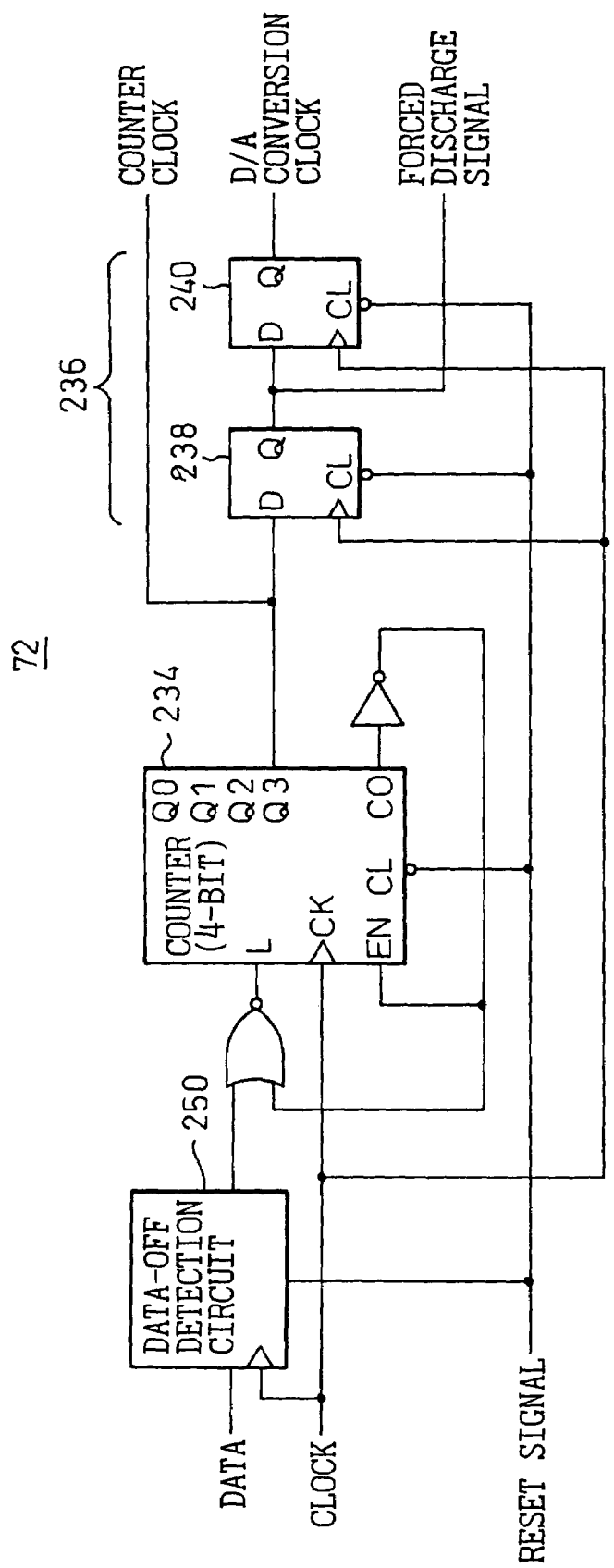
FIG. 54 is a circuit diagram showing another example of the clock control circuit 72.
Figure 55:
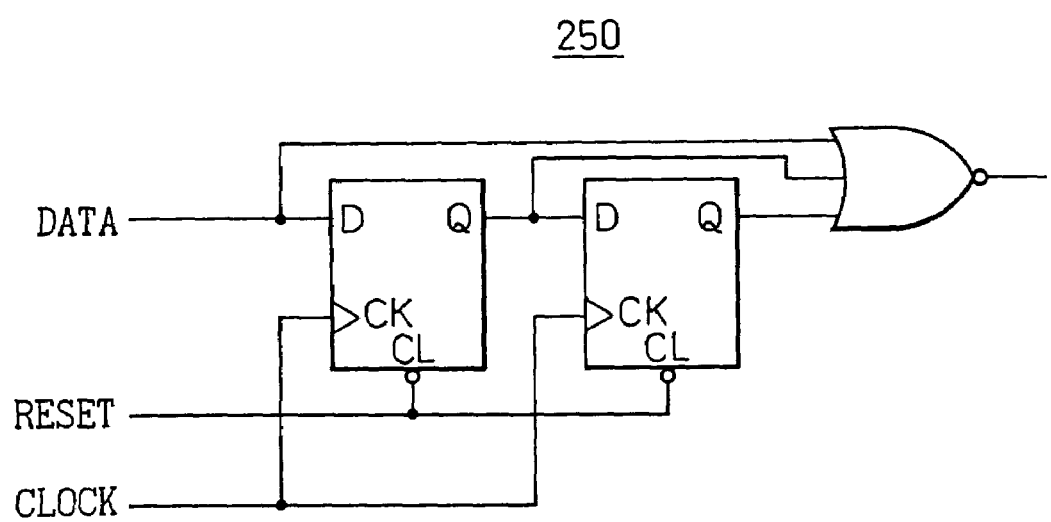
FIG. 55 is a circuit diagram showing one example of a data detection circuit 250.

In the above-described example, light output update timing synchronized to the input data "1" has been achieved, but it is also possible to generate light output update timing so that the digital value for light output is not updated by controlling the clock to be supplied to the counter 16, the coarse/fine switching circuit, and the D/A conversion circuit only when there is no data. This can be achieved by the clock control circuit shown in FIG. 54. The circuit comprises a data-off detection circuit, a 4-bit binary counter 234, and a delay circuit 236. The data-off detection circuit 250 detects input data "0" and produces a high output. The operation is the same as that described earlier, and if it is desired to add an initial value for the light output, as is done in FIG. 52, the initial value application end signal may also be provided in FIG. 54. A specific example of the data-off detection circuit 250 is shown in FIG. 55.

Figure 56:
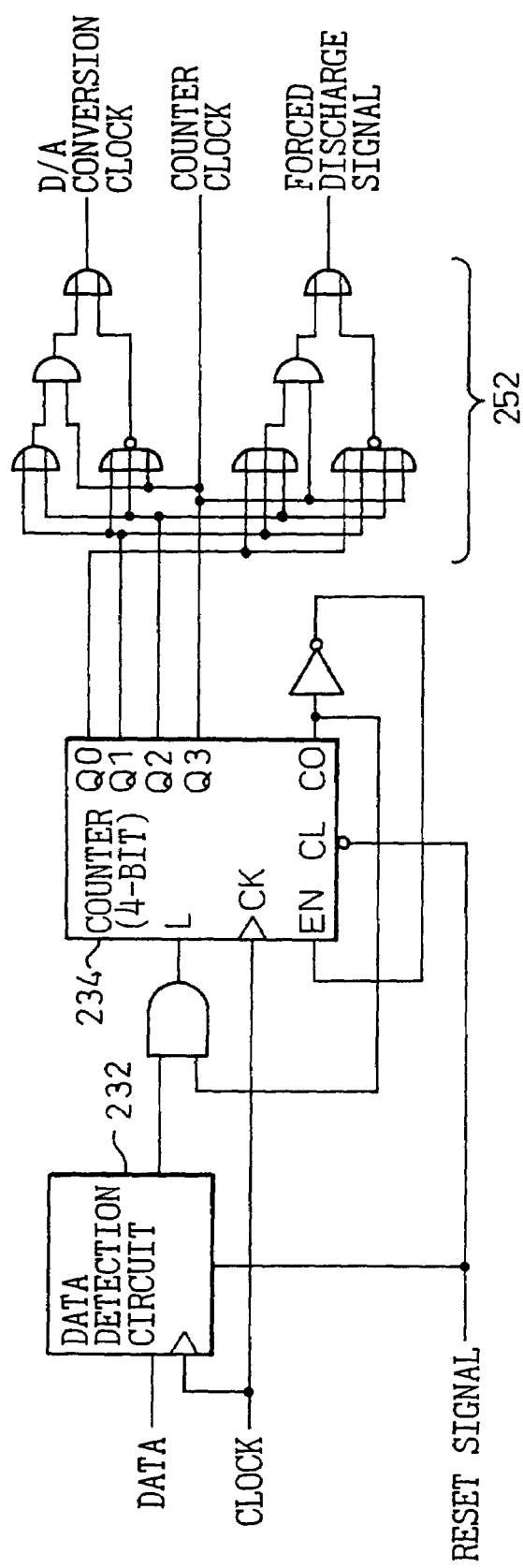
FIG. 56 is a circuit diagram showing still another example of the clock control circuit 72.

In the above description, the clock control circuit has been described as containing a delay circuit, but combinational logic 252 may be used instead of the delay circuit. A specific example is shown in FIG. 56.

Figure 57:
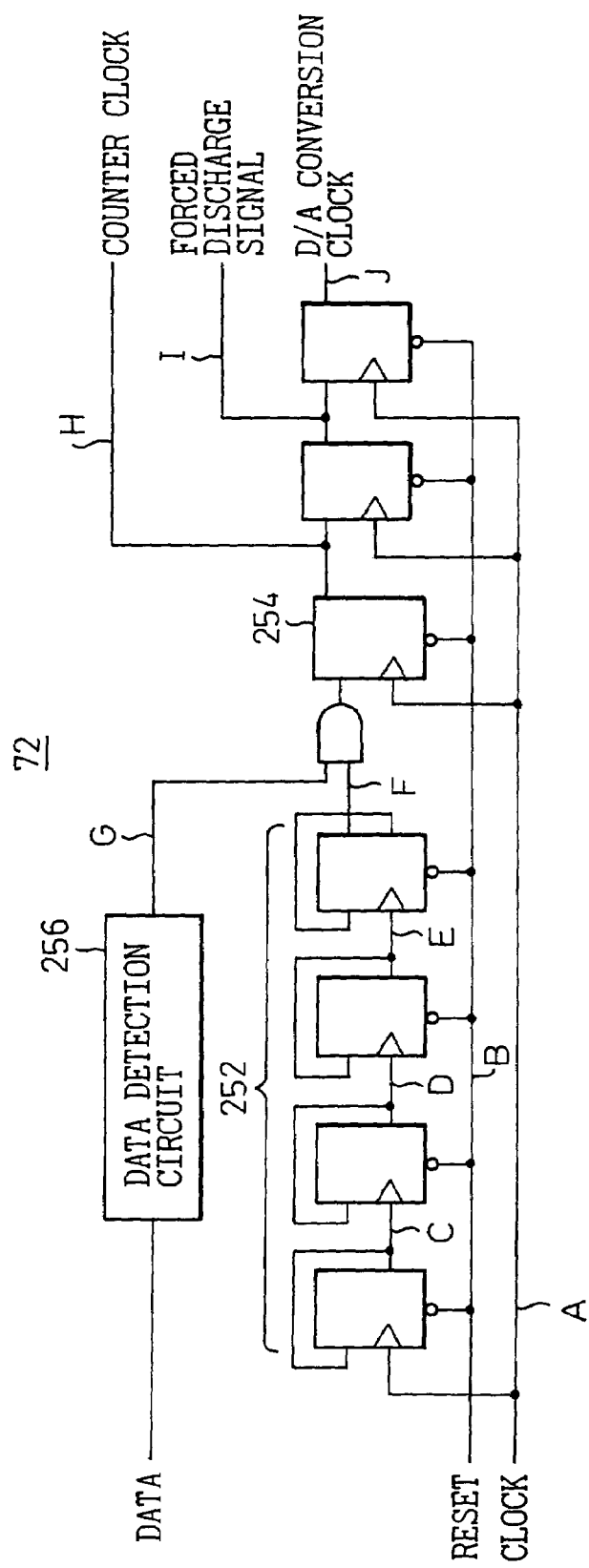
FIG. 57 is a circuit diagram showing a further example of the clock control circuit.
Figure 58:
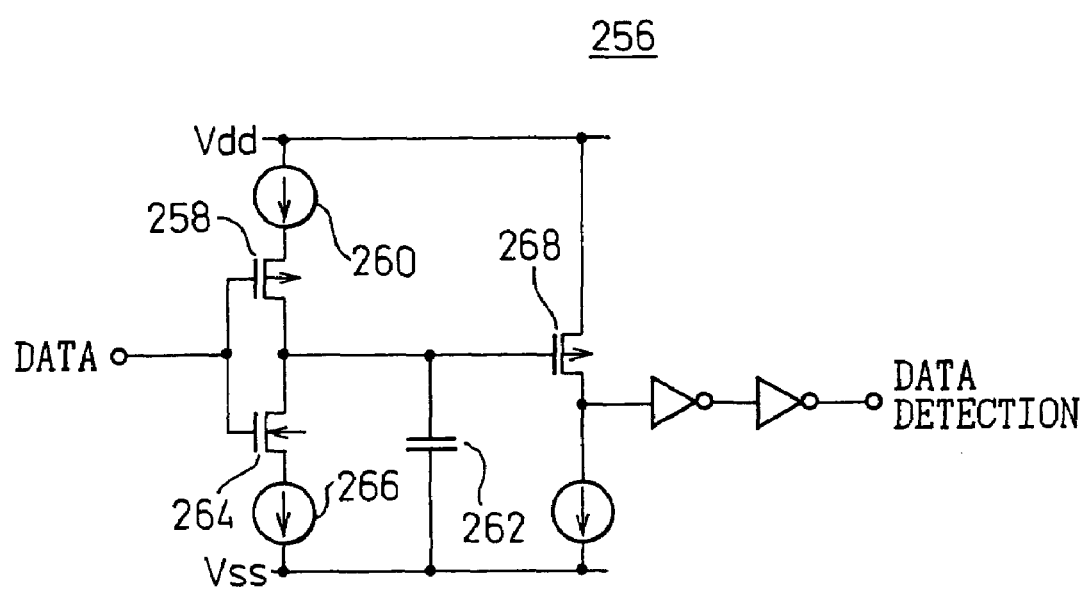
FIG. 58 is a circuit diagram showing one example of a data detection circuit 256.
Figure 59:
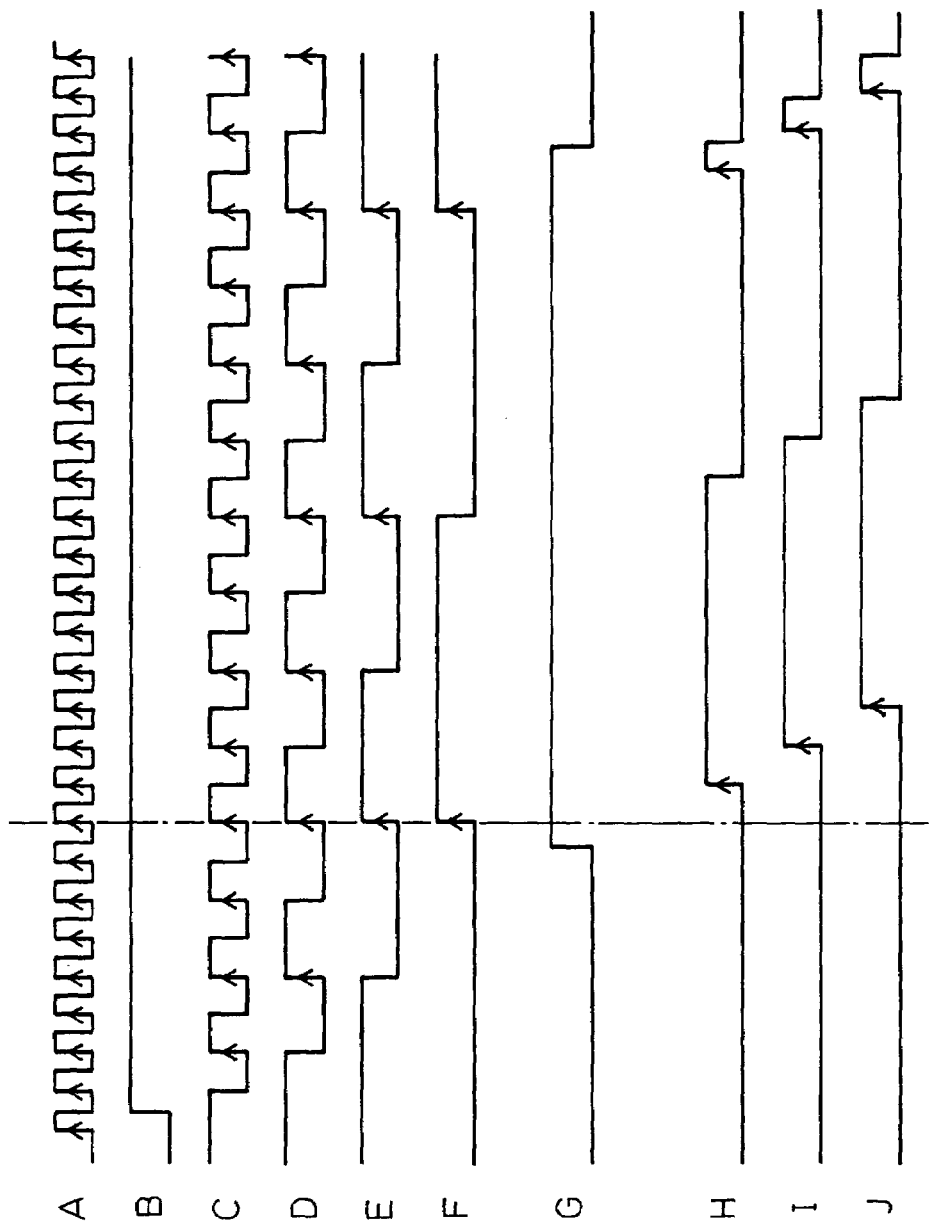
FIG. 59 is a timing chart showing signals at points A to J in FIG. 57.

FIG. 57 shows an example of a clock control circuit in which a frequency divider is used instead of the counter. The counter 234 in FIG. 47 is replaced by a four-stage frequency divider 252, with the addition of a flip-flop 254 for synchronization with data detection. The data detection circuit 256 used here has the configuration shown in FIG. 58. In FIG. 58, when there is no data, a transistor 258 is ON, and a capacitor 262 is charged with a current from a current source 260, increasing the voltage level of the capacitor 262. When there is data, a transistor 264 is ON, and the capacitor 262 is discharged through a current source 266, so that the voltage level decreases. A transistor 268 is OFF when its gate potential is high, causing the voltage detection output to go to the low level, and is ON when its gate potential is low, causing the detection output to go to the high level. That is, the detection output remains at the high level as long as there is data, and goes to the low level when there is no data. FIG. 59 shows signals at points A to J in FIG. 57.

Degradation mode of the laser diode (LD) will now be considered in connection with the negative feedback control in the light output control circuit. If the LD degrades due to aging, etc., its light-producing efficiency decreases and the monitor signal output from the photodiode (PD) drops. As a result, the digital value of the counter 16 for the light output continues to rise by the negative feedback control of the light output. Suppose here that, for any reason, the light-producing efficiency of the LD is restored; in that case, the digital value for the light output may have already risen to a maximum value. This could damage the LD.

Figure 60:
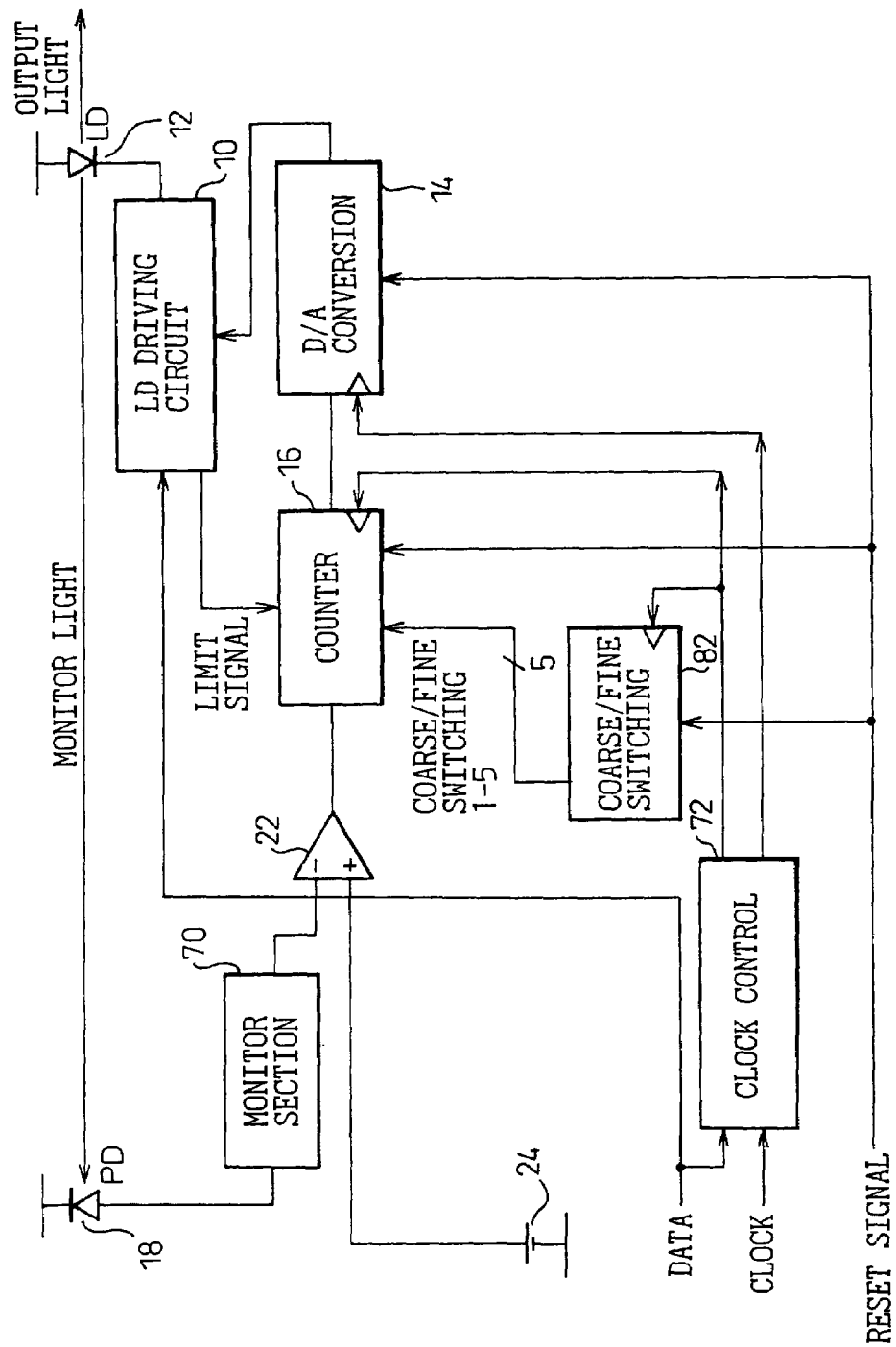
FIG. 60 is a block diagram of another embodiment of the present invention.
Figure 61:
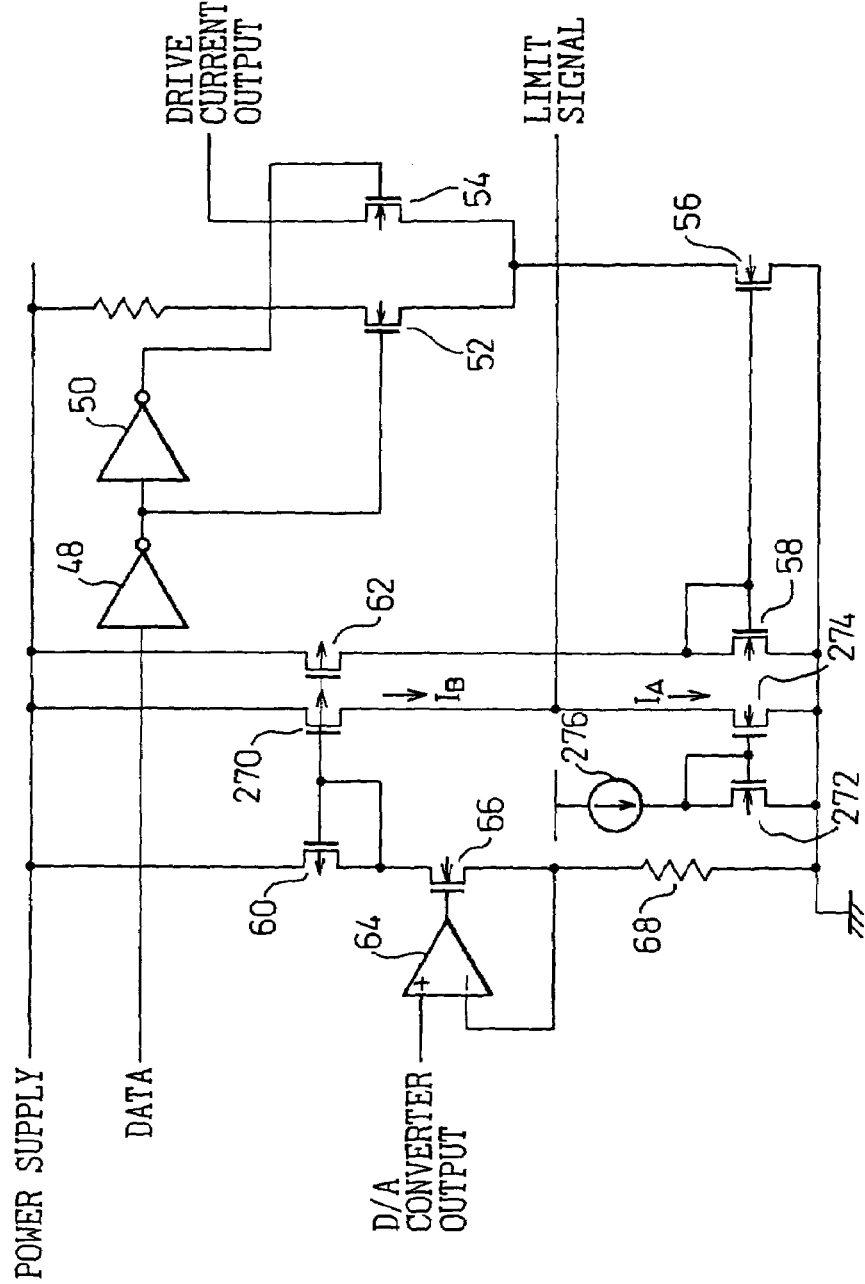
FIG. 61 is a circuit diagram of the LD driving circuit 10 in the embodiment of FIG. 60.
Figure 62:
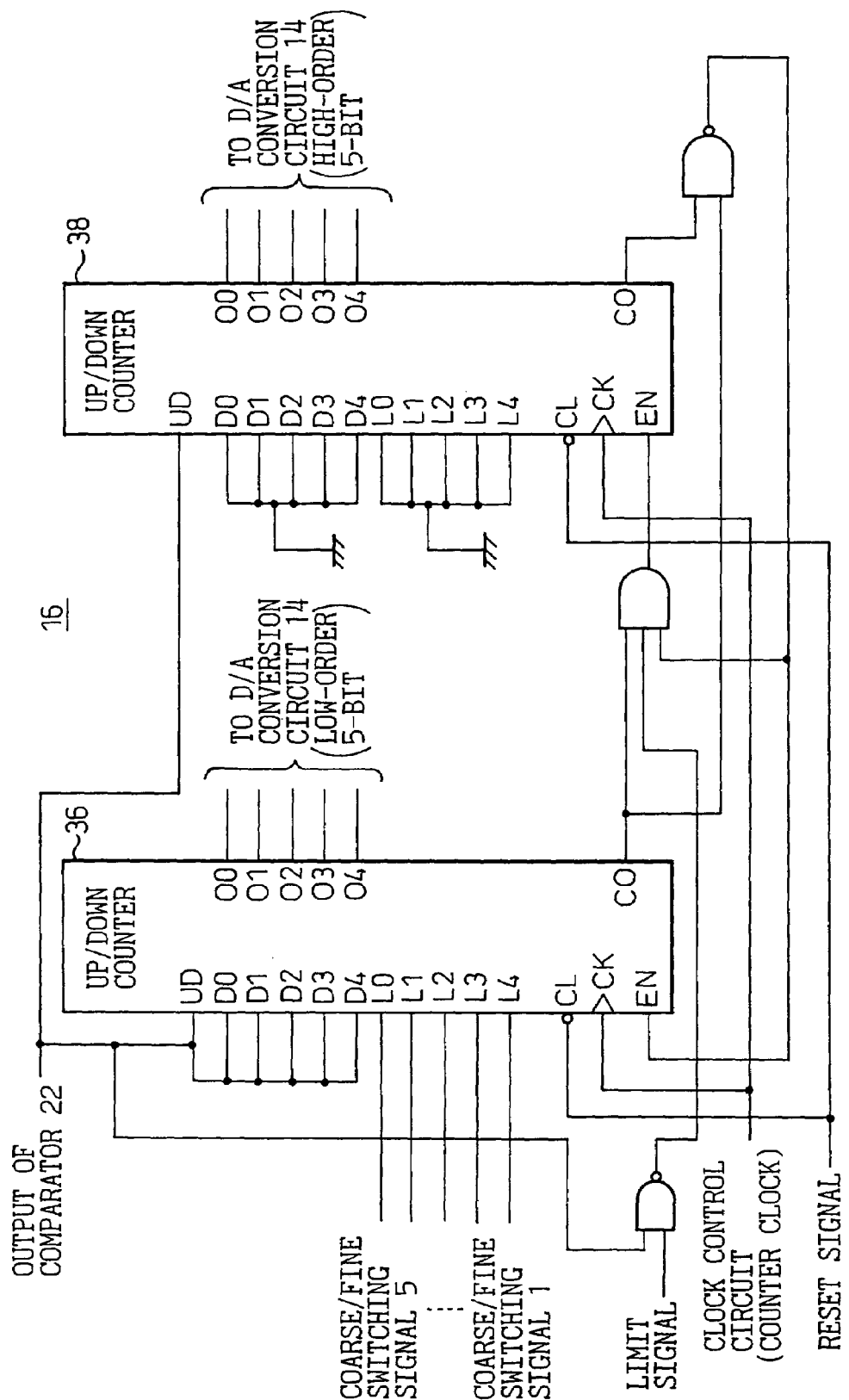
FIG. 62 is a circuit diagram of the counter 16 in the embodiment of FIG. 60.

The configuration shown in FIG. 60 avoids the above LD damage by having the LD driving circuit 10 output an LD drive current limit signal to the counter 16 that controls the light output value, and thus stopping the light output increasing operation. Detailed circuit configurations of the LD driving circuit 10 and the counter 16 that controls the light output value are shown in FIGS. 61 and 62, respectively. In FIG. 61, p-channel MOS transistors 60 and 62 and p-channel MOS transistors 60 and 270 respectively form current mirrors. Likewise, n-channel MOS transistors 272 and 274 and n-channel MOS transistors 56 and 58 respectively form current mirrors. If the current IB generated by the transistors 60 and 270 is larger than the current IA (reference value) generated by a current source 276 and the transistors 272 and 274, the LD drive current limit signal goes high. The current IA generated by the current source 276 and transistors 272 and 274 provides the reference value below which the LD drive current is to be limited. When the limit signal is high, only the upward counting of the counter 38 shown in FIG. 62 is disabled.

Figure 63:
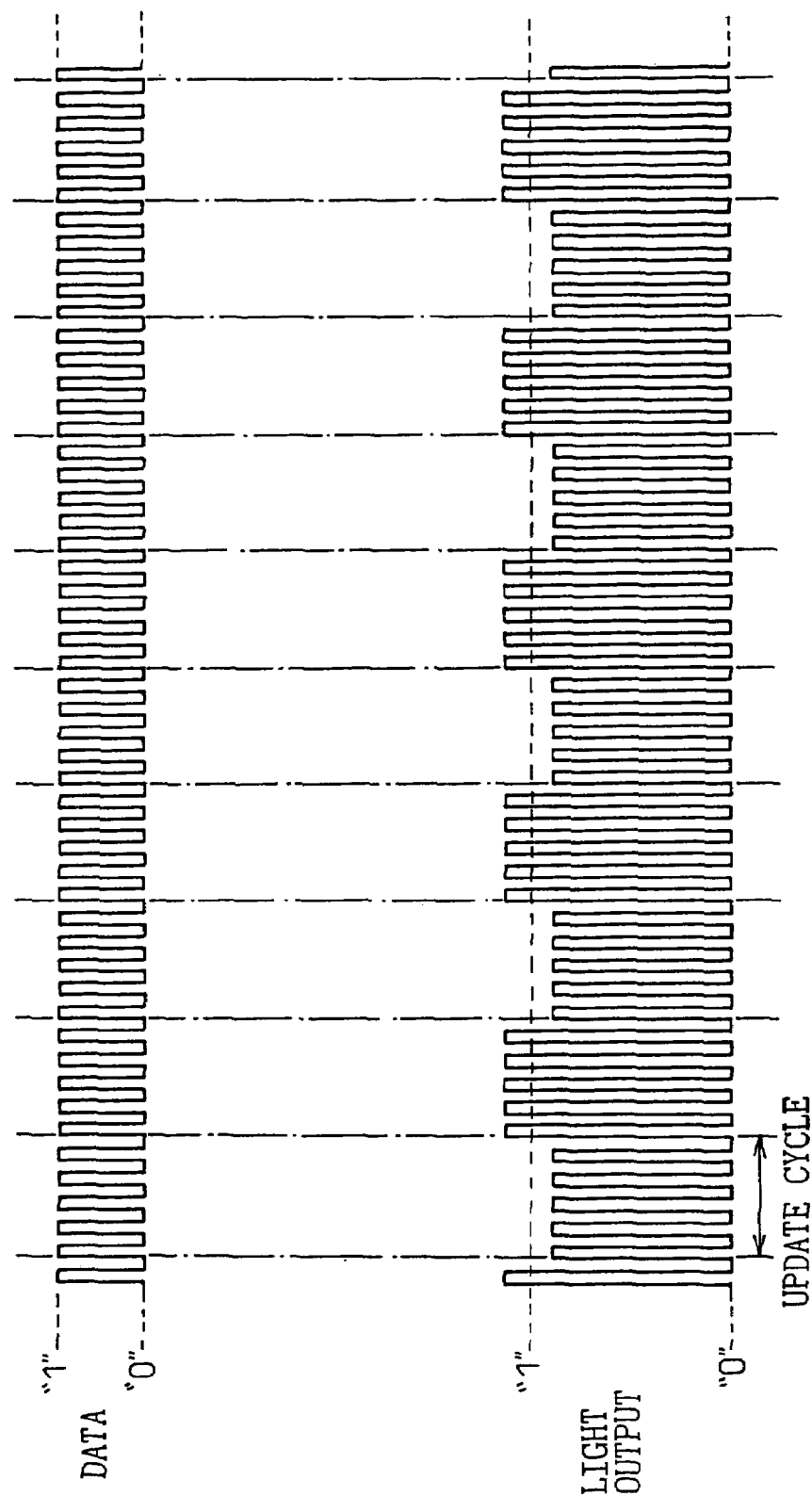
FIG. 63 is a diagram showing a steady-state control condition.

In the light output control circuit so far described, after the power up of the light output control circuit is completed and a steady state is reached, the light output value continually oscillates between two values around the reference value, as shown in FIG. 63. Usually, the circuit is designed so that the two values come within the specified limits of the light output, but the light output value cycles through unnecessary changes.

Especially, in burst transmission, the time required for the light output to stabilize must be shortened; to achieve this, the feedback loop speed must be increased, but if the feedback is always performed at high speed, unnecessary updates will be repeated. This problem will result in increased error rate at the optical signal receiving end.

Figure 64:
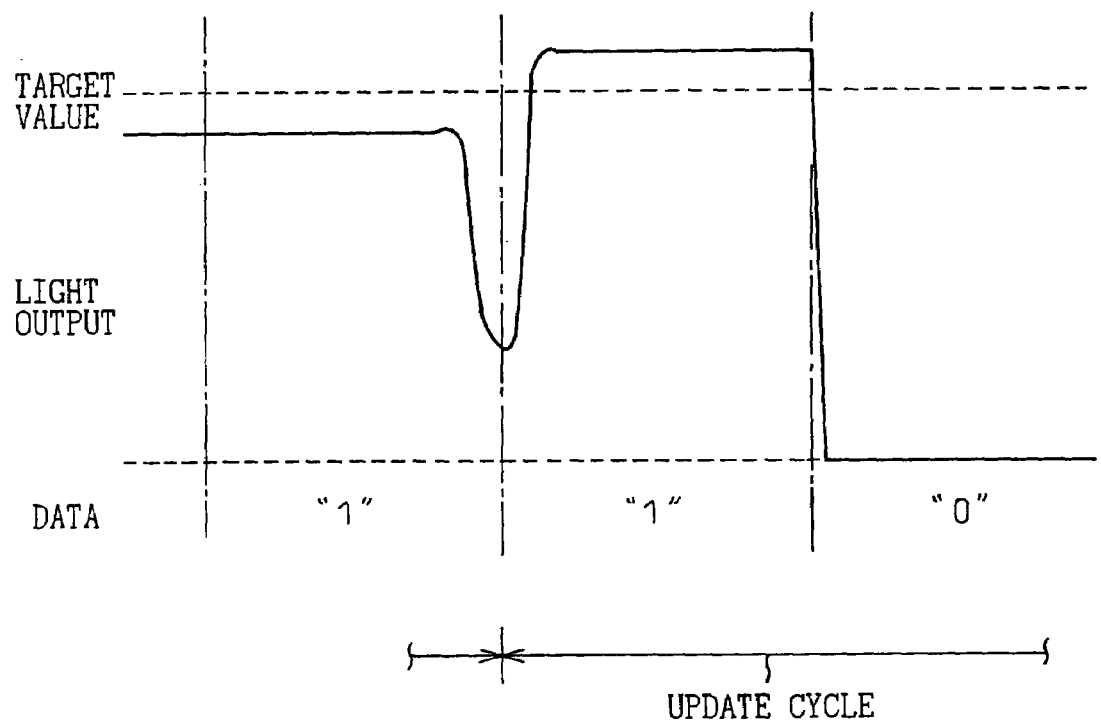
FIG. 64 is a diagram showing a D/A conversion glitch.

A problem associated with the D/A conversion circuit used in the above light output control circuit will be described with reference to FIG. 64. When the light output control circuit updates its light output value, the digital code input to the D/A conversion circuit changes, and a spike called a glitch occurs at the output of the D/A conversion circuit. This glitch appears in the drive current, causing waveform distortion. This problem also results in increased error rate at the optical signal receiving end.

Figure 65:
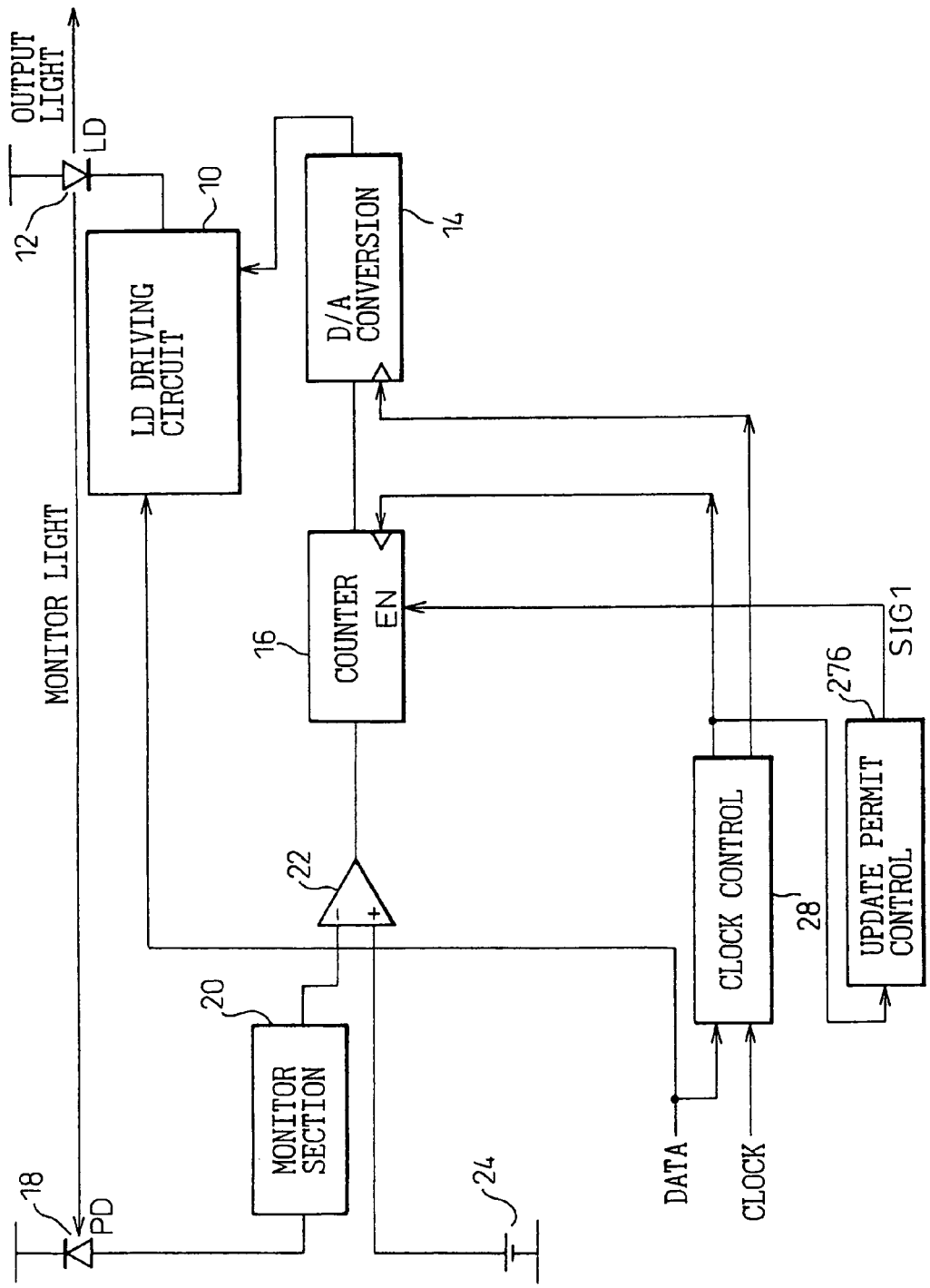
FIG. 65 is a block diagram of still another embodiment of the present invention.
Figure 66:
FIG. 66 is a timing chart showing the operation of the embodiment of FIG. 65.

FIG. 65 shows another embodiment of the present invention, and FIG. 66 illustrates its operation. This embodiment differs from the embodiments so far described in that, in addition to the clock control circuit 28 for controlling the clock supplied to the counter 16 that stores the light output control value, an update permit control circuit 276 is provided that controls whether to permit or not permit the updating of the counter 16. The counter update permit control is performed by issuing an update permit signal SIG1 from the update permit control circuit 276. Once the counter 16 has been updated in response to the signal SIG1, unnecessary updating is prohibited for a time longer than the minimum necessary cycle for updating by the feedback, by not permitting updating until a prescribed condition is satisfied by a count of the clock or data signal, etc. This serves to reduce the number of unnecessary updates by lengthening the actual feedback cycle. Though the light output oscillates between the two values around the reference value, its frequency can be reduced and the waveform can thus be improved.

In the example of FIG. 65, the logic state of SIG1 is "1"=High when permitting an update, and "0"=Low when prohibiting updates. After an update, the state goes to "0", and this state is maintained until a prescribed condition is satisfied; after the condition is satisfied, the state remains at "1" until the next update is performed. Several examples will be given later, dealing with a specific method of generating the signal SIG1.

In the circuit of FIG. 65, the update permit control signal, generated separately from the clock supplied to the counter 16, is used for counter update/prohibit control; alternatively, logic operations may be performed between the permit signal and the clock, with provisions made to stop the clock itself when prohibiting updates (this can be easily accomplished using an AND gate, etc.). In that case also, exactly the same effect can be achieved. The following description deals with the update permit signal independent of the clock, but it is self-evident that the same thing can also be achieved using the method of stopping the clock itself.

Next, still another embodiment of the present invention will be described with reference to FIGS. 67 and 68. This embodiment achieves high-speed updating during power up, while reducing the number of light output updates once the control reaches a steady-state condition.

Figure 67:
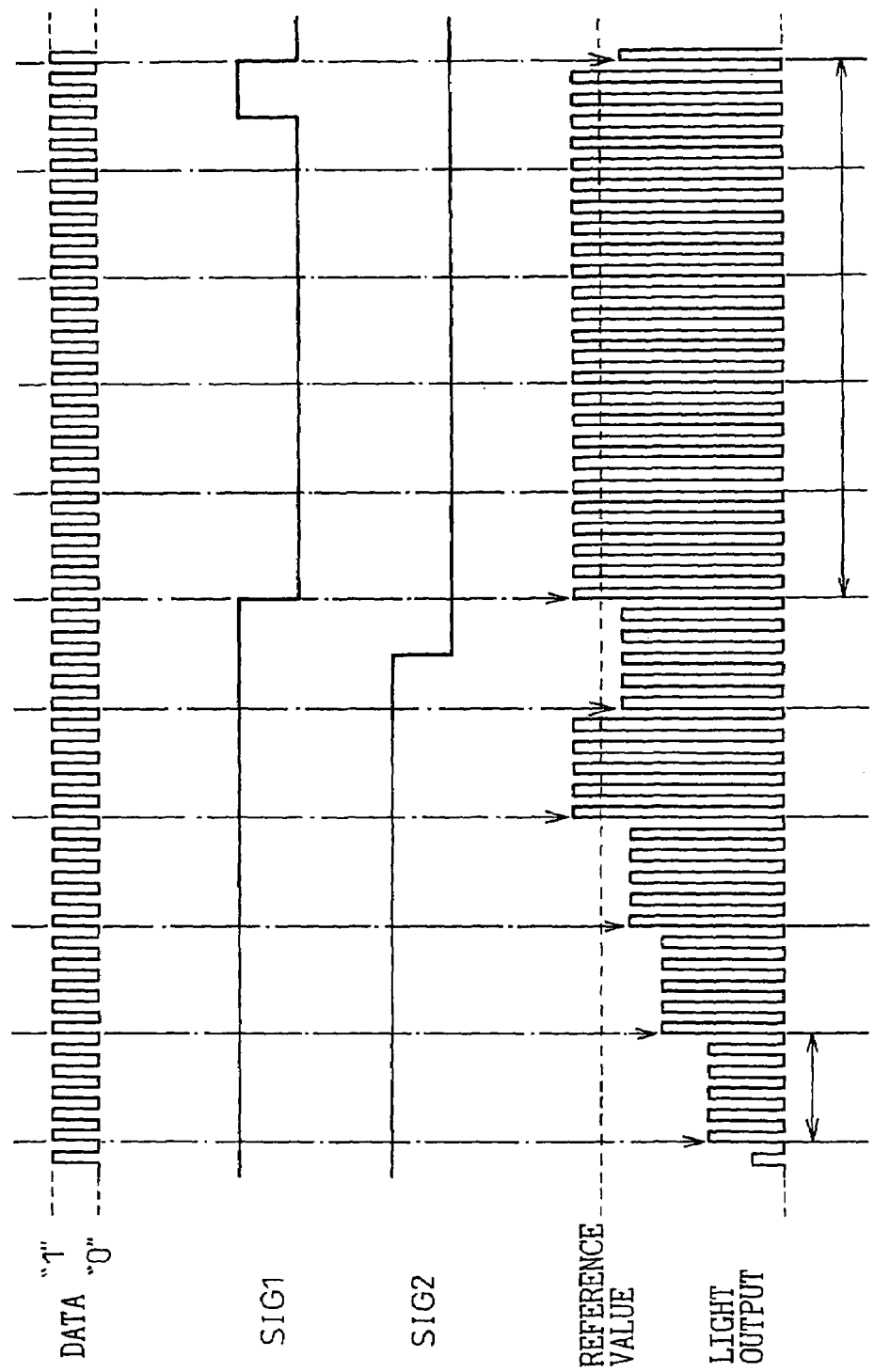
FIG. 67 is a timing chart showing the operation of still another embodiment of the present invention.

The operation of this embodiment is shown in FIG. 67. High-speed power up and the reduction of waveform degradation during steady-state control are simultaneously achieved by using a switching signal SIG2 and switching the mode between a power-up mode in which feedback is performed with the minimum necessary cycle for updating and a steady-state mode in which, once an update is done, updating is prohibited until a prescribed condition is satisfied. In the illustrated example, SIG2 remains at "1" during the high-speed power up, and goes to "0" when steady state is reached.

Figure 68:
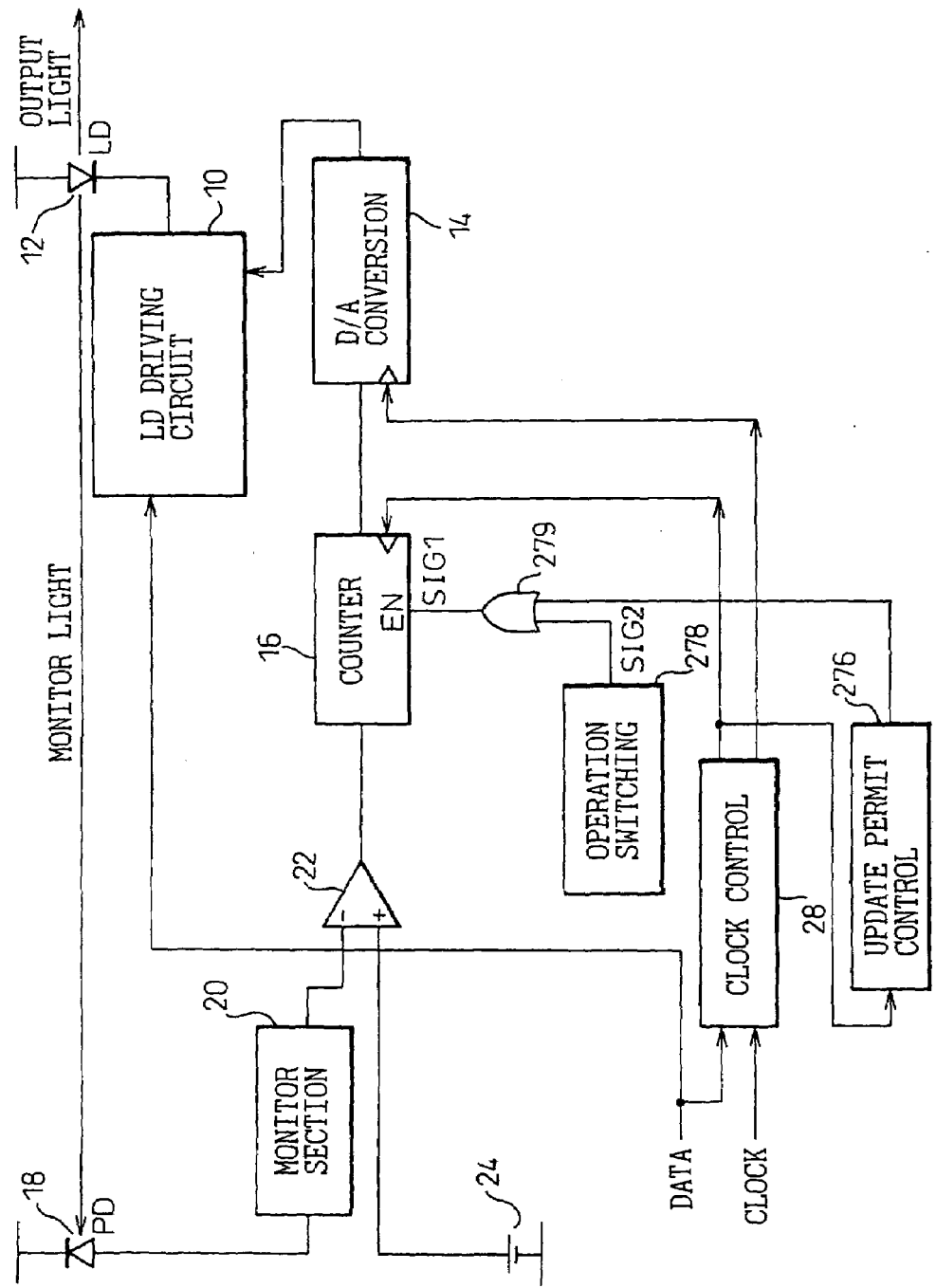
FIG. 68 is a block diagram of the same embodiment.

FIG. 68 shows the configuration for implementing the above operation. An operation mode switching section for generating the signal SIG2 indicating the power-up mode is added in the circuit of FIG. 65, and SIG2 and the output of the update permit control circuit 276 are ORed by an OR gate 279, and the result is input as SIG1 to the counter 16. The switching signal SIG2 can be generated from the data, clock, or other external signal, and several examples will be given later to explain a specific method of signal generation.

A further embodiment of the present invention will be described with reference to FIG. 69. This embodiment is intended, while retaining the high-speed power up function, to prevent the degradation of the light output waveform caused by glitches occurring in the D/A conversion circuit when updating the light output control value.

Figure 69:
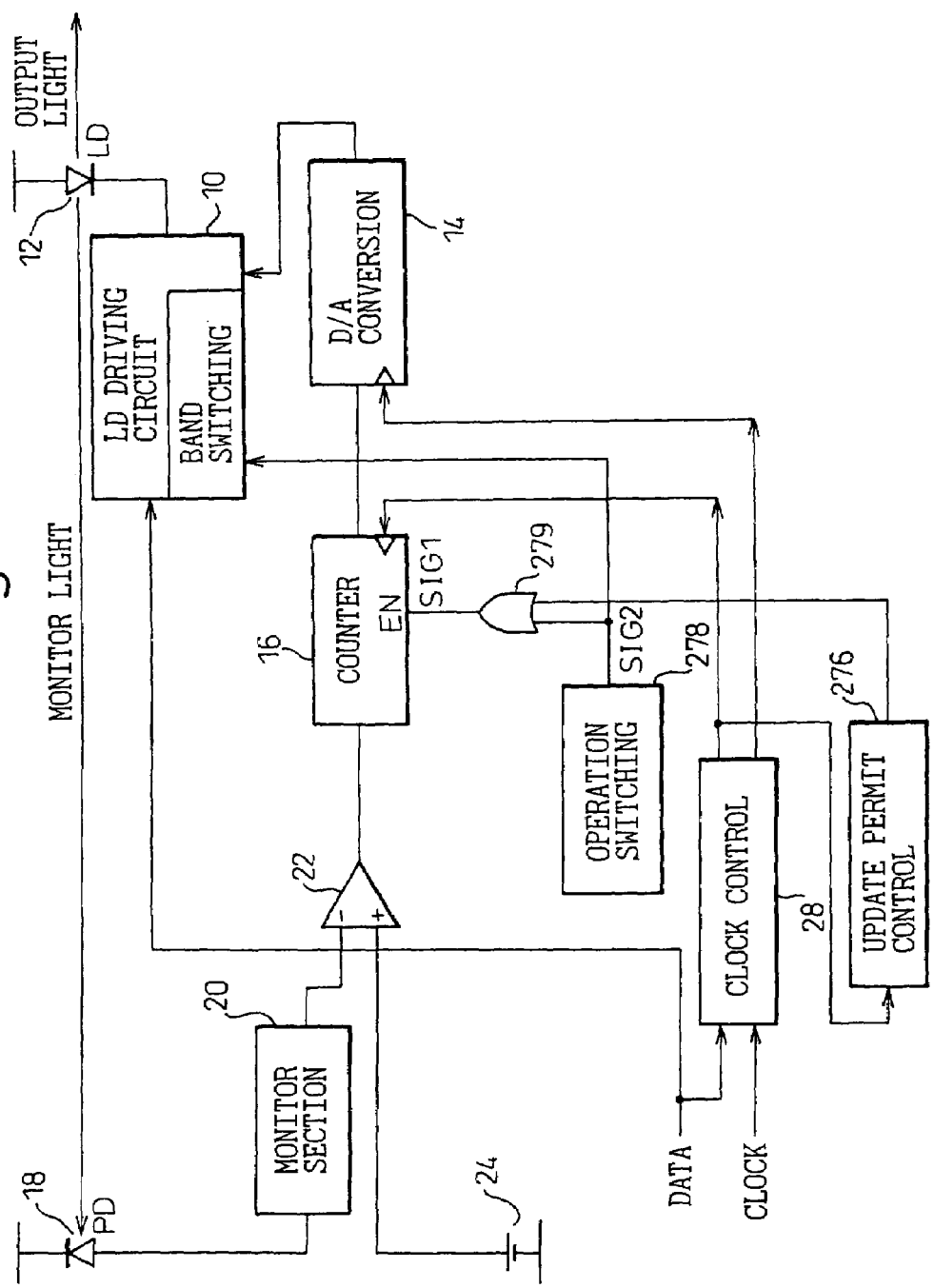
FIG. 69 is a block diagram of still another embodiment of the present invention.

The basic configuration of FIG. 69 is the same as that of FIG. 68, the only difference being that the frequency band of the current source that determines the drive current in the LD driving circuit is made switchable as the operation mode is switched from the high-speed power up mode to the steady-state mode.

More specifically, for power up, the frequency band of the current source is widened and the feedback speed increased so that the light output quickly rises to the target value, thus achieving high-speed power up, and after steady state is reached, the feedback speed is reduced and the frequency band of the drive current narrowed to prevent the degradation of the light waveform due to glitches in the D/A conversion circuit, thus enabling communications to be performed with good light waveform.

Figure 70:
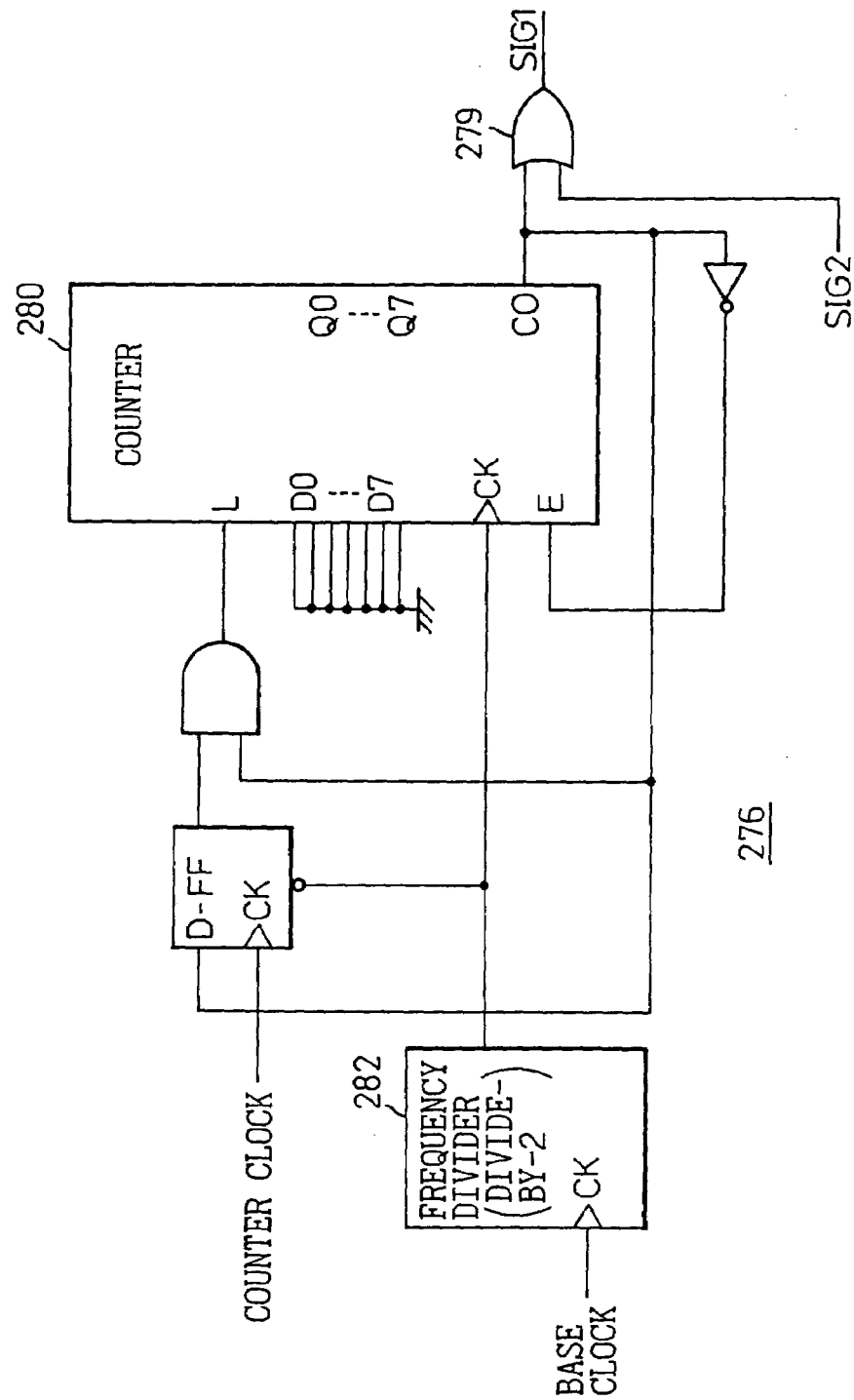
FIG. 70 is a circuit diagram showing one example of an update permit control circuit 276.

FIG. 70 shows an example of the update permit control circuit 276. To limit the update frequency, after the counter 16 that stores the light output control value has been updated, a digital timer for counting the clock is started to prohibit updating for a predetermined period of time, after which the updating is permitted.

The circuit operation will be described below. At first, a clock derived by dividing the base clock by two using a frequency divider 282 is input to the counter 280, but because Q0 to Q7 are loaded with 11111111 (binary number representing the decimal number 255) and the carry CO is set to "1", setting the enable E to "0", the counter 280 is disabled. In this condition, when a counter clock is input, a D-FF detects the rising of the counter clock and loads 0 into the counter 280. This forces the carry CO to go to "0", and the counter state changes from the disabled state to the count enabled state. The counter 280 counts up by 1 by the divide-by-two derived clock. At this time, if the counter clock changes again, the change is ignored because "0" is applied to the LOAD terminal of the counter 280 by the state of the carry CO. As a result, the counter 280 continues to count up until counting up to 255 (decimal). When the value of the counter 280 reaches 255 (decimal), the carry CO goes to "1", setting the enable E to "0", so that the counter 280 is stopped. When the next counter clock is input, the above process is repeated. With the above operation, once the counter clock is input, SIG1 is held at the low level to prohibit the updating of the counter 16 until after the base clock is input 2×256=512 times. After that, updating is permitted. For example, when the base clock rate is 156 Mb/s, and when the counter clock is continuously input, updating is permitted once every 3.3 µs (6.43 ns×512).

Figure 71:
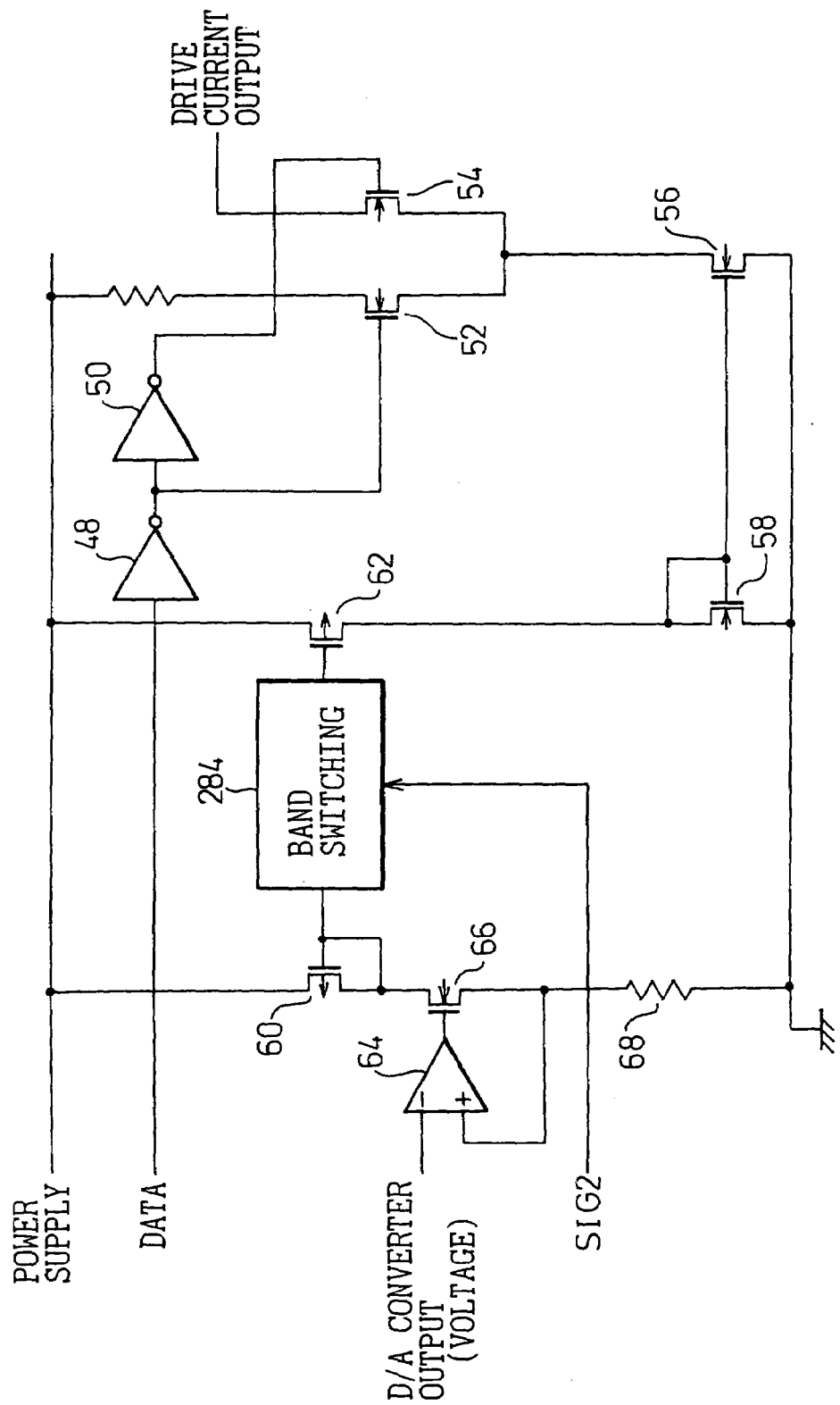
FIG. 71 is a circuit diagram showing one example of the LD driving circuit.
Figure 72:
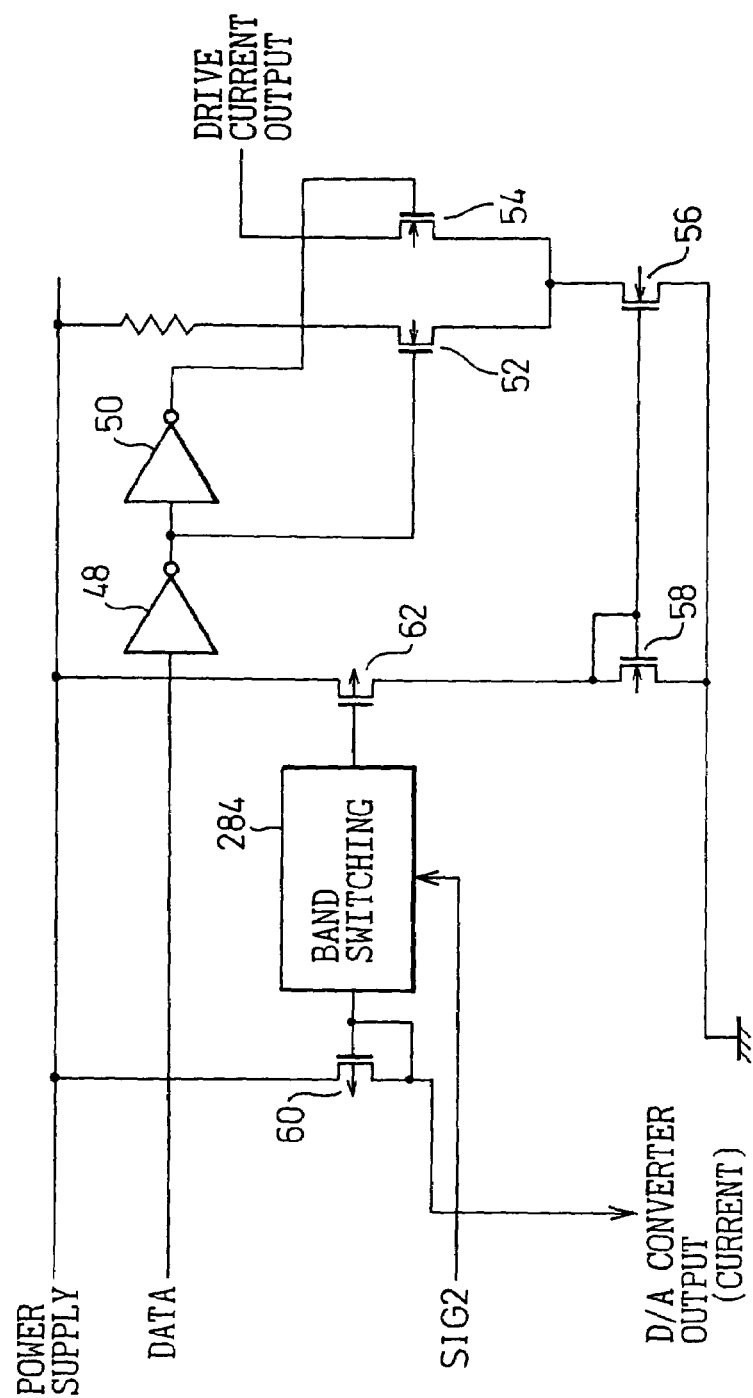
FIG. 72 is a circuit diagram showing another example of the LD driving circuit.

FIGS. 71 and 72 shows detailed circuit diagrams of the LD driving circuit 10. FIG. 71 shows the circuit when the analog output of the D/A conversion circuit is given as a voltage, and FIG. 72 shows the circuit when the analog output is given as a current. Except that a band switching circuit 284 is inserted between the transistors 60 and 62, the circuit configuration is fundamentally the same as that of the voltage input/current input LD driving circuit described with reference to FIG. 11.

Figure 73:
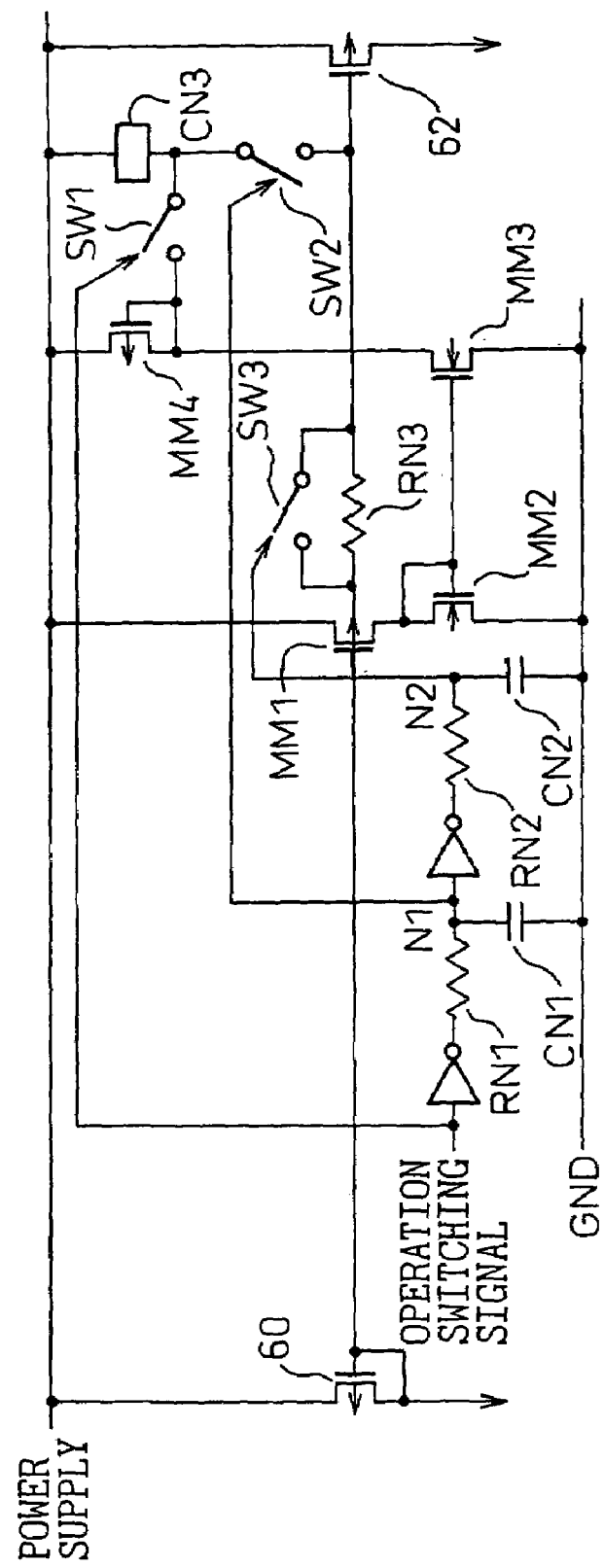
FIG. 73 is a circuit diagram showing one example of a band switching circuit.
Figure 74:
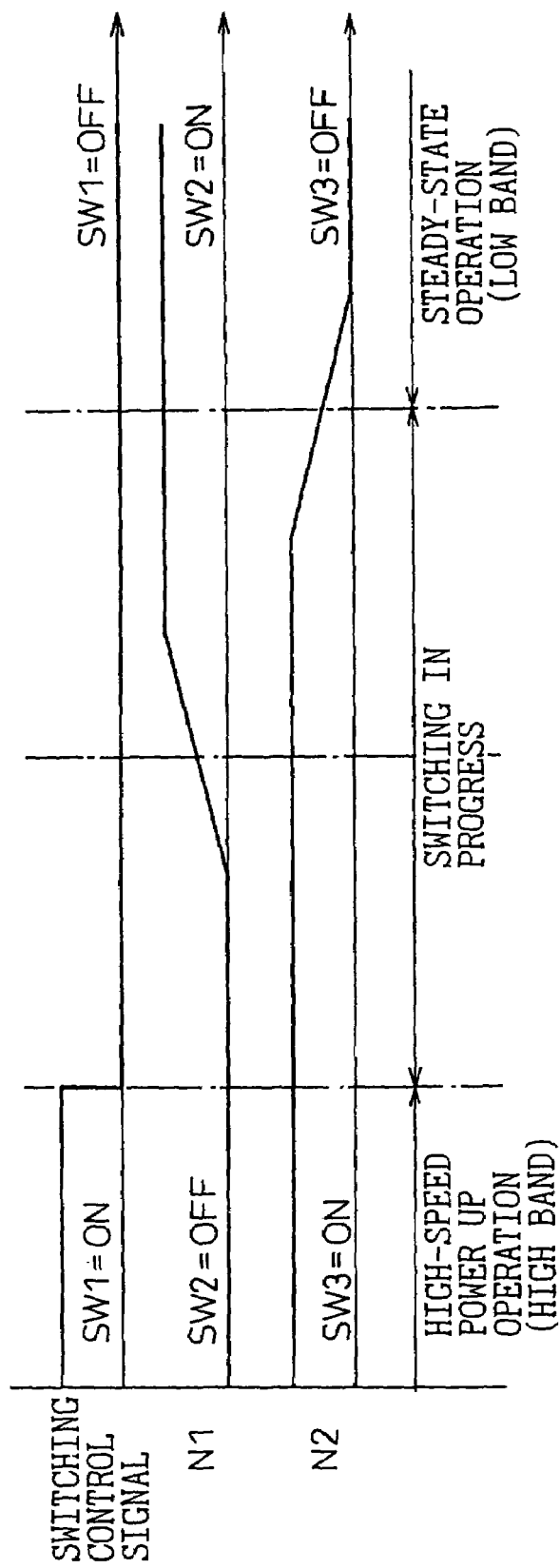
FIG. 74 is a timing chart showing the operation of the circuit of FIG. 73.

FIG. 73 shows a circuit diagram of the band switching circuit, and FIG. 74 shows its operational sequence. This circuit switches the frequency band for the current output of the LD driving circuit by using an operation switching signal.

The transistors 60 and 62 at left and right form a current mirror as a current source for determining the drive current. The current proportional to the analog output of the D/A conversion circuit is input to the transistor 60, and the output current is taken from the transistor 62.

The basic principle of band switching is to switch an RC-type low-pass filter consisting of RN3 and CN3 in and out of the path connecting between the two transistors 60 and 62. Further, when switching in the capacitor C, if the capacitor with a different potential is switched in abruptly, a charge current will flow momentarily, as a result of which the gate may become unstable, disrupting the output current waveform. To address this, a circuit is provided that makes the potential of CN3 the same as the gate potential. To accomplish such switching operation, SW1 to SW3 and a sequence control circuit for proper operation of these switches are included.

A description will be given below of how the switching is made from the high-speed power up mode in which the frequency band of the current mirror is made wide to the steady-state mode in which the frequency band is made narrow.

In the high-speed start up mode, a wide frequency band is achieved with SW1=ON, SW2=OFF, and SW3=ON. Since the gates of the transistors 60 and 62 are short-circuited via the switch SW1, and CN3 is not connected to the gate of the transistor 62, the transistors 60 and 62 form a normal current mirror configuration, and the frequency band is therefore wide.

The p-channel MOS transistor MM1 of the same size as the transistor 62 also forms a current mirror with the transistor 60, and a current equivalent to that of the transistor 62 flows therein. Further, the current of MM1 flows to the n-channel MOS transistor MM2, and the current flowing in MM3 which forms a current mirror with MM2 flows to MM4, so that the gate level of MM4 becomes equal to that of the transistor 62. At this time, since SW1 is ON and SW2 OFF, CN3 is charged to the same voltage level as the gate voltage of the transistor 62.

When the switching signal changes from "1" to "0", SW1 is opened and the capacitor CN3 is released; after that, N1 changes from "0" to "1" via an inverter and an RC time constant circuit consisting of CN1 and RN1, and SW2 is closed to connect CN3 to the gate of the transistor 62.

After N1 changes from "0" to "1", N2 changes from "1" to "0" via an inverter and an RC time constant circuit consisting of CN2 and RN2; as a result, SW3 short-circuiting across RN3 is opened, thus inserting RN3 between the gates of the transistors 60 and 62, and the low-pass filter consisting of RN3 and CN3 is thus switched in between the gates of transistors 60 and 62.

In this way, the band switching circuit can switch the frequency band by switching the low-pass filter in and out of the current mirror that controls the drive current.

Figure 75:
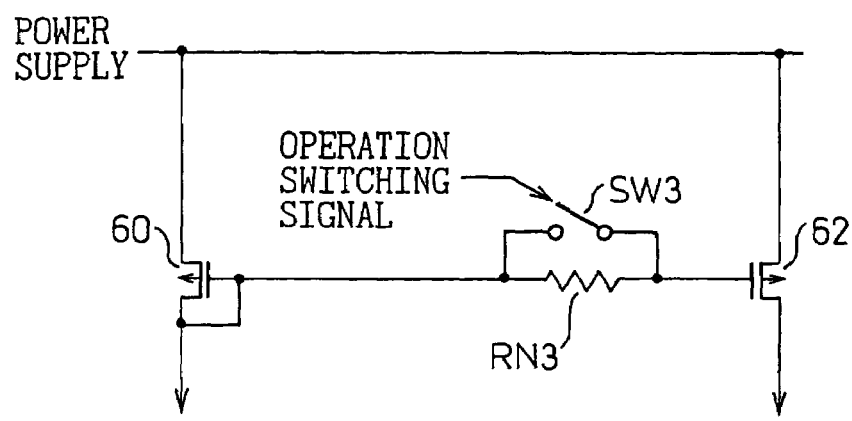
FIG. 75 is a circuit diagram showing another example of the band switching circuit.

While the above-described band switching circuit is designed to insert an RC time constant circuit, the band switching circuit shown in FIG. 75 is designed to add RN3 only. The band switching circuit section consists only of the resistor RN3 shown in FIG. 73 and a circuit that controls the insertion of RN3. Since each of the transistors forming the circuit has a capacitive component, band switching can be accomplished by connecting and disconnecting only R.

Figure 76:
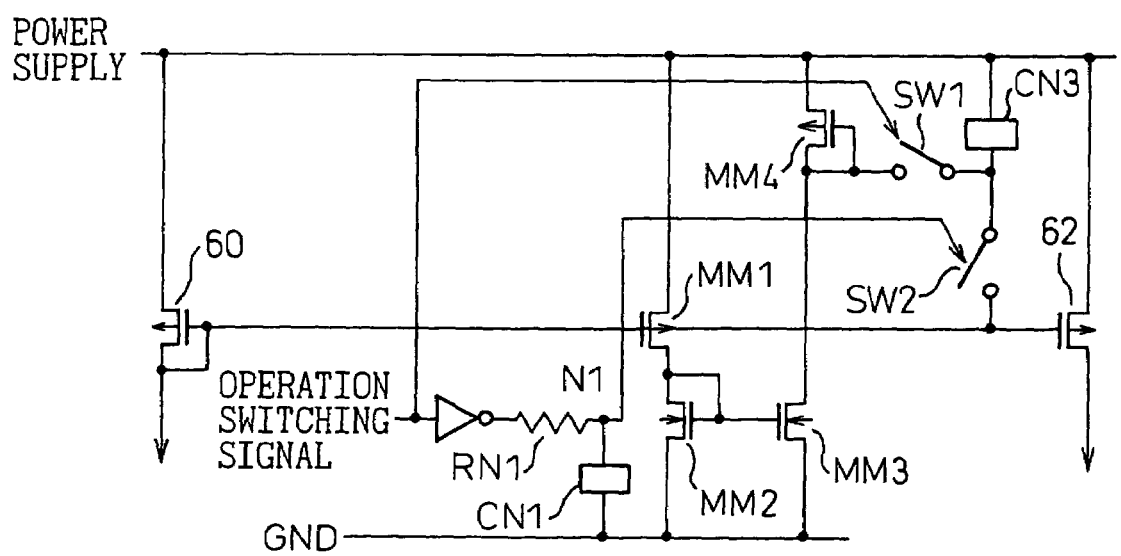
FIG. 76 is a circuit diagram showing still another example of the band switching circuit.

The band switching circuit shown in FIG. 76 is designed to add CN3 only. The band switching circuit section consists only of the capacitor CN3 shown in FIG. 73 and a circuit that controls the insertion of CN3. Since each of the transistors forming the circuit has a resistive component or a current limiting function as a current source, band switching can be accomplished by connecting and disconnecting only C.

Figure 77:
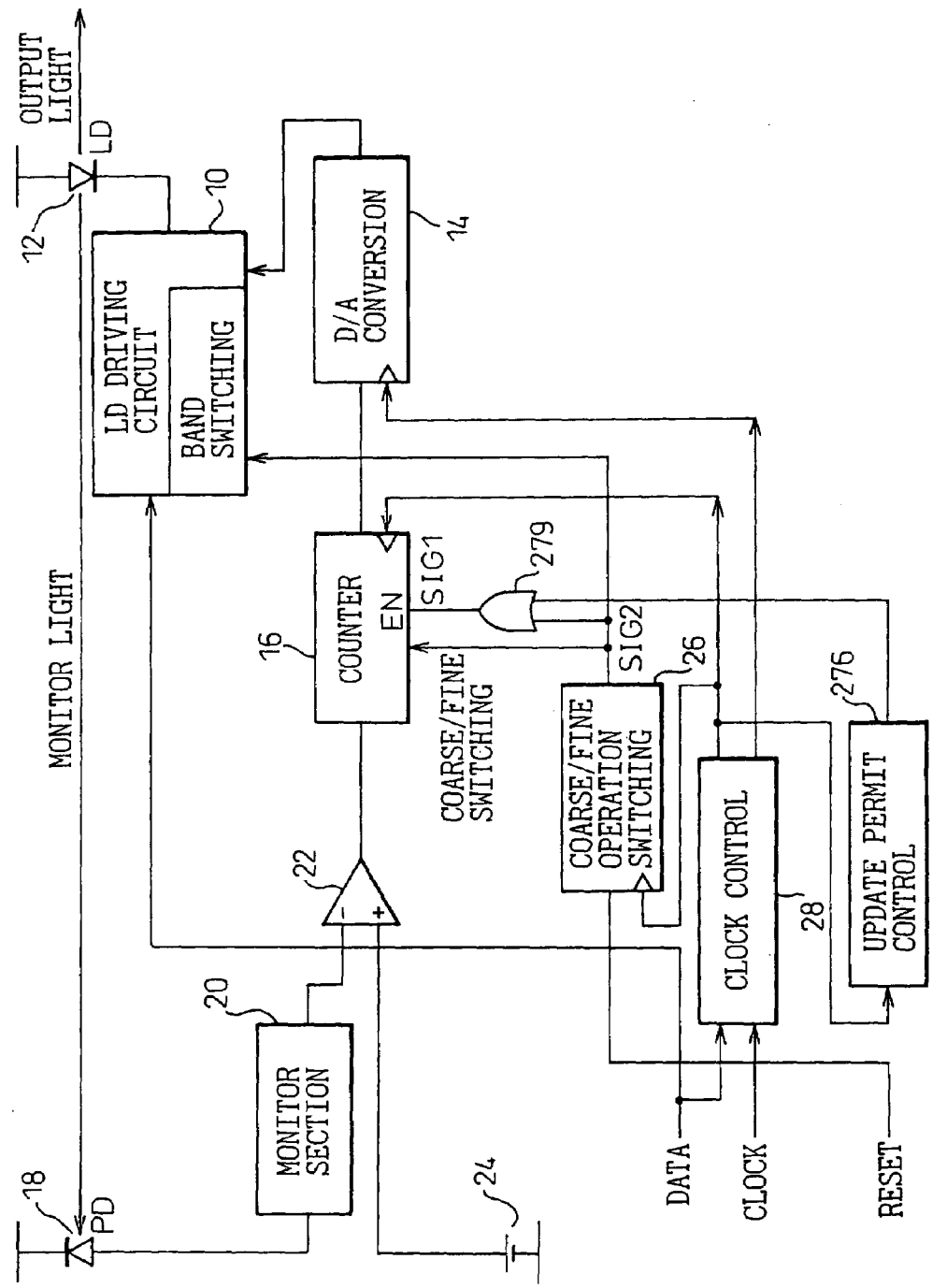
FIG. 77 is a block diagram of still another embodiment of the present invention.
Figure 78:
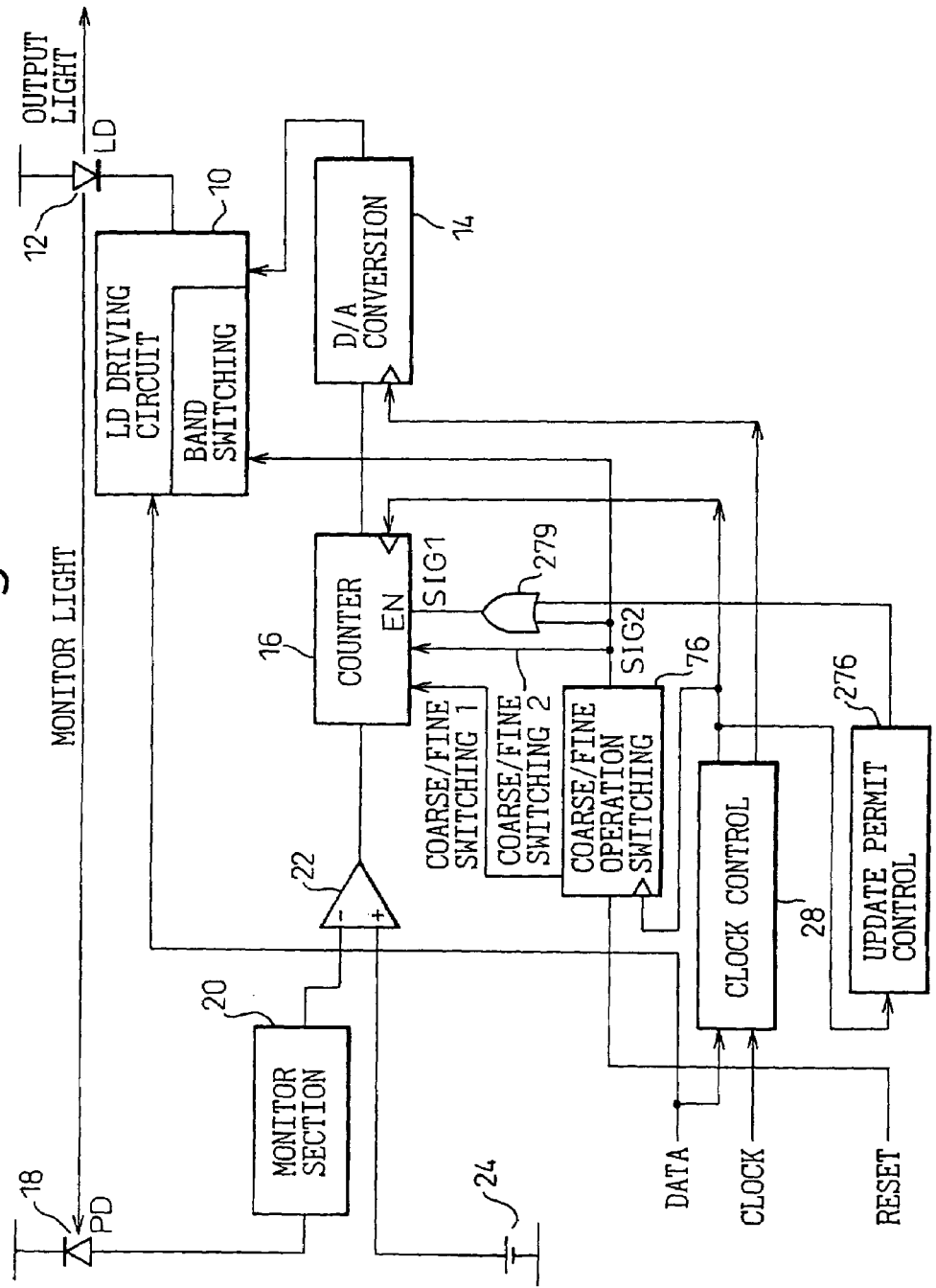
FIG. 78 is a block diagram of still another embodiment of the present invention.
Figure 79:
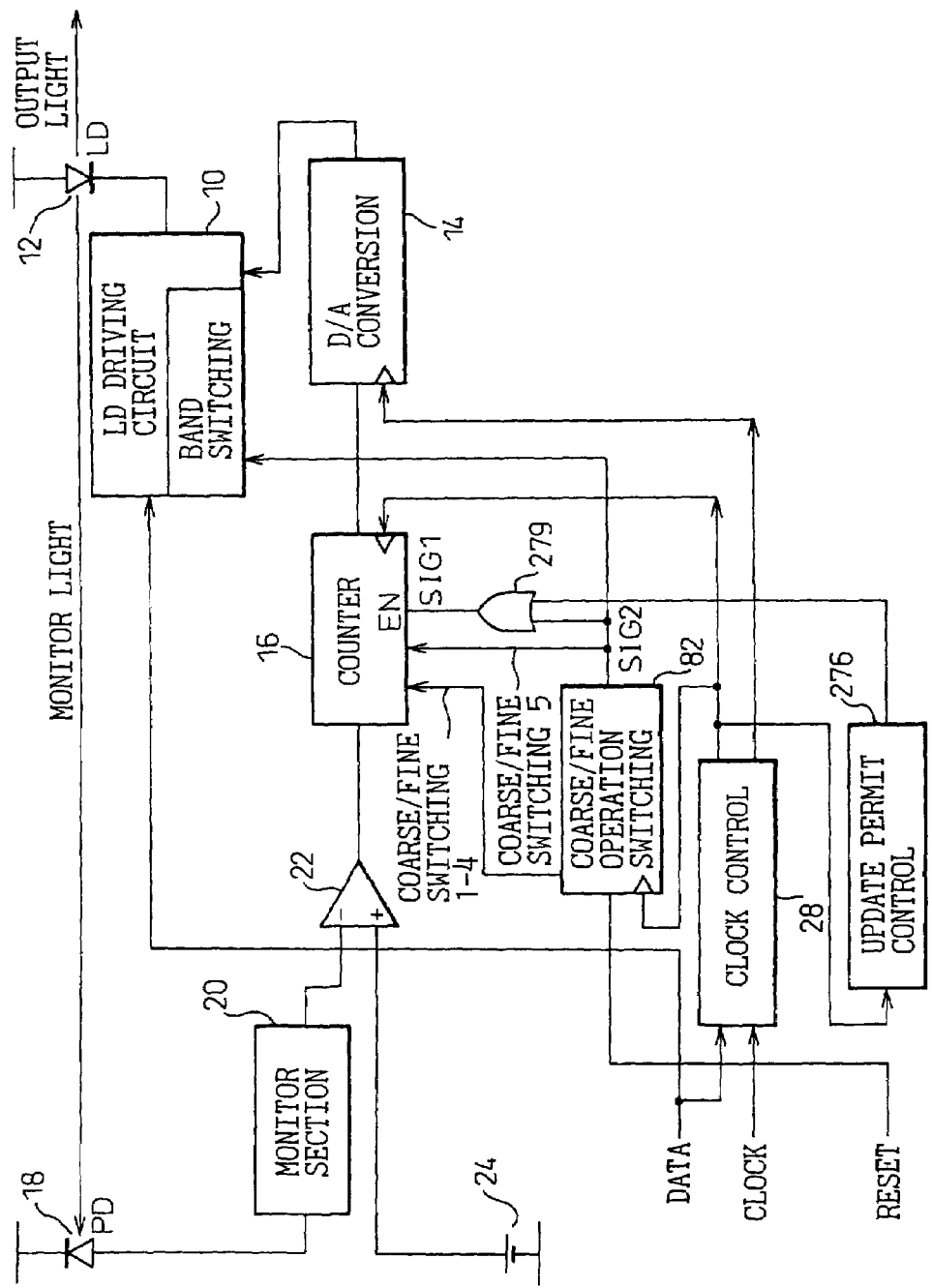
FIG. 79 is a block diagram of still another embodiment of the present invention.
Figure 80:
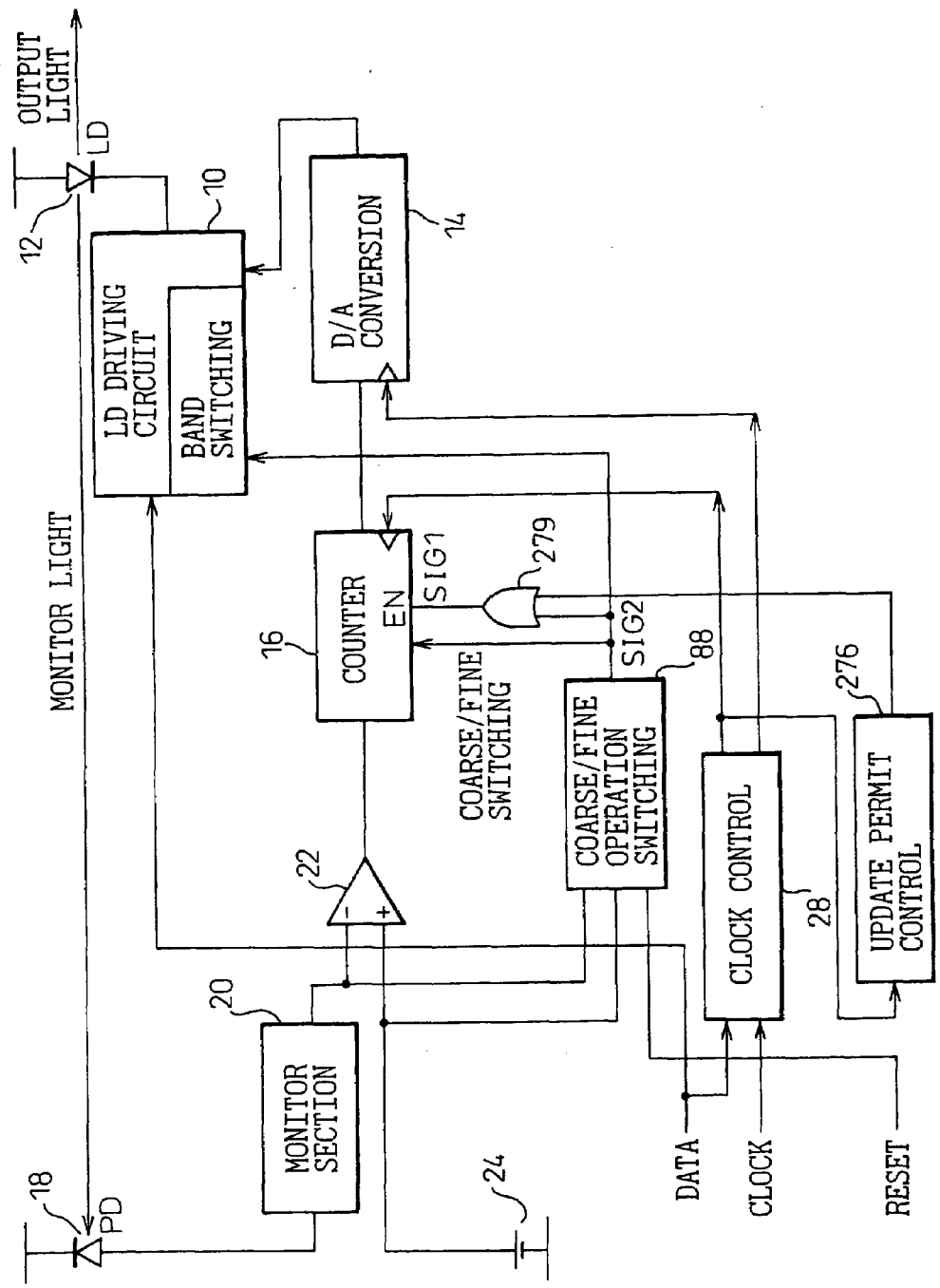
FIG. 80 is a block diagram of still another embodiment of the present invention.
Figure 81:
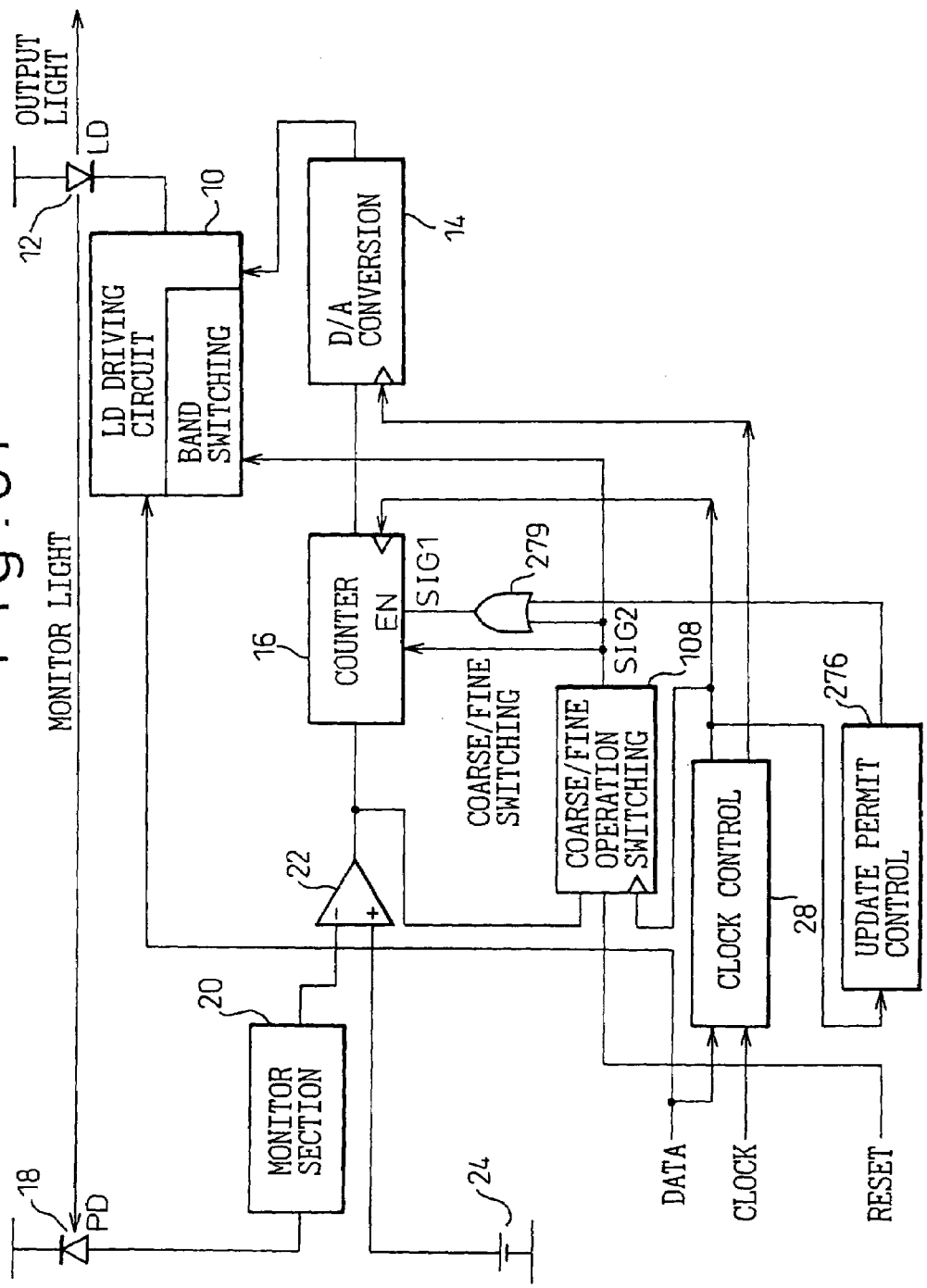
FIG. 81 is a block diagram of still another embodiment of the present invention.
Figure 82:
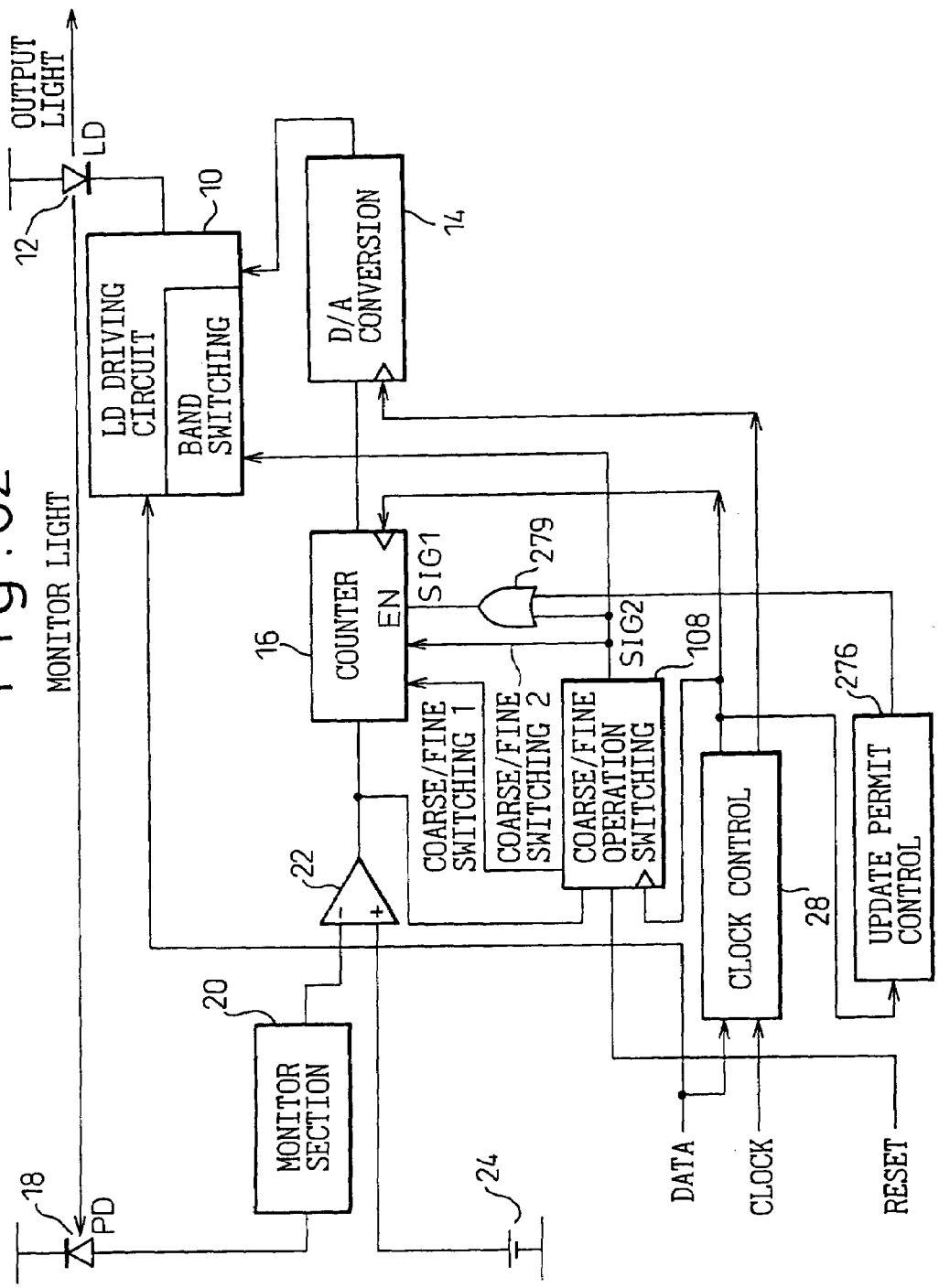
FIG. 82 is a block diagram of still another embodiment of the present invention.

The signal that the coarse/fine switching circuit 26 described with reference to FIG. 7 outputs can be used directly as the operation switching signal SIG2 for switching the operation mode between the start-up mode in which the update cycle is short and the steady-state mode in which the update cycle is long, or for switching the frequency characteristics of the LD driving circuit, or for both switching operations. Alternatively, the circuit 26 of FIG. 7 can be used as a coarse/fine switching and operation mode switching circuit that outputs coarse/fine switching and operation mode switching signals for coarse/fine switching and operation mode switching, as shown in FIG. 77.

Figure 83:
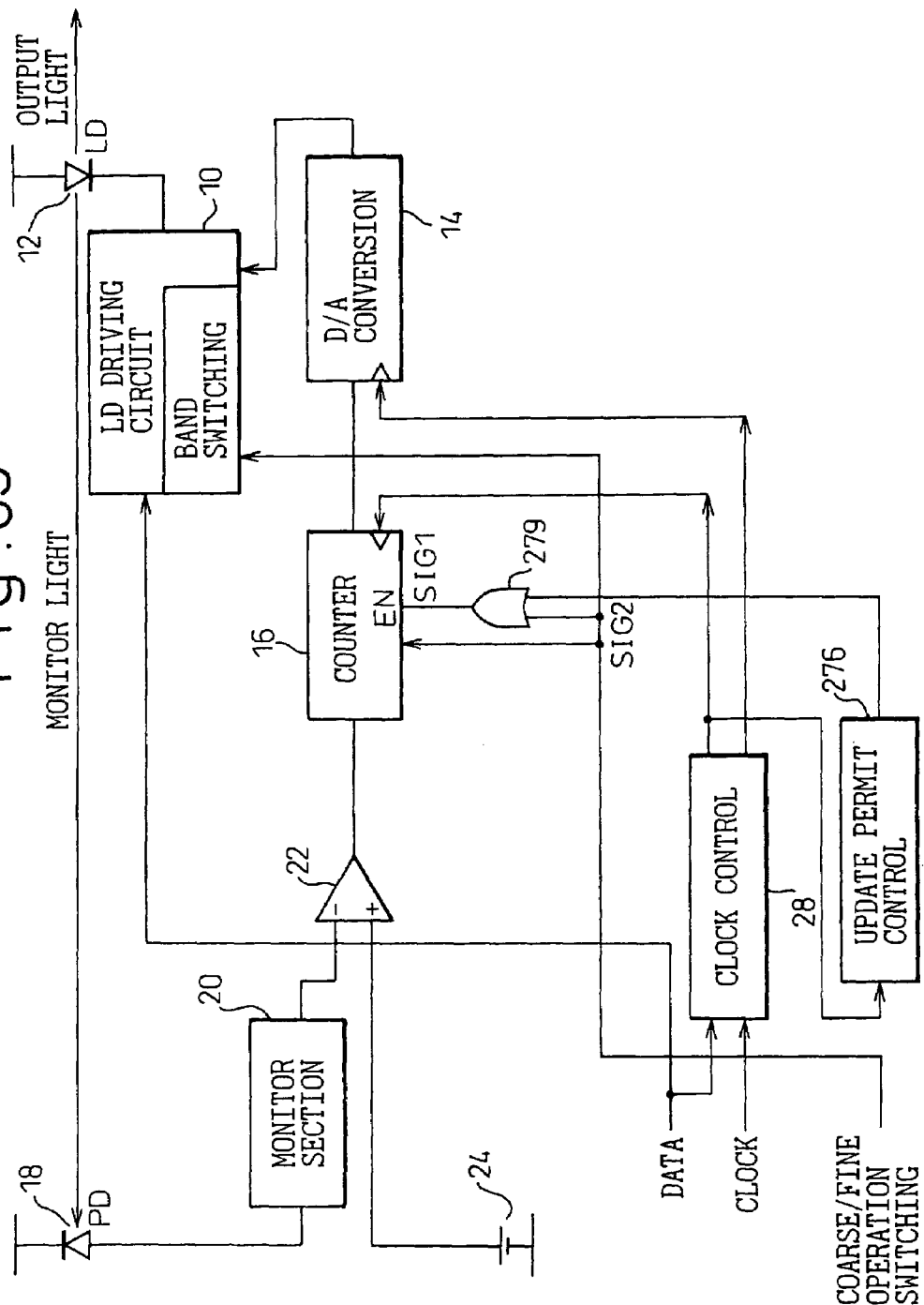
FIG. 83 is a block diagram of still another embodiment of the present invention.

Likewise, the coarse/fine switching circuit 76 shown in FIG. 18, the coarse/fine switching circuit 82 shown in FIG. 25, the coarse/fine switching circuit 88 shown in FIG. 28, the coarse/fine switching circuit 108 shown in FIGS. 34 and 35, and the coarse/fine switching circuit shown in FIG. 37 can each be used as the operation mode switching circuit or the coarse/fine switching and operation mode switching circuit. The circuits implementing the latter example are shown in FIGS. 78 to 82, respectively. Alternatively, provisions may be made to externally apply the operation mode switching signal or the coarse/fine switching and operation mode switching signal, as shown in FIG. 83.

Figure 84:
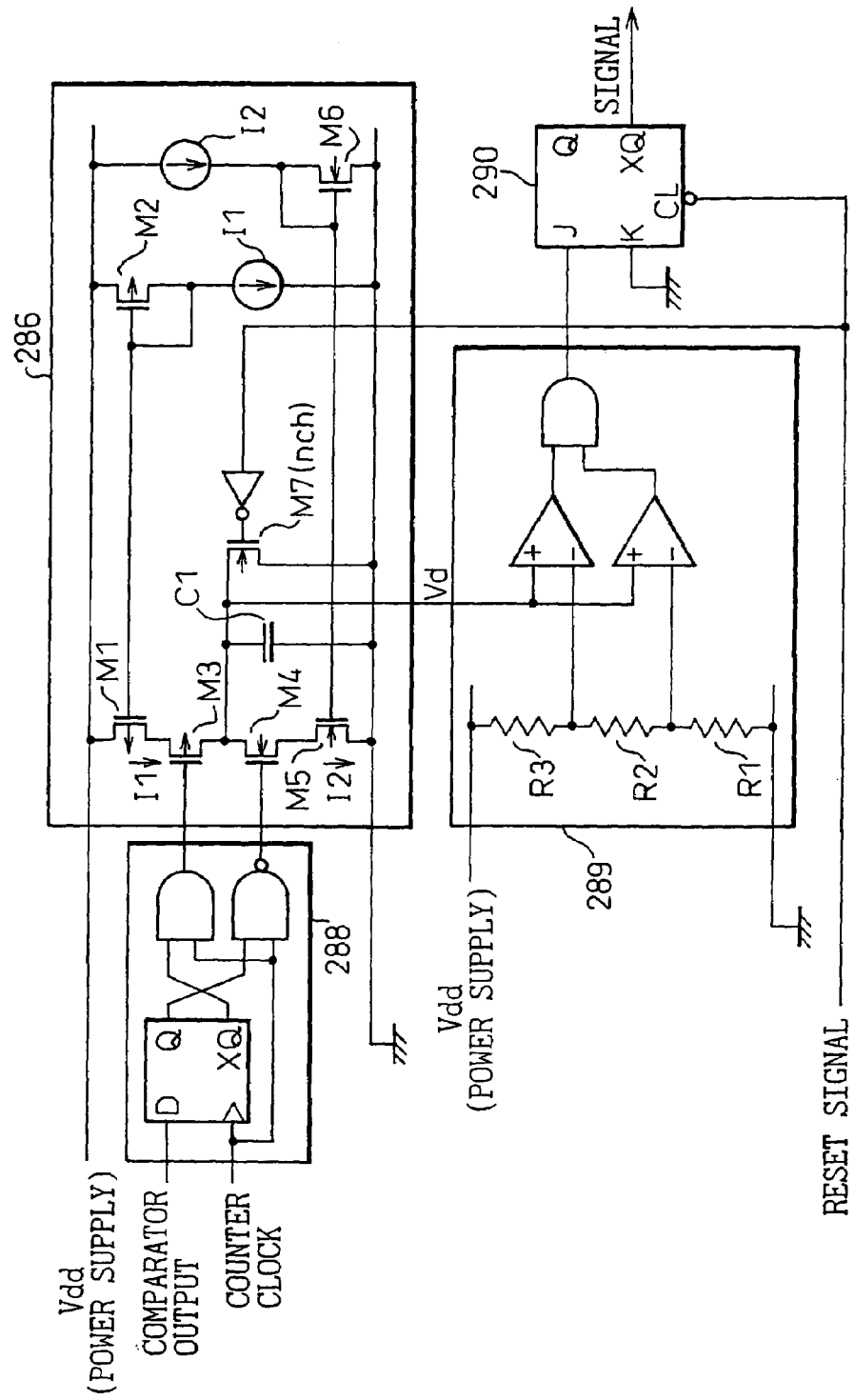
FIG. 84 is a circuit diagram showing another example of a coarse/fine switching and operation mode switching circuit.

Another example of the coarse/fine switching and operation mode switching circuit is shown in FIG. 84. This circuit, using an analog circuit, detects a change in the comparator output and generates the switching signal. A same-sign succession detection circuit using a charge pump is contained for detecting a change in the comparison result.

The charge pump circuit 286 comprises: a capacitor C1; M1 capable of outputting a constant current I1 using a constant current source I1 and a p-channel MOS FET M2; M3 capable of performing a switching operation in response to an input signal; M5 capable of outputting a constant current I2 using a constant current source I2 and an n-channel MOS FET M6; M4 capable of performing a switching operation in response to an input signal; and an n-channel MOS FET M7 which is turned on when the reset signal is low, to discharge the capacitor C1.

The charge pump control circuit 288 has the following three functions.

When the comparator output is "1"=UP, control is performed so that when the counter clock goes high (for counter updating), M3 is turned on to discharge the capacitor C1; as a result, the output VC of the charge pump circuit is lowered toward ground.

When the comparator output is "0"=DOWN, control is performed so that when the counter clock goes high (for counter updating), M4 is turned on to charge the capacitor C1; as a result, the output VC of the charge pump circuit is raised toward Vdd.

When the reset signal RST is low, M7 is turned on to short the output VC of the charge pump circuit to ground, thereby providing an initial value to C1.

A level comparator 289 includes a resistive voltage dividing circuit for dividing the voltage between the power supply Vdd and ground GND using resistors R1 to R3, and detects the mixing of UP control and DOWN control by detecting the output VC of the charge pump circuit falling within a range of R1/(R1+R2+R3) to (R1+R2)/(R1+R2+R3) (when Vdd=3 V and R1=R2=R3=5 kΩ, then VC=1 to 2 V) by using two differential comparators and an OR circuit.

Figure 85:
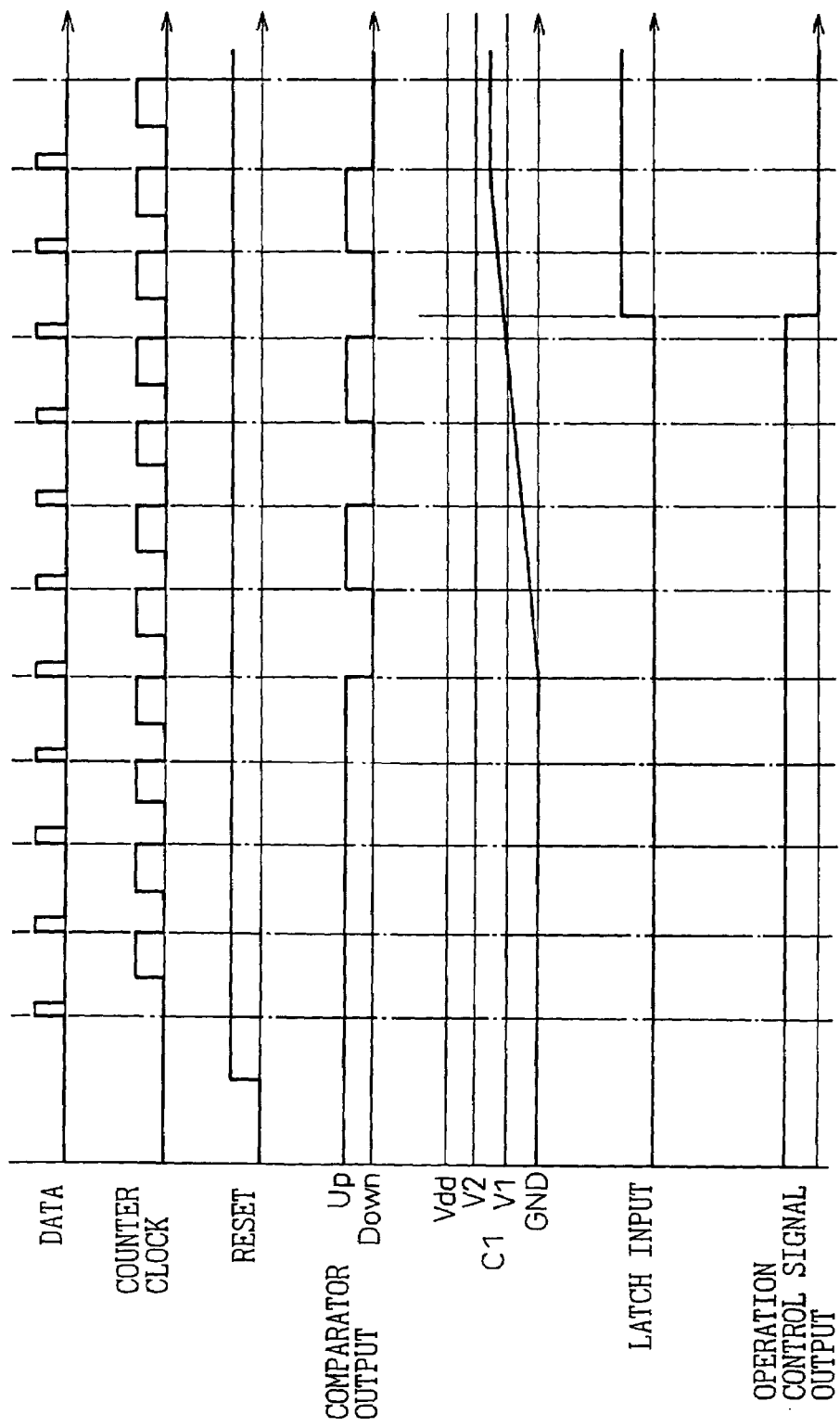
FIG. 85 is a timing chart showing the operation of the circuit of FIG. 84.

FIG. 85 shows the operation of the switching circuit of FIG. 84. When the reset signal RESET goes high, M7 is turned on and the charge pump circuit starts operating. During initial power up of the light output control circuit, when the light output is smaller than the reference value, the comparator output is "1"=UP; in this state, when the counter clock goes high (for counter updating), M3 is turned on to discharge the capacitor C1, so that the output VC of the charge pump circuit remains at GND.

Then, when the light output reaches the reference value, and the comparator output begins to cycle between "1"=UP and "0"=DOWN, the ON frequency of M3 increases and the capacitor C1 is discharged, so that the output VC of the charge pump circuit takes a value intermediate between Vdd and GND. As a result, the output of the level comparator 289 goes high. The latch 290 at the final stage is provided to permit the power-up operation only once after releasing the reset state.

Figure 86:
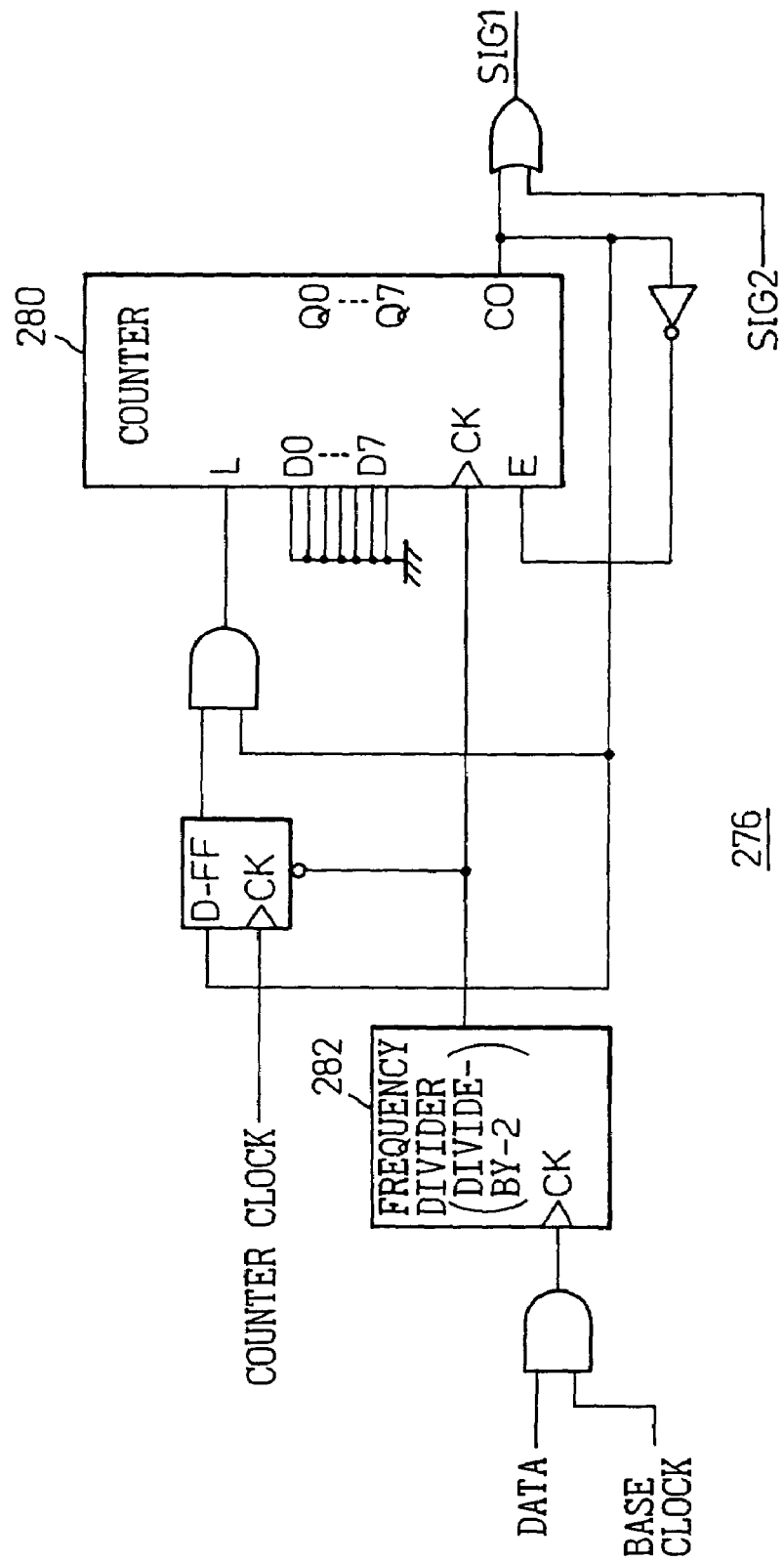
FIG. 86 is a circuit diagram showing another example of the update permit control circuit 276.

FIG. 86 shows another example of the update permit control circuit 276. The difference from the example of FIG. 70 is that while in FIG. 70 the base clock is directly input to the frequency divider 282, in FIG. 86 the base clock is ANDed with the data and the result is input to the frequency divider 282. That is, in the update permit control circuit of FIG. 70, the period from an update permit to the next update permit (update prohibit period) is determined by counting the base clock, but in the update permit control circuit of FIG. 86, the update prohibit period is determined by counting the number of 1s occurring in the data. For continuous transmission, both circuits operate substantially the same, but for burst transmission, the prohibit period becomes long during no-cell intervals according to the circuit of FIG. 86.

Figure 87:
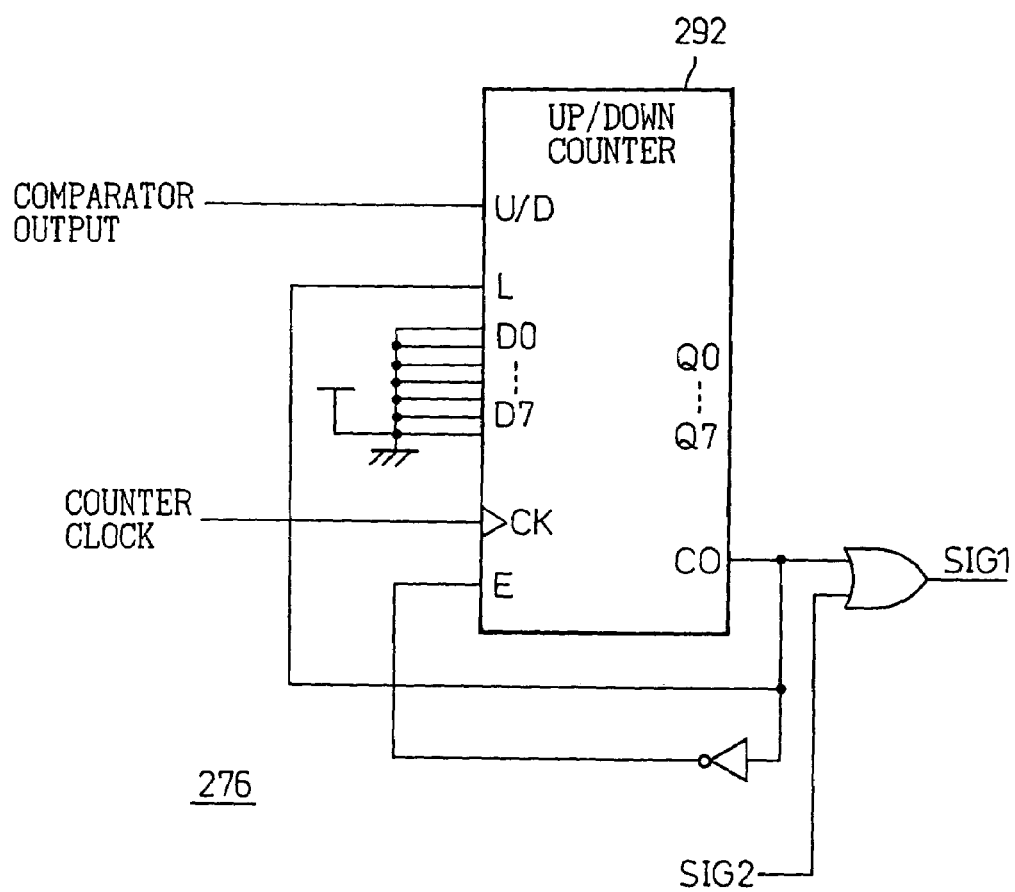
FIG. 87 is a circuit diagram showing still another example of the update permit control circuit 276.

Still another example of the update permit control circuit 276 is shown in FIG. 87. To limit the update frequency, the circuit counts the difference between the number of times that the result of the comparison between the monitor value and the reference value indicates UP and the number of times that the result of the comparison indicates DOWN, and prohibits updating until the resultant value settles to a prescribed value. In the illustrated example, this corresponds to the time when a carry occurs with the counter counting up to the prescribed value 11111111 (255 in decimal). When the result of the comparison begins to cycle between UP and DOWN, this means that the light output is nearing the target value. At this time, the count changes up and down around the target value, holding the counter value within a specified limited range, thus preventing unnecessary updates.

Figure 88:
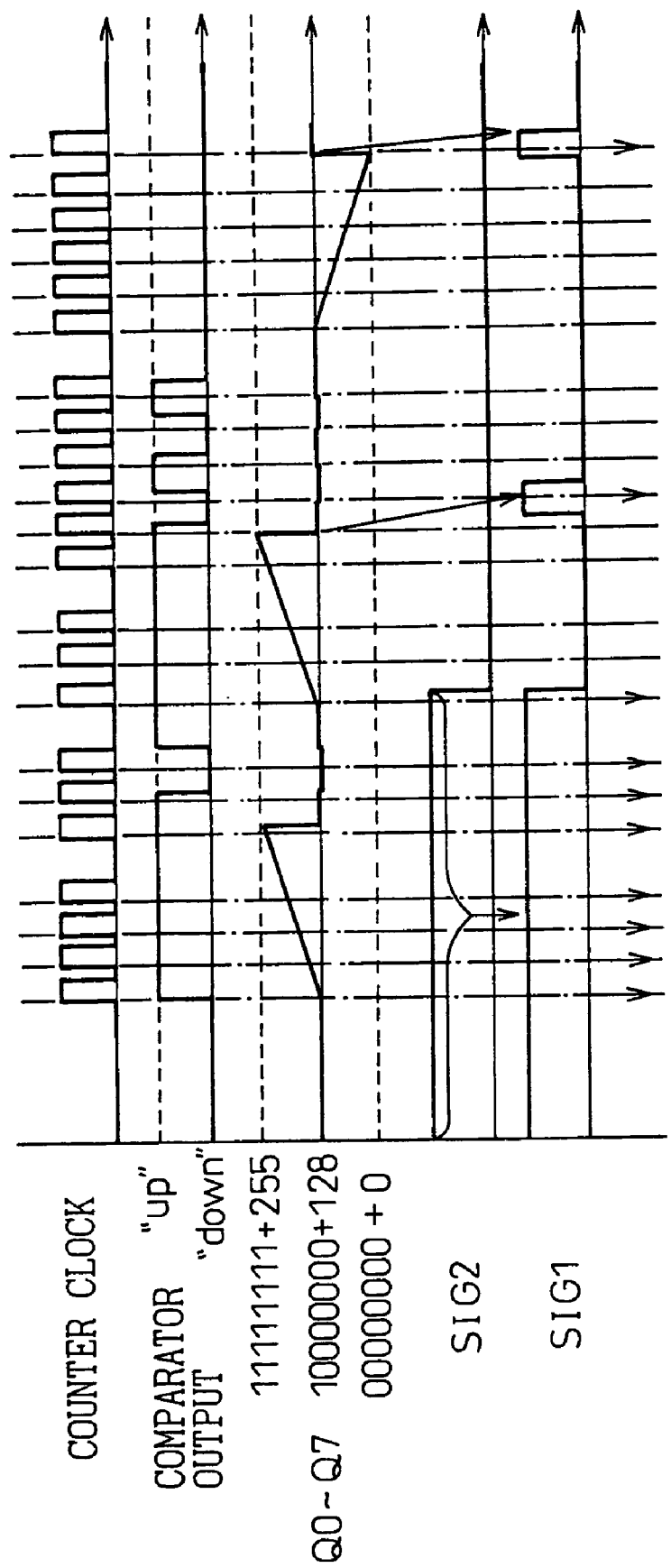
FIG. 88 is a timing chart showing the operation of the circuit of FIG. 87.

FIG. 88 is a timing chart showing the operation of the circuit of FIG. 87. During the period that the switching signal SIG2 is held at the high level, SIG1 is high and the counter 16 is updated in response to the counter clock. After that, the counter 16 is updated only when the value of the counter 292 reaches a maximum value +255 or a minimum value +0. The number 128 is loaded when the value of the counter 292 has reached +255 or +0.

Figure 89:
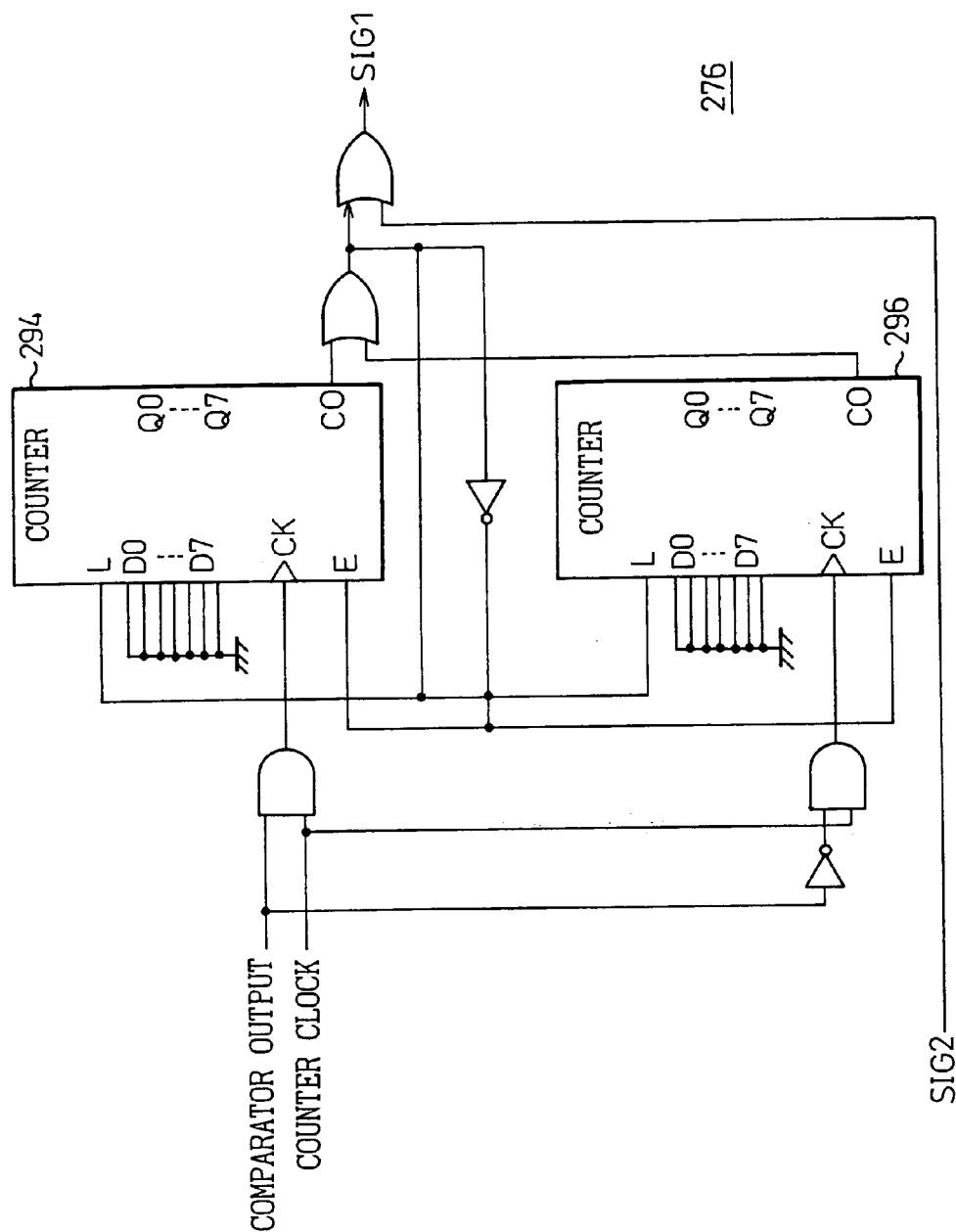
FIG. 89 is a circuit diagram showing a further example of the update permit control circuit 276.
Figure 90:
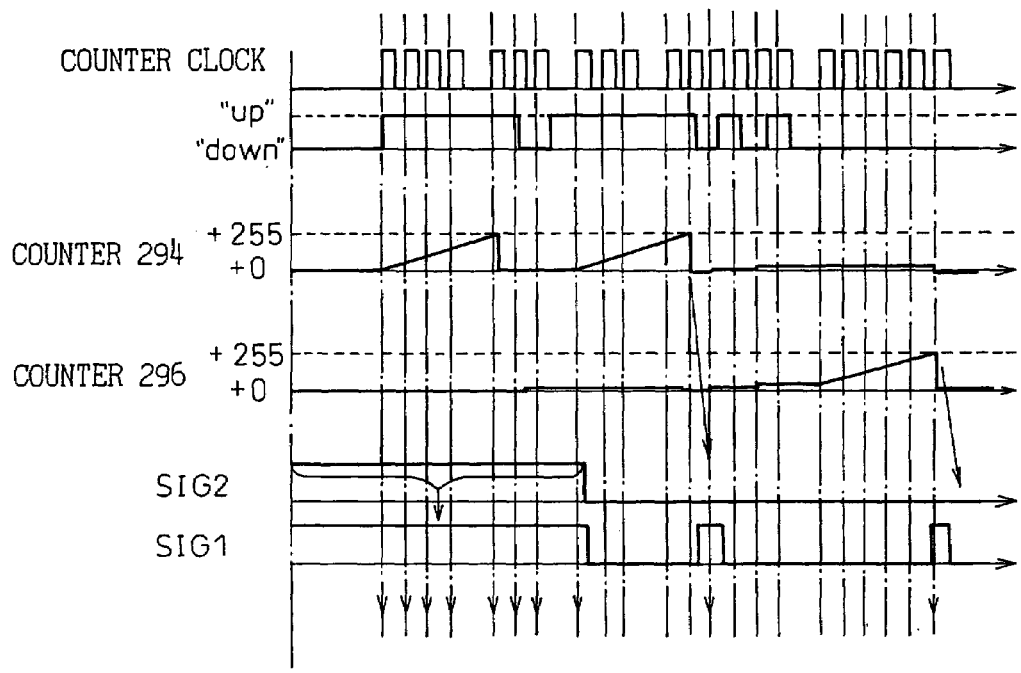
FIG. 90 is a timing chart showing the operation of the circuit of FIG. 89.

FIG. 89 shows a further example of the update permit control circuit 276. In this example, the number of UP controls and the number of DOWN controls in the monitor/reference value comparison result history are counted by counters 294 and 296, respectively, and an update is performed when one or the other of the numbers exceeds a predetermined value. FIG. 90 shows the operation of the update permit control circuit of FIG. 89.

Figure 91:
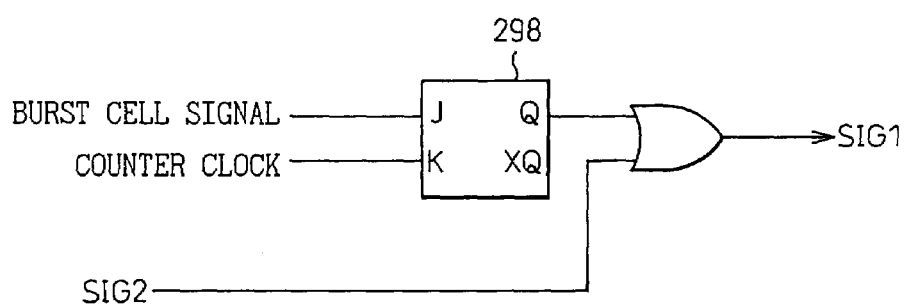
FIG. 91 is a circuit diagram showing a still further example of the update permit control circuit 276.
Figure 92:
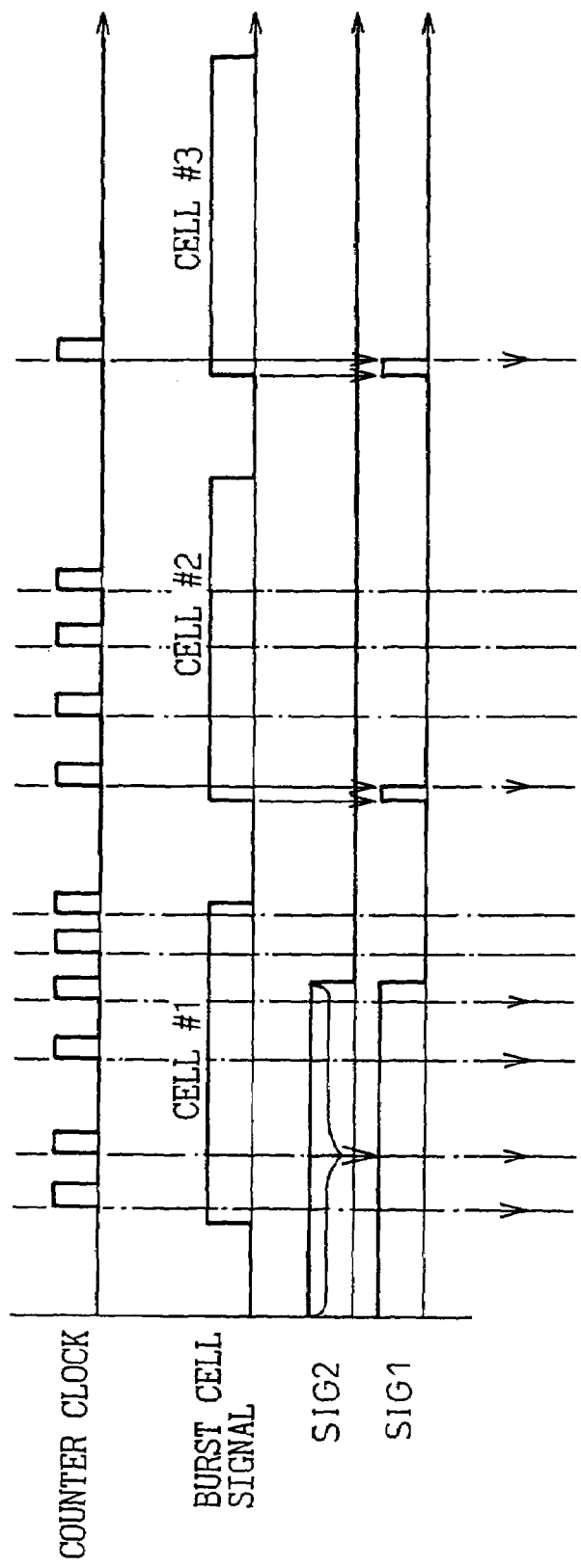
FIG. 92 is a timing chart showing the operation of the circuit of FIG. 91.

FIG. 91 shows a still further example of the update permit control circuit 276. In this example, an update is performed for each transmission of a cell by using a signal indicating the presence or absence of a burst cell. This serves to limit the number of updates. FIG. 92 shows the operation of this update permit control circuit. In burst transmission, a burst cell signal indicating a cell presence time segment is sent out from the apparatus; using this signal, the number of updates can be reduced during steady-state control. For this purpose, the operation switching signal SIG2, burst cell signal, and counter clock are input to the update permit control circuit. In the high-speed power up operation mode, the update permit control signal SIG1 is set to "1", and in the steady-state mode, "1"=UPDATE PERMIT is output when the burst cell signal goes to "1" and, at the next counter clock input, "0"=PROHIBIT is output. Since the number of updates can be reduced, the above operation has the effect of improving the waveform.

The invention claimed is:

1. A light output control circuit comprising:
    a photodetector which detects the light output of a light-emitting device;
    a comparator which compares a light output detection value of the detected light with a reference value;
    a light output control device which controls the light output of said light-emitting device in a discrete manner in accordance with a result of said comparison output from said comparator; and
    an update permit control circuit which, after said light output has stabilized, partly prohibits updating of a control value for said light output according to a prescribed condition.

2. A light output control circuit according to claim 1, wherein said update permit control circuit permits the next update after a predetermined time has elapsed form the last update of said control value.

3. A light output control circuit according to claim 1, wherein said update permit control circuit permits the next update after data has been applied to said light-emitting device a predetermined number of times since the last update of said control value.

4. A light output control circuit according to claim 1, wherein said update permit control circuit permits updating of said control value when the difference between the number of times the output of said comparator has indicated that said control value should be increased and the number of times the output of said comparator has indicated that said control value should be decreased has reached a predetermined value.

5. A light output control circuit according to claim 1, wherein said update permit control circuit permits updating of said control value when either the number of times the output of said comparator has indicated that said control value should be increased or the number of times the output of said comparator has indicated that said control value should be decreased has reached a predetermined value.

6. A light output control circuit according to claim 1, wherein said update permit control circuit permits updating of said control value in accordance with a signal indicating a burst transmission.

7. An apparatus comprising:
a photodetector detecting light output from a light-emitting device;
a controller detecting the light output from the light-emitting device, comparing a value of the detected light with a reference value to produce a comparison result, controlling the light output from the light-emitting device via a control value in accordance with the comparison result, and updating the control value over time; and
an update permit control circuit, after the light output from the light-emitting device has stabilized, partly prohibiting updating of the control value according to a prescribed condition.

8. A light output control circuit comprising:
a photodetector which detects the light output of a light-emitting device;
a comparator which compares a light output detection value with a reference value;
a light output control device which controls the light output of said light-emitting device in a discrete manner in accordance with the result of said comparison output from said comparator; and
an update permit control circuit which, after said light output has stabilized, prohibits updating of a control value for said light output from the time that said control value is last updated, until the time that a prescribed condition is satisfied, and
wherein said update permit control circuit permits updating of said control value when the difference between the number of times the output of said comparator has indicated that said control value should be increased and the number of times the output of said comparator has indicated that said control value should be decreased has reached a predetermined value.

9. A light output control circuit comprising:
a photodetector which detects the light output of a light-emitting device;
a comparator which compares a light output detection value with a reference value;
a light output control device which controls the light output of said light-emitting device in a discrete manner in accordance with the result of said comparison output from said comparator; and
an update permit control circuit which, after said light output has stabilized, prohibits updating of a control value for said light output from the time that said control value is last updated, until the time that a prescribed condition is satisfied, and
wherein said update permit control circuit permits updating of said control value when either the number of times the output of said comparator has indicated that said control value should be increased or the number of times the output of said comparator has indicated that said control value should be decreased has reached a predetermined value.

* * * * *